(12) United States Patent
Park et al.

(10) Patent No.: US 11,735,103 B2
(45) Date of Patent: Aug. 22, 2023

(54) INPUT SENSING DEVICE HAVING AN ANALOG FRONT-END

(71) Applicant: SAMSUNG DISPLAY CO., LTD., Yongin-si (KR)

(72) Inventors: Kyung Tea Park, Yongin-si (KR); Ji Woong Kim, Yongin-si (KR); Hyung Gun Ma, Yongin-si (KR); Seong An Park, Yongin-si (KR); Seong Joo Lee, Yongin-si (KR); Tae Hun Lee, Yongin-si (KR); Sang Hyun Heo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/721,465

(22) Filed: Apr. 15, 2022

(65) Prior Publication Data

US 2023/0061354 A1 Mar. 2, 2023

(30) Foreign Application Priority Data

Sep. 1, 2021 (KR) ........................ 10-2021-0116567

(51) Int. Cl.
 *G09G 3/32* (2016.01)
 *H03F 3/70* (2006.01)

(52) U.S. Cl.
 CPC ................. *G09G 3/32* (2013.01); *H03F 3/70* (2013.01); *G09G 2310/0291* (2013.01); *G09G 2310/0297* (2013.01)

(58) Field of Classification Search
 CPC ........................................................ G09G 3/32
 (Continued)

(56) References Cited

U.S. PATENT DOCUMENTS 9,927,924 B2 3/2018 Staton
11,029,777 B2 6/2021 Lee et al.
(Continued)

FOREIGN PATENT DOCUMENTS

KR 10-1311096 8/2013
KR 10-2016-0053301 5/2016
(Continued)

*Primary Examiner* — Long D Pham
(74) *Attorney, Agent, or Firm* — F. Chau & Associates, LLC

(57) ABSTRACT

An analog front-end includes a (1-1)-th charge amplifier configured to differentially amplify a first and second sensing signals provided to a (1-1)-th input terminal and a (1-2)-th input terminal, respectively, and output a (1-1)-th differential signal. A (1-2)-th charge amplifier is configured to differentially amplify the second sensing signal and a third sensing signal provided to a (1-3)-th input terminal and a (1-4)-th input terminal, respectively, and output a (1-2)-th differential signal. A second charge amplifier is configured to differentially amplify the (1-1)-th differential signal and the (1-2)-th differential signal provided to a (2-1)-th input terminal and a (2-2)-th input terminal, respectively, and output a (2-1)-th differential signal and a (2-2)-th differential signal. A demodulation circuit is configured to filter the (2-1)-th differential signal and the (2-2)-th differential signal and output demodulated differential signals. An analog-to-digital converter is configured to output a sensing value based on the demodulated differential signals.

20 Claims, 23 Drawing Sheets

(58) Field of Classification Search
USPC .......................................................... 345/204
See application file for complete search history.

(56) References Cited

U.S. PATENT DOCUMENTS

| | | | | |
|---|---|---|---|---|
| 2015/0185914 | A1* | 7/2015 | Han | G06F 3/04166 345/174 |
| 2018/0349666 | A1* | 12/2018 | Chen | G06V 40/1359 |
| 2019/0324572 | A1* | 10/2019 | Tan | G06F 3/044 |
| 2019/0339803 | A1* | 11/2019 | Park | G06F 3/044 |
| 2020/0210008 | A1* | 7/2020 | Lee | G06F 3/0442 |
| 2021/0041976 | A1* | 2/2021 | Gwon | G06F 3/04164 |

FOREIGN PATENT DOCUMENTS

| | | |
|---|---|---|
| KR | 10-2019-0081536 | 7/2019 |
| KR | 10-2047976 | 11/2019 |
| KR | 10-2020-0080833 | 7/2020 |

\* cited by examiner

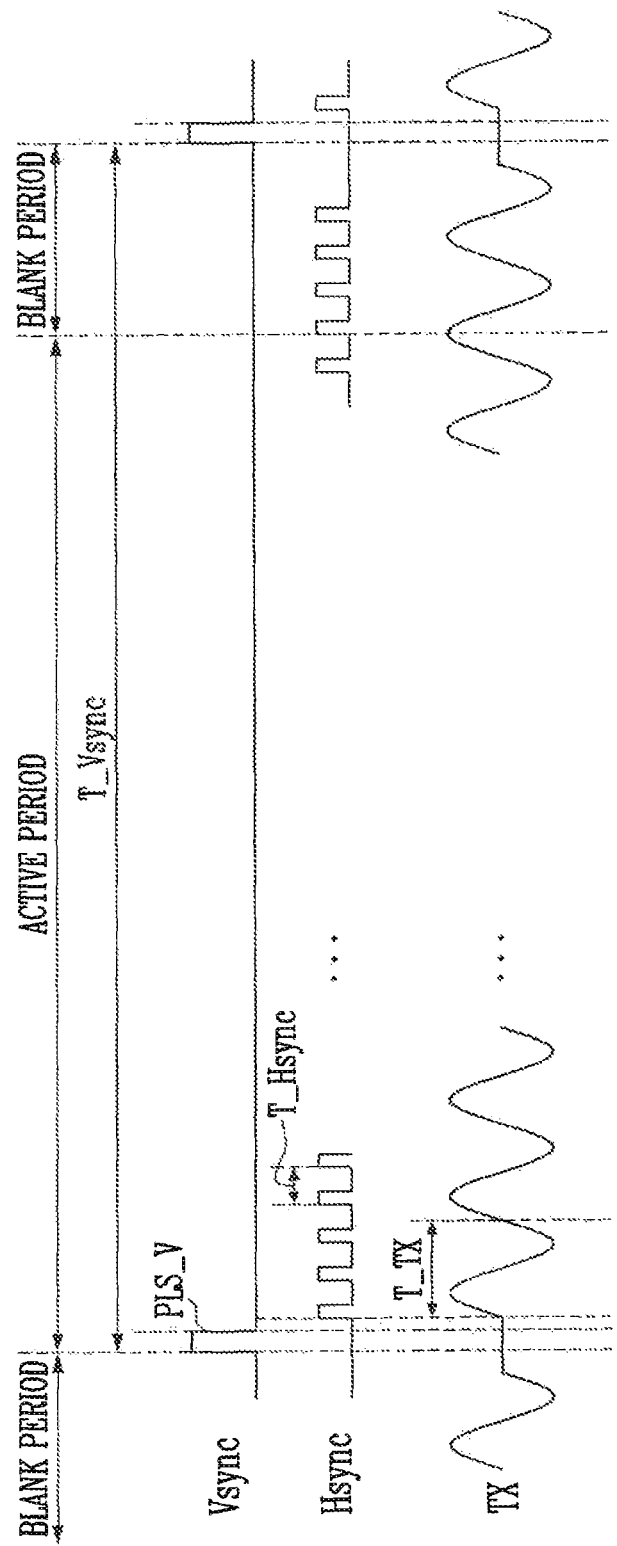

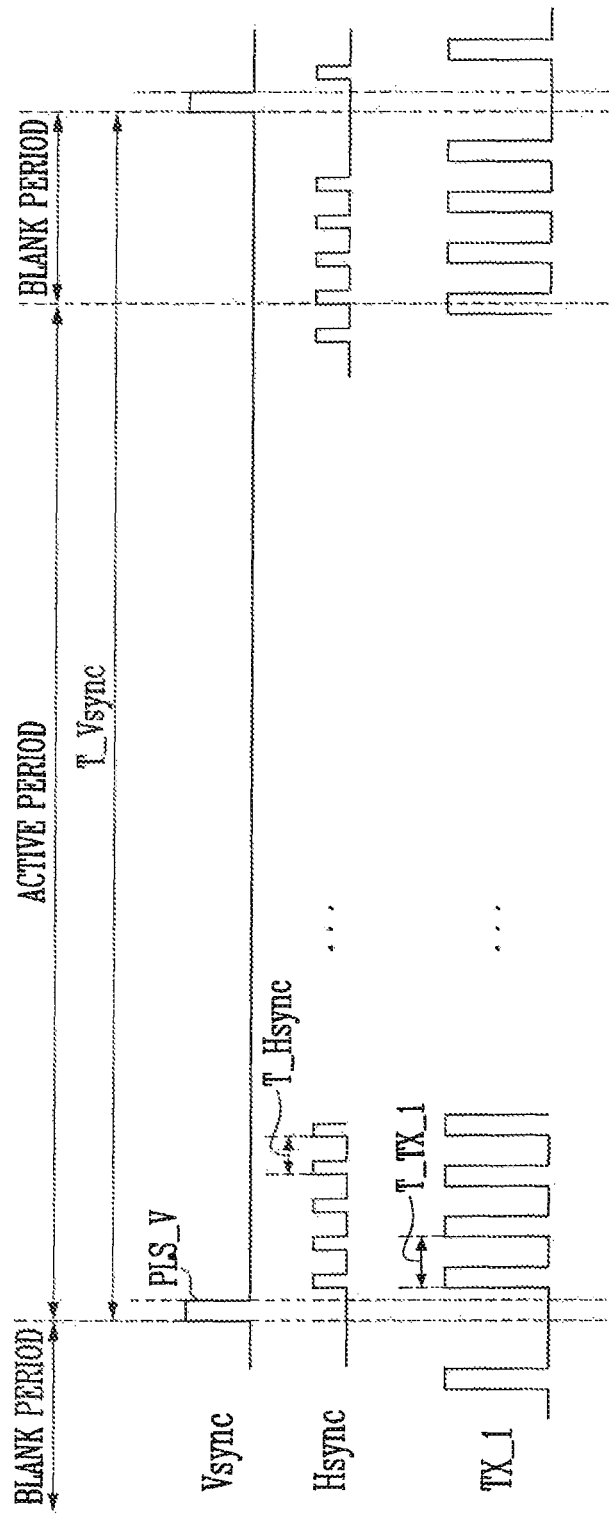

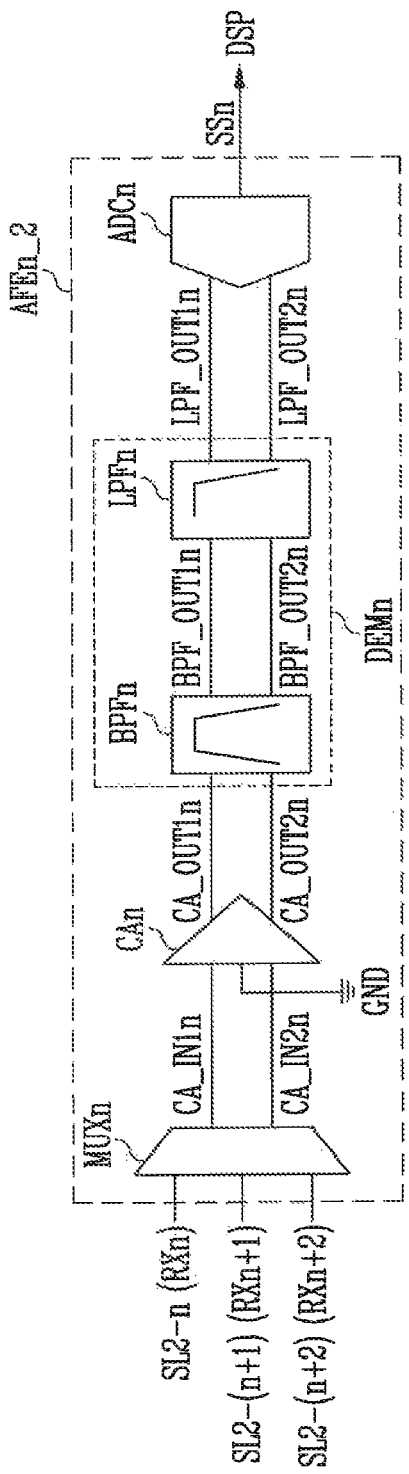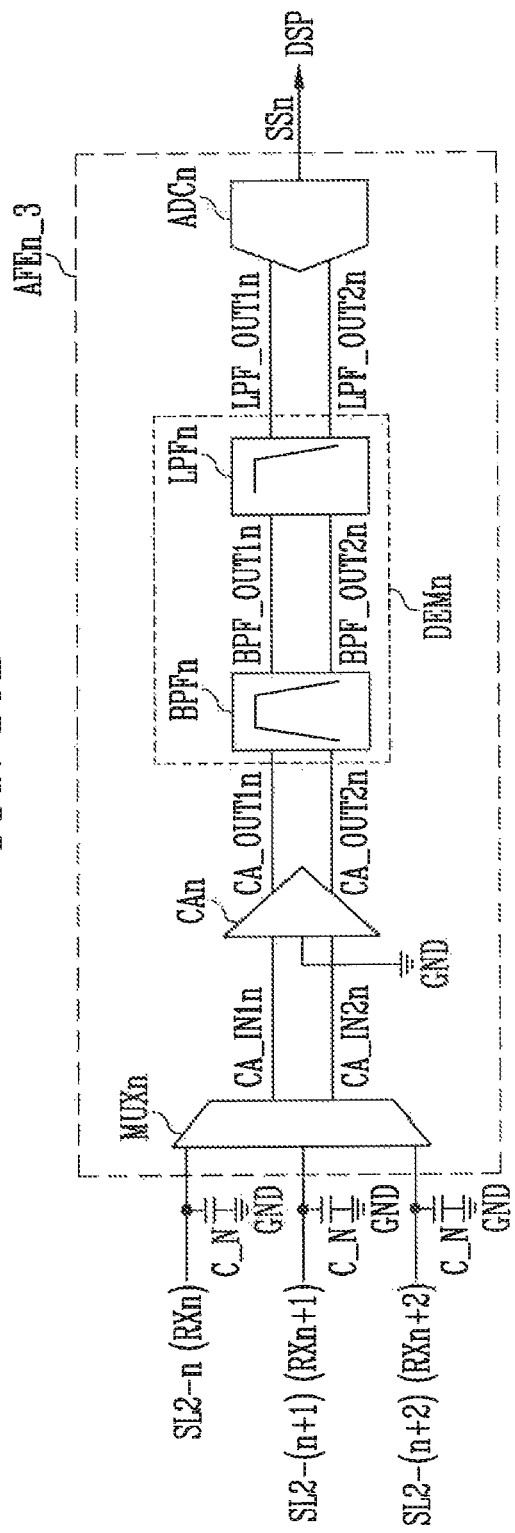

INPUT SENSING DEVICE HAVING AN ANALOG FRONT-END

CROSS-REFERENCE TO RELATED APPLICATION

This application claims priority under 35 U.S.C. § 119 to Korean Patent Application No. 10-2021-0116567, filed on Sep. 1, 2021 in the Korean Intellectual Property Office, the disclosure of which is incorporated by reference in its entirety herein.

1. TECHNICAL FIELD

The present disclosure relates to an analog front-end, an input sensing device, and a display device including the same.

2. DISCUSSION OF RELATED ART

A display device may include a display panel that displays an image, and a touch panel that is disposed on the display panel to receive a touch input.

The touch panel includes a plurality of sensing electrodes, and the display device may be an input sensing device that detects a touched point on the touch panel and determines a position of the touched point by sensing a change in capacitance formed in a plurality of touch electrodes.

Since the display driving signal for driving the display panel acts as noise on the touch panel, the driving signal for driving the touch panel may be set to avoid the display driving signal, such as a horizontal synchronization signal.

However, as the display device is driven at high speed, the frequency of the display driving signal increases (e.g., the driving speed is increased from 60 Hz to 120 Hz) and the period of the display driving signal is decreased. Therefore, the period of the driving signal is reduced, and the time for touch sensing may be reduced.

In addition, as the display device becomes thinner and/or increases in size, the gap between the display panel and the touch panel (e.g., touch electrodes) is reduced. As the overlapping area between the display panel and the touch panel increases, parasitic capacitance may increase and sensing sensitivity may decrease.

SUMMARY

An object of an embodiment of the present disclosure is to provide an analog front-end, an input sensing device, and a display device including the same, which have increased sensing sensitivity even in an environment in which the performance of a touch sensor is deteriorated (e.g., high-speed driving, thinning, and/or an increase in size of a display device).

The display device (e.g., the input sensing device) may convert sensing signals sensed from the touch panel to sense a change in capacitance and detect a touch position. A load may occur in signal processing due to conversion of sensing signals.

Another object of an embodiment of the present disclosure is to provide an analog front-end, an input sensing device, and a display device including the same, capable of reducing a signal processing load in detecting a touch position.

However, objects of embodiments of the present disclosure are not limited to the above-described objects, and may be variously expanded without departing from the spirit and scope of the present disclosure.

According to an embodiment of the present disclosure, an analog front-end includes a (1-1)-th charge amplifier having a (1-1)-th input terminal and a (1-2)-th input terminal. The (1-1)-th charge amplifier is configured to differentially amplify a first sensing signal and a second sensing signal provided to the (1-1)-th input terminal and the (1-2)-th input terminal, respectively, and output a (1-1)-th differential signal. A (1-2)-th charge amplifier includes a (1-3)-th input terminal and a (1-4)-th input terminal. The (1-2)-th charge amplifier is configured to differentially amplify the second sensing signal and a third sensing signal provided to the (1-3)-th input terminal and the (1-4)-th input terminal, respectively, and output a (1-2)-th differential signal. A second charge amplifier includes a (2-1)-th input terminal and a (2-2)-th input terminal. The second charge amplifier is configured to differentially amplify the (1-1)-th differential signal provided to the (2-1)-th input terminal and the (1-2)-th differential signal provided to the (2-2)-th input terminal and output a (2-1)-th differential signal and a (2-2)-th differential signal. A demodulation circuit is configured to filter the (2-1)-th differential signal and the (2-2)-th differential signal and output demodulated differential signals. An analog-to-digital converter is configured to output a sensing value based on the demodulated differential signals.

In an embodiment, the (1-2)-th input terminal may be connected to the (1-3)-th input terminal.

In an embodiment, the analog front-end may further include a multiplexer configured to select the first sensing signal and the second sensing signal among the first to third sensing signals, provide the first sensing signal and the second sensing signal to the (1-1)-th charge amplifier, select the second sensing signal and the third sensing signal among the first to third sensing signals, and provide the second sensing signal and the third sensing signal to the (1-2)-th charge amplifier.

According to an embodiment of the present disclosure, an input sensing device includes driving electrodes and sensing electrodes. Analog front-ends are configured to process sensing signals provided from the sensing electrodes and output differential output values. A signal processor is configured to detect an external input based on the differential output values. The analog front-ends include an n-th analog front-end in which n is a natural number greater than or equal to 2. The n-th analog front-end includes an (n−1)-th first charge amplifier configured to differentially amplify an (n−1)-th sensing signal and an n-th sensing signal provided from an (n−1)-th sensing electrode and an n-th sensing electrode, respectively, among the sensing electrodes, and output an (n−1)-th sub-differential signal. An n-th first charge amplifier is configured to differentially amplify the n-th sensing signal and an (n+1)-th sensing signal provided from the n-th sensing electrode and an (n+1)-th sensing electrode, respectively, among the sensing electrodes, and output an n-th sub-differential signal. An (n−1)-th second charge amplifier is configured to differentially amplify the (n−1)-th sub-differential signal and the n-th sub-differential signal and output (n−1)-th differential signals. An n-th demodulation circuit is configured to filter the (n−1)-th differential signals and output demodulated differential signals. An n-th analog-to-digital converter is configured to output an n-th sensed value based on the demodulated differential signals.

In an embodiment, the (n−1)-th first charge amplifier may include a (1-1)-th input terminal connected to the (n−1)-th sensing electrode and a (1-2)-th input terminal connected to the n-th sensing electrode, and the n-th first charge amplifier may include a (1-3)-th input terminal connected to the n-th sensing electrode and a (1-4)-th input terminal connected to the (n+1)-th sensing electrode.

In an embodiment, the n-th demodulation circuit may include: a band pass filter configured to filter the (n−1)-th differential signals in a frequency band corresponding to a frequency band of the sensing signals and output a first filtered signal and a second filtered signal; and a low pass filter configured to filter high-frequency bands of the first filtered signal and the second filtered signal and output a third filtered signal and a fourth filtered signal.

In an embodiment, the n-th demodulation circuit may include: a band pass filter configured to filter the (n−1)-th differential signals in a frequency band corresponding to a frequency band of the sensing signals and output a first filtered signal and a second filtered signal; a mixer configured to change frequencies of the first filtered signal and the second filtered signal and output a first demodulation signal and a second demodulation signal; and a low pass filter configured to filter high-frequency bands of the first demodulation signal and the second demodulation signal and output a third filtered signal and a fourth filtered signal.

In an embodiment, the analog front-ends include a first analog front-end. The first analog front-end includes a "first" first charge amplifier configured to differentially amplify a first sensing signal and a second sensing signal provided from a first sensing electrode and a second sensing electrode, respectively, among the sensing electrodes and output a first sub-differential signal. A first demodulation circuit is configured to filter the first sub-differential signal and output at least one demodulated signal. A first analog-to-digital converter is configured to output a first sensing value based on the at least one demodulated signal.

In an embodiment, the (n−1)-th second charge amplifier may include two input terminals and two output terminals.

In an embodiment, the "first" first charge amplifier may include two input terminals and one output terminal.

In an embodiment, an output terminal of the "first" first charge amplifier and an input terminal of the first demodulation circuit may be directly connected to each other.

In an embodiment, the n-th analog-to-digital converter may output the n-th sensing value corresponding to a value obtained by subtracting a sum of the (n−1)-th sensing signal and the (n+1)-th sensing signal from a value obtained by amplifying the n-th sensing signal.

In an embodiment, the first analog-to-digital converter may output the first sensing signal corresponding to a difference between the first sensing signal and the second sensing signal.

In an embodiment, the signal processor may include a position calculation circuit configured to detect the external input by comparing magnitudes of the differential output values.

According to an embodiment of the present disclosure, a display device includes a display panel including pixels that emit light. Driving electrodes and sensing electrodes are disposed on a first surface of the display panel. Analog front-ends are configured to process sensing signals provided from the sensing electrodes and output differential output values. A signal processor is configured to detect an external input based on the differential output values. The analog front-ends include an n-th analog front-end in which n is a natural number greater than or equal to 2. The n-th analog front-end includes an (n−1)-th first charge amplifier configured to differentially amplify an (n−1)-th sensing signal and an n-th sensing signal provided from an (n−1)-th sensing electrode and an n-th sensing electrode, respectively, among the sensing electrodes and output an (n−1)-th sub-differential signal. An n-th first charge amplifier is configured to differentially amplify the n-th sensing signal and an (n+1)-th sensing signal provided from the n-th sensing electrode and an (n+1)-th sensing electrode, respectively, among the sensing electrodes and output an n-th sub-differential signal. An (n−1)-th second charge amplifier is configured to differentially amplify the (n−1)-th sub-differential signal and the n-th sub-differential signal and output (n−1)-th differential signals. An n-th demodulation circuit is configured to filter the (n−1)-th differential signals and output demodulated differential signals; and respectively. An n-th analog-to-digital converter is configured to output an n-th sensing value based on the demodulated differential signals.

In an embodiment, the display panel may further include: a base layer; a light emitting element disposed on the base layer and included in each of the pixels; and a thin film encapsulation layer covering the light emitting element, and the driving electrodes or the sensing electrodes may be directly formed on the thin film encapsulation layer.

In an embodiment, the (n−1)-th first charge amplifier may include a (1-1)-th input terminal connected to the (n−1)-th sensing electrode and a (1-2)-th input terminal connected to the n-th sensing electrode, and the n-th first charge amplifier may include a (1-3)-th input terminal connected to the n-th sensing electrode and a (1-4)-th input terminal connected to the (n+1)-th sensing electrode.

In an embodiment, the analog front-ends include a first analog front-end. The first analog front-end may include a "first" first charge amplifier configured to differentially amplify a first sensing signal and a second sensing signal provided from a first sensing electrode and a second sensing electrode, respectively, among the sensing electrodes and output a first sub-differential signal. A first demodulation circuit is configured to filter the first sub-differential signal and output at least one demodulated signal. A first analog-to-digital converter is configured to output a first sensing value based on the at least one demodulated signal.

In an embodiment, the (n−1)-th second charge amplifier may include two input terminals and two output terminals.

In an embodiment, each of the first charge amplifiers may include two input terminals and one output terminal.

BRIEF DESCRIPTION OF THE DRAWINGS

FIGS. 7A, 7B, and 7C are waveform diagrams for explaining an operation of a driving signal generator included in the input sensing circuit of FIG. 6A according to embodiments of the present disclosure.

FIGS. 15A and 15B are block diagrams illustrating an analog front-end included in the input sensing circuit of FIG. 14 according to embodiments of the present disclosure.

DETAILED DESCRIPTION OF EMBODIMENTS

Figure 1:
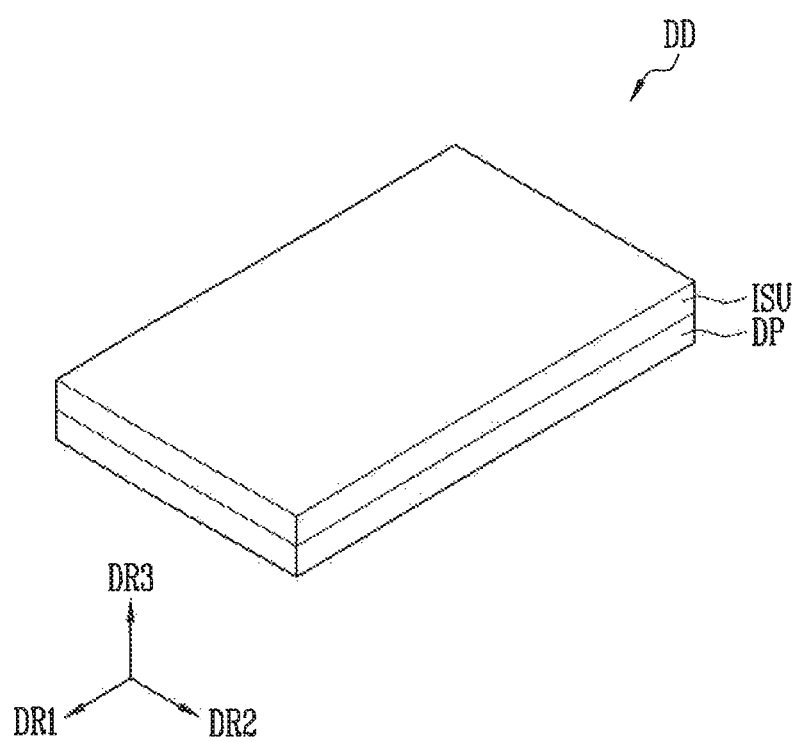
FIG. 1 is a perspective view illustrating a display device according to an embodiment of the present disclosure.

Since the present disclosure can be variously modified and can have various forms, specific embodiments are illustrated in the drawings and described below in detail. However, the present disclosure is not limited to embodiments disclosed below, and may be modified and implemented in various forms.

On the other hand, in the drawings, some components not directly related to the features of the present disclosure may be omitted in order to clearly describe the present disclosure. In addition, some components in the drawings may be illustrated with a slightly exaggerated size or proportion. The same or similar elements throughout the drawings are denoted by the same reference numbers and reference symbols as much as possible even if they are shown in different drawings, and redundant descriptions thereof may be omitted for convenience of explanation.

FIG. 1 is a perspective view illustrating a display device according to embodiments of the present disclosure.

Referring to FIG. 1, a display device DD may be provided in various shapes, for example, in a rectangular plate shape having two pairs of sides parallel to each other. However, embodiments of the present disclosure are not limited thereto. In an embodiment in which the display device DD is provided in a rectangular plate shape, one pair of sides may be provided to be longer than the other pair of sides.

The display device DD may display an image through a display surface. In an embodiment, the display surface may be parallel to a surface defined by a first direction axis corresponding to a first direction DR1 and a second direction axis corresponding to a second direction DR2. A normal direction of the display surface, that is, a thickness direction of the display device DD, is defined as a third direction DR3.

A front surface (or upper surface) and a rear surface (or lower surface) of each of members, layers, or units described below may be divided in the third direction DR3. However, the first to third directions DR1, DR2, and DR3 are only examples, and the first to third directions DR1, DR2, and DR3 are relative concepts and may be converted into other directions. For example, in an embodiment, the first to third directions DR1 to DR3 may be perpendicular to each other. However, embodiments of the present disclosure are not limited thereto and the first to third directions DR1 to DR3 may cross each other at various different angles.

The display device DD may have a flat display surface. However, the display surface is not limited thereto. For example, the display device DD may include various types of display surfaces capable of displaying an image, such as a curved display surface or a three-dimensional display surface. When the display device DD according to an embodiment has a three-dimensional display surface, the three-dimensional display surface may include, for example, a plurality of display areas facing different directions. The three-dimensional display surface may be implemented as a polygonal columnar display surface.

The display device DD may be a flexible display device. For example, the display device DD may be applied to a foldable display device, a bendable display device, a rollable display device, or the like. However, embodiments of the present disclosure are not limited thereto, and the display device may be a rigid display device.

The display device DD may be applied to large-sized electronic devices such as televisions, monitors, and electric signs, and small and medium-sized electronic devices such as mobile phones, tablets, navigation devices, game consoles, and smart watches. Also, the display device DD may be applied to a wearable electronic device such as a head-mounted display.

The display device DD may include a display panel DP and an input sensing unit ISU (e.g., an input sensing layer, an input sensing panel, or an input sensing device).

In an embodiment, the display panel DP and the input sensing unit ISU may be formed by a continuous process. However, the display panel DP and the input sensing unit ISU are not limited thereto. For example, in an embodiment, the display panel DP and the input sensing unit ISU may be connected to each other through an adhesive member. The adhesive member may include a conventional adhesive or pressure-sensitive adhesive. For example, the adhesive member may be an optically clear adhesive member.

A component formed through a continuous process with another component may be expressed as a "layer", and a component combined with another component through an adhesive member may be expressed as a "panel". The panel includes a base layer providing a base surface, such as a synthetic resin film, a composite material film, a glass substrate, and the like. However, embodiments of the present disclosure are not limited thereto and the base layer may be omitted in the "layer". For example, the input sensing unit ISU expressed as "layer" may be directly disposed or formed on the display panel DP (e.g., the base surface provided by the display panel DP).

The input sensing unit ISU may detect an external input such as a touch or an approach within a certain proximity of the input sensing unit ISU (e.g., hover) by an external medium such as a hand or a pen on the display surface of the display device DD.

In an embodiment, the display panel DP may be a light emitting display panel. For example, the display panel DP may be an organic light emitting display panel or a quantum dot light emitting display panel. However, embodiments of the present disclosure are not limited thereto.

In some embodiments, the display device DD may further include an anti-reflection panel and a window panel.

The anti-reflection panel is disposed on the input sensing unit ISU, and may reduce reflectance of external light incident on the display surface of the display device DD. For example, the anti-reflective panel may include color filters. The color filters may have a certain arrangement. The arrangement of the color filters may be determined considering emission colors of pixels included in the display panel DP.

The window panel is disposed on the input sensing unit ISU, and may protect the display panel DP and the input sensing unit ISU from the outside (e.g., external impact). In an embodiment, the window panel may include a synthetic resin film and/or a glass substrate. However, embodiments of the present disclosure are not limited thereto. The window panel may include two or more films bonded by an adhesive member.

Figure 2:
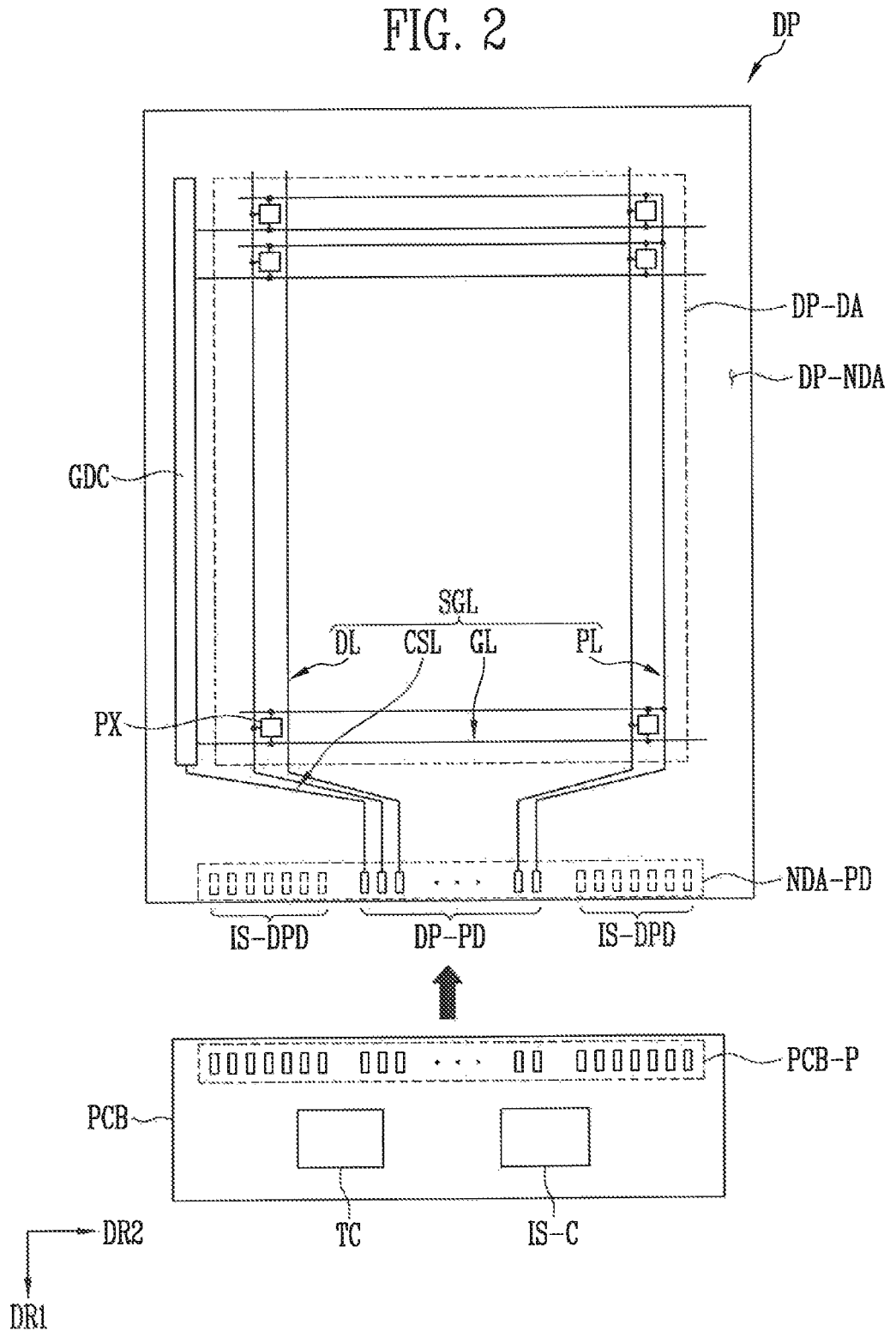
FIG. 2 is a plan view illustrating a display panel included in the display device of FIG. 1 according to an embodiment of the present disclosure.

FIG. 2 is a plan view illustrating an example of the display panel included in the display device of FIG. 1.

Referring to FIGS. 1 and 2, the display panel DP may include a display area DP-DA in which an image is displayed, and a non-display area DP-NDA adjacent to the display area DP-DA. The non-display area DP-NDA is an area in which an image is not displayed. The non-display area DP-NDA may be disposed outside the display area DP-DA. For example, in an embodiment the non-display area DP-NDA may completely surround the display area DP-DA (e.g., in the first and second directions DR1, DR2). However, embodiments of the present disclosure are not limited thereto and the non-display area DP-NDA may not surround the display area DP-DA on at least one side.

The display area DP-DA may include pixel areas in which pixels PX are provided. A pad portion in which pads of wirings are provided may be provided in the non-display area DP-NDA. A data driver that provides data signals to the pixels PX may be provided in the non-display area DP-NDA. The data driver may provide data signals to the pixels PX through data lines. The data driver may be included in a timing control circuit TC to be described below.

The display panel DP may include a driving circuit GDC, signal lines SGL, signal pads DP-PD, and the pixels PX.

The pixels PX may be disposed in the display area DP-DA. Each of the pixels PX may include a light emitting element and a pixel driving circuit connected to the light emitting element. For example, in an embodiment, the light emitting element may be an organic light emitting diode (LED) or an inorganic LED such as a micro LED or a quantum dot LED. In addition, the light emitting element may include an organic material and an inorganic material in combination. Furthermore, each of the pixels PX may include a single light emitting element. However, embodiments of the present disclosure are not limited thereto. For example, in an embodiment, each of the pixels PX may include a plurality of light emitting elements, and the light emitting elements are mutually connected in series, in parallel, or in series-parallel.

The driving circuit GDC may include a scan driving circuit. The scan driving circuit may generate scan signals and sequentially provide or output the scan signals to the scan lines GL. The scan driving circuit may further provide another control signal to the driving circuit of the pixels PX.

The scan driving circuit may include thin film transistors formed through the same process as the driving circuit of the pixels PX, for example, a low temperature polycrystalline silicon (LTPS) process or a low temperature polycrystalline oxide (LTPO) process. However, embodiments of the present disclosure are not limited thereto.

In an embodiment, the signal lines SGL may include scan lines GL, data lines DL, a power line PL, and a control signal line CSL. Each of the scan lines GL may be connected to the corresponding pixel among the pixels PX, and each of the data lines DL may be connected to the corresponding pixel among the pixels PX. The power line PL may be connected to the pixels PX. The control signal line CSL may provide control signals to the scan driving circuit.

The signal lines SGL may overlap the display area DP-DA and the non-display area DP-NDA. The signal lines SGL may include a pad portion (e.g., a pad part) and a line portion (e.g., a line part). The line portion may overlap the display area DP-DA and the non-display area DP-NDA. The pad portion may be connected to the end of the line portion. The pad portion may be disposed in the non-display area DP-NDA and may overlap the corresponding signal pad among the signal pads DP-PD. An area in which the signal pads DP-PD are disposed in the non-display area DP-NDA may be defined as a pad area NDA-PD.

A line portion connected to the pixels PX may constitute most of the signal lines SGL. The line portion may be connected to transistors of the pixels PX. The line portion may have a single-layer or multi-layer structure, and the line portion may have a single body or include two or more portions. The two or more portions may be disposed on different layers, and may be connected to each other through contact holes passing through an insulating layer disposed between the two or more portions.

The display panel DP may further include dummy pads IS-DPD disposed in the pad area NDA-PD. Since the dummy pads IS-DPD are formed through the same process as the signal lines SGL, the dummy pads IS-DPD may be disposed on the same layer as the signal lines SGL. The dummy pads IS-DPD are selectively provided in the display device DD including the input sensing layer, and may be omitted in the display device DD including the input sensing panel.

FIG. 2 further illustrates a circuit board PCB electrically connected to the display panel DP. The circuit board PCB may be a flexible circuit board or a rigid circuit board. The circuit board PCB may be directly connected to the display panel DP, or may be connected to the display panel DP through another circuit board.

The timing control circuit TC that controls the operation of the display panel DP may be disposed on the circuit board PCB. The timing control circuit TC may receive input image data and timing signals (e.g., a vertical synchronization signal, a horizontal synchronization signal, and clock signals) from the outside (e.g., a host system such as an application processor), may generate a gate driving control signal for controlling the driving circuit GDC based on the timing signals, and may provide a gate driving control signal to the driving circuit GDC. The vertical synchronization signal among the timing signals may define the start of one display period (e.g., one frame) in which an image of one frame (e.g., frame image) is displayed, or may define the start (e.g., transmission start) of image data corresponding to one frame, and the horizontal synchronization signal among the timing signals may define a period in which each of the images of the horizontal line included in the image of one frame (e.g., a line image displayed through the pixels included in the same row) is output. In addition, the timing control circuit TC may generate a data driving control signal for controlling the data driver, may provide the data driving control signal to the data driver, and may rearrange the input image data and provide the rearranged input image to the data driver.

Also, an input sensing circuit IS-C that controls the input sensing unit ISU may be disposed on the circuit board PCB. The input sensing circuit IS-C may receive a timing signal (e.g., a vertical synchronization signal) from the outside (e.g., a host system such as an application processor), and may generate a driving signal (e.g., a touch driving signal) based on the vertical synchronization signal. In addition, the input sensing circuit IS-C may receive a sensing signal corresponding to an external input (e.g., a user's touch input) from the input sensing unit ISU, and may calculate or recognize a position of the external input (e.g., the touch input) based on the sensing signal.

In an embodiment, each of the timing control circuit TC and the input sensing circuit IS-C may be mounted on the circuit board PCB in the form of an integrated chip. However, embodiments of the present disclosure are not limited thereto. In an embodiment, the timing control circuit TC and the input sensing circuit IS-C may be mounted on the circuit board PCB in the form of a single integrated chip. The circuit board PCB may include circuit board pads PCB-P electrically connected to the display panel DP. The circuit board PCB may further include signal lines for connecting the circuit board pads PCB-P to the timing control circuit TC and/or the input sensing circuit IS-C.

Figure 3:
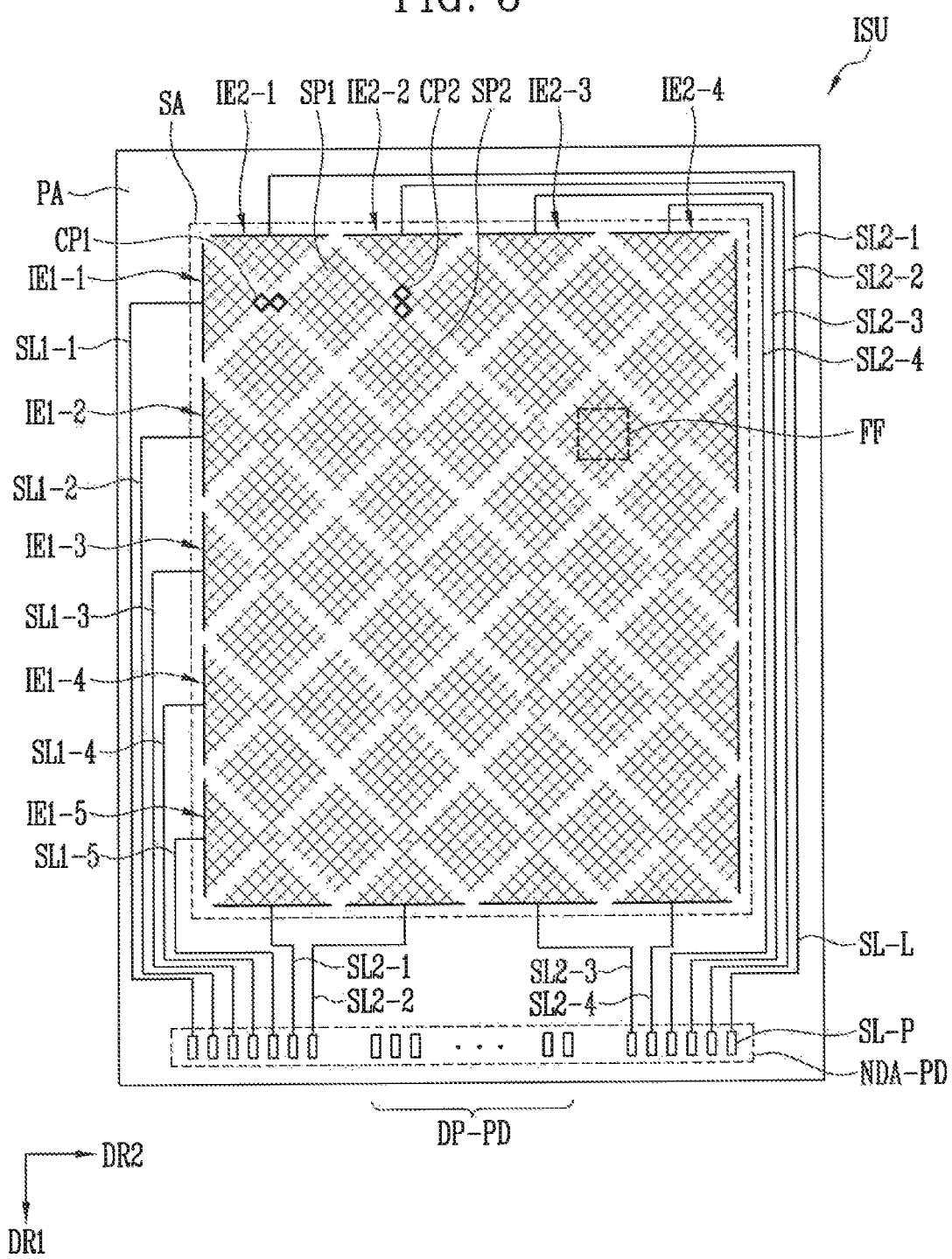
FIG. 3 is a plan view illustrating an input sensing unit included in the display device of FIG. 1 according to an embodiment of the present disclosure.
Figure 4:
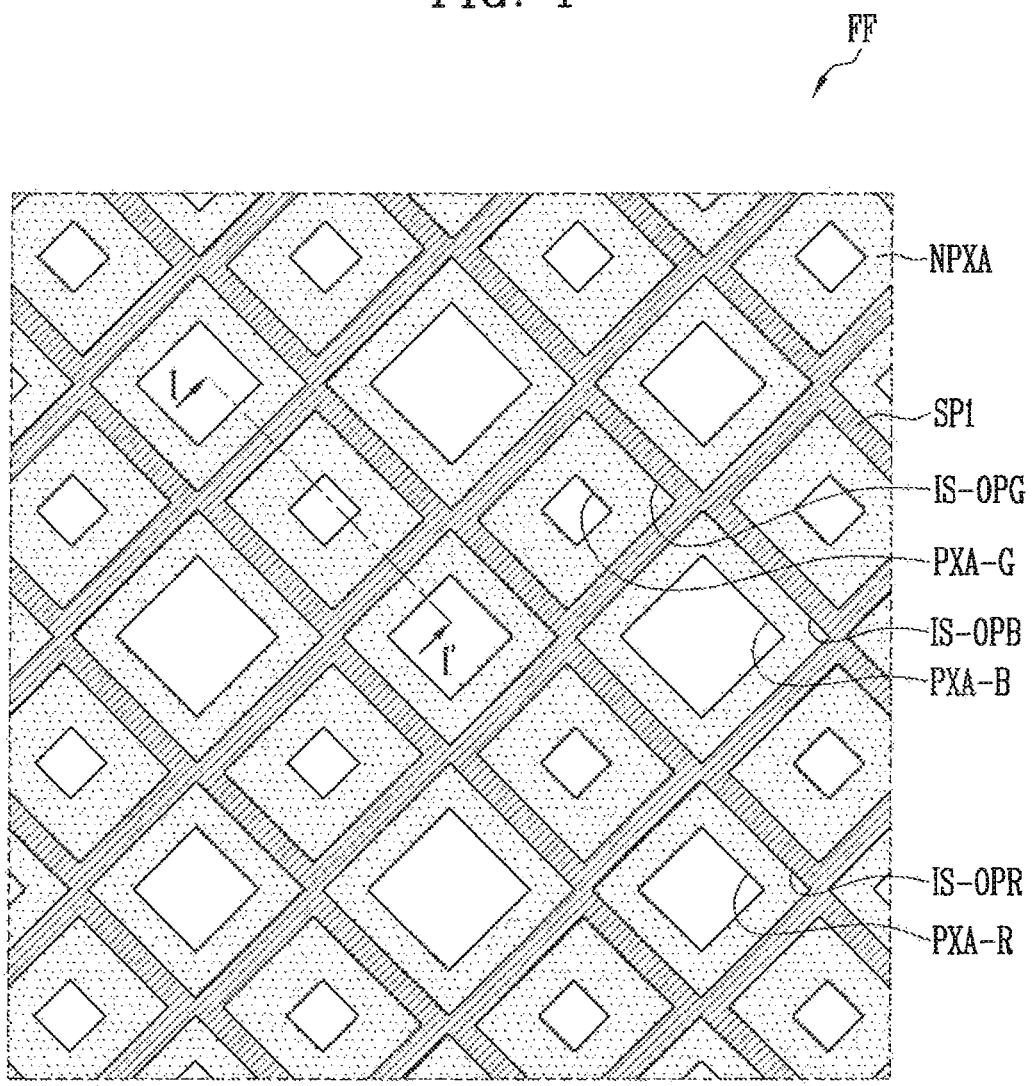
FIG. 4 is an enlarged plan view of a first region FF of the input sensing unit of FIG. 3 according to an embodiment of the present disclosure.

FIG. 3 is a plan view illustrating an example of the input sensing unit included in the display device of FIG. 1. FIG. 4 is an enlarged plan view of a first region FF of the input sensing unit of FIG. 3.

Referring to FIGS. 2 and 3, the input sensing unit ISU may include a sensing area SA for sensing an external input, for example, a user's touch and/or pressure upon touch, and a peripheral area PA provided on at least one side of the sensing area SA.

In an embodiment, the sensing area SA corresponds to the display area DP-DA of the display panel DP, and may have substantially the same area as the display area DP-DA or may have a larger area than the display area DP-DA. The peripheral area PA may be disposed adjacent to the sensing area SA (e.g., in the first and/or second directions DR1, DR2). Also, the peripheral area PA may correspond to the non-display area DP-NDA of the display panel DP.

In an embodiment, the input sensing unit ISU may include first sensing electrodes IE1-1 to IE1-5 (e.g., driving electrodes) and second sensing electrodes IE2-1 to IE2-4 (e.g., sensing electrodes) provided in the sensing area SA, and first signal lines SL1-1 to SL1-5 and second signal lines SL2-1 to SL2-4 provided in the peripheral area PA. However, embodiments of the present disclosure are not limited thereto and the number of the sensing electrodes and signal lines may vary.

First sensor units SP1 in one first sensing electrode may be arranged in the second direction DR2, and second sensor units SP2 in one second sensing electrode may be arranged in the first direction DR1. Each of first connection portions CP1 may connect the adjacent first sensor units SP1, and each of second connection portions CP2 may connect the adjacent second sensor units SP2.

In an embodiment, the first sensing electrodes IE1-1 to IE1-5 and the second sensing electrodes IE2-1 to IE2-4 may have a mesh pattern or a mesh structure. However, embodiments of the present disclosure are not limited thereto. As illustrated in FIG. 4, the mesh pattern may include mesh lines that are metal lines forming at least one mesh hole IS-OPR, IS-OPG, or IS-OPB (e.g., openings). The mesh holes IS-OPR, IS-OPG, IS-OPB may have a rhombus planar shape due to the mesh lines, but are not limited thereto.

Since the first sensing electrodes IE1-1 to IE1-5 and the second sensing electrodes IE2-1 to IE2-4 have a mesh pattern, parasitic capacitance with the electrodes of the display panel DP may be reduced.

In addition, as illustrated in FIG. 4, in the first region FF, the first sensing electrodes IE1-1 to IE1-5 and the second sensing electrodes IE2-1 to IE2-4 may not overlap light emitting areas PXA-R, PXA-G, and PXA-B. The emission areas PXA-R, PXA-G, and PXA-B are areas from which light is emitted, and may be included in the pixels PX (e.g., the pixel areas in which the pixels PX are provided) described with reference to FIG. 2. Therefore, the first sensing electrodes IE1-1 to IE1-5 and the second sensing electrodes IE2-1 to IE2-4 may not be recognized by the user of the display device DD.

The first sensing electrodes IE1-1 to IE1-5 and the second sensing electrodes IE2-1 to IE2-4 may include aluminum, copper, chromium, nickel, titanium, or the like. The first sensing electrodes IE1-1 to IE1-5 and the second sensing electrodes IE2-1 to IE2-4 may have a three-layer structure of titanium/aluminum/titanium. However, embodiments of the present disclosure is not limited thereto, and the sensing electrodes may include various metals.

In an embodiment in which the first sensing electrodes IE1-1 to IE1-5 and the second sensing electrodes IE2-1 to IE2-4 include, for example, a low-temperature processable metal, damage to the light emitting element may be prevented even if the input sensing unit ISU is formed in a continuous process after the process of manufacturing the display panel DP.

In an embodiment in which the first sensing electrodes IE1-1 to IE1-5 and the second sensing electrodes IE2-1 to IE2-4 are directly disposed on the display panel DP in a mesh pattern, the flexibility of the display device DD may be increased Although FIG. 3 illustrates that the first sensing electrodes IE1-1 to IE1-5 and the second sensing electrodes IE2-1 to IE2-4 include the first sensor units SP1 and the second sensor units SP2 having a diamond shape, embodiments of the present disclosure are not limited thereto. For example, the first sensor units SP1 and the second sensor units SP2 may have a polygonal shape. The first sensing electrodes IE1-1 to IE1-5 and the second sensing electrodes IE2-1 to IE2-4 may have a shape (e.g., a bar shape) in which the sensor unit and the connection portion are not distinguished.

Each of the first signal lines SL1-1 to SL1-5 may be respectively connected to one end of each of the first sensing electrodes IE1-1 to IE1-5. The second signal lines SL2-1 to SL2-4 may be connected to both ends of the second sensing electrodes IE2-1 to IE2-4. However, embodiments of the present disclosure are not limited thereto. For example, the first signal lines SL1-1 to SL1-5 may be connected to both ends of the first sensing electrodes IE1-1 to IE1-5. As another example, each of the second signal lines SL2-1 to SL2-4 may be respectively connected to only one end of each of the second sensing electrodes IE2-1 to IE2-4.

Since the second sensing electrodes IE2-1 to IE2-4 have a longer length than the first sensing electrodes IE1-1 to IE1-5, greater drop or attenuation of the sensing signal (e.g., the detection signal or the transmission signal) occurs, and thus the sensing sensitivity may be lowered. Since the sensing signal is transmitted through the second signal lines SL2-1 to SL2-4 connected to both ends of the second sensing electrodes IE2-1 to IE2-4, the reduction in a drop in the sensing signal and a decrease in sensing sensitivity may be prevented.

The first signal lines SL1-1 to SL1-5 and the second signal lines SL2-1 to SL2-4 may include a line portion SL-L and a pad portion SL-P. The pad portion SL-P may be aligned in the pad area NDA-PD. For example, the pad portions SL-P of the second signal lines SL2-1 to SL2-4 may be arranged in the second direction DR2. The pad portion SL-P may overlap the dummy pads IS-DPD illustrated in FIG. 2.

The input sensing unit ISU may include signal pads DP-PD. The signal pads DP-PD may be aligned in the pad area NDA-PD.

Referring to FIG. 4, the first sensor units SP1 may not overlap the emission areas PXA-R, PXA-G, and PXA-B, and may overlap the non-emission area NPXA.

The mesh lines (e.g., the metal lines) of the first sensor units SP1 may define mesh holes IS-OPR, IS-OPG, and IS-OPB. The mesh holes IS-OPR, IS-OPG, and IS-OPB may correspond to the emission areas PXA-R, PXA-G, and PXA-B one-to-one. The emission areas PXA-R, PXA-G, and PXA-B may be exposed by the mesh holes IS-OPR, IS-OPG, and IS-OPB.

The line width of the mesh lines may be less than the width of a pixel defining layer corresponding to the non-emission area NPXA (a pixel defining layer defining the emission areas PXA-R, PXA-G, and PXA-B).

Therefore, the blocking of light emitted from the emission areas PXA-R, PXA-G, and PXA-B by the mesh lines may be reduced, and the mesh lines may be prevented from being recognized by the user.

The emission areas PXA-R, PXA-G, and PXA-B may be divided into a plurality of groups according to the color of light generated by the light emitting element. FIG. 4 illustrates the emission areas PXA-R, PXA-G, and PXA-B divided into three groups according to emission colors, such as red, green and blue, respectively. However, embodiments of the present disclosure are not limited thereto and the colors of the emission areas may vary.

The emission areas PXA-R, PXA-G, and PXA-B may have different areas according to the color emitted from the light emitting element. For example, when the light emitting element includes an organic LED, the area of the emission areas PXA-R, PXA-G, and PXA-B may be determined according to the type of the organic LED.

The mesh holes IS-OPR, IS-OPG, and IS-OPB may be divided into a plurality of groups having different areas. The mesh holes IS-OPR, IS-OPG, and IS-OPB may be divided into three groups according to the corresponding emission areas PXA-R, PXA-G, and PXA-B.

Although FIG. 4 illustrates that the mesh holes IS-OPR, IS-OPG, and IS-OPB correspond to the emission areas PXA-R, PXA-G, and PXA-B one-to-one, embodiments of the present disclosure are not limited thereto. For example, each of the mesh holes IS-OPR, IS-OPG, and IS-OPB may correspond to two or more emission areas PXA-R, PXA-G, and PXA-B.

Although FIG. 4 illustrates that the areas of the emission areas PXA-R, PXA-G, and PXA-B are various, embodiments of the present disclosure are not limited thereto. For example, the sizes of the emission areas PXA-R, PXA-G, and PXA-B may be equal to each other, and the sizes of the mesh holes IS-OPR, IS-OPG, and IS-OPB may also be equal to each other. A planar shape of the mesh holes IS-OPR, IS-OPG, and IS-OPB is not limited to those shown in FIG. 4, and may have a polygonal shape different from a rhombus. A planar shape of the mesh holes IS-OPR, IS-OPG, and IS-OPB may have a polygonal shape with round corners.

On the other hand, although FIG. 3 illustrates that the input sensing unit ISU includes five first sensing electrodes IE1-1 to IE1-5 and four second sensing electrodes IE2-4 to IE2-4, the number of first sensing electrodes IE1-1 to IE1-5 and the number of second sensing electrodes IE2-1 to IE2-4 are not limited thereto. For example, the input sensing unit ISU may include six or more first sensing electrodes and/or five or more second sensing electrodes.

Figure 5:
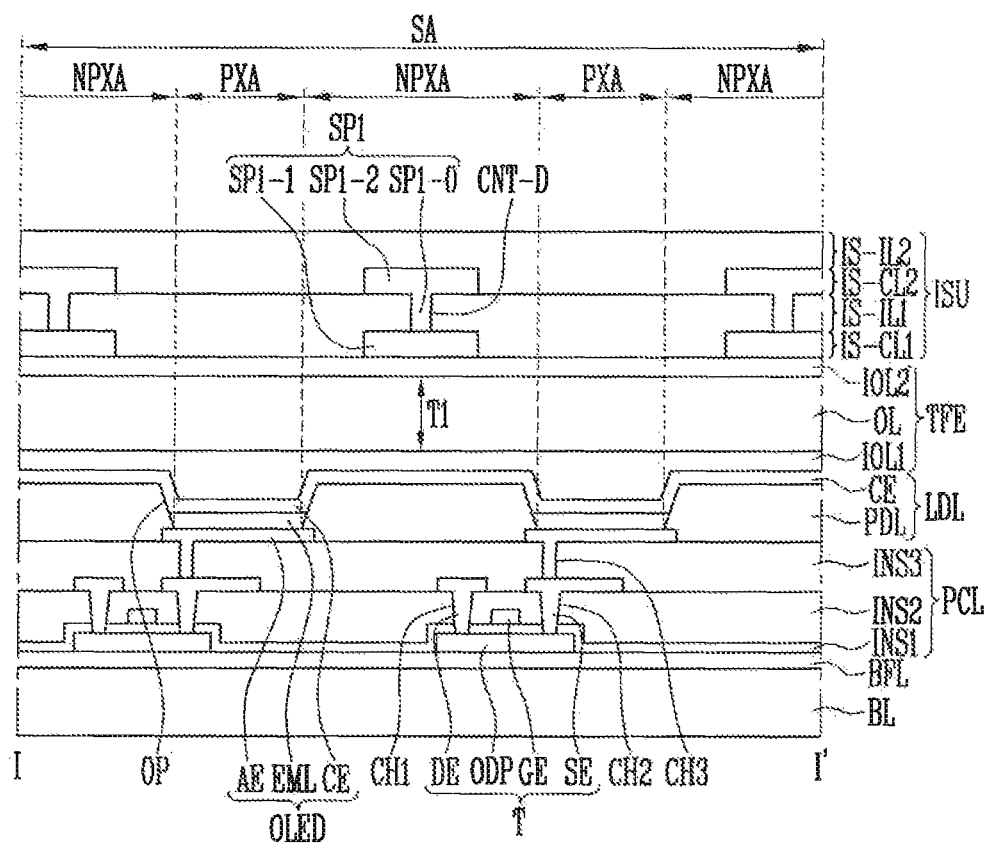
FIG. 5 is a cross-sectional view illustrating the display device taken along line I-I' of FIG. 4 according to an embodiment of the present disclosure.

FIG. 5 is a cross-sectional view illustrating an example of the display device taken along line I-I' of FIG. 4.

Referring to FIG. 5, the display device may include a base layer BL (e.g., a substrate), a buffer layer BFL, a pixel circuit layer PCL, a light emitting element layer LDL, a thin film encapsulation layer TFE, and an input sensing unit ISU.

The base layer BL may include a synthetic resin film. The synthetic resin layer may be a polyimide-based resin layer. However, embodiments of the present disclosure are not limited thereto and the base layer BL may include various materials. In addition, the base layer BL may include a glass substrate, a metal substrate, or an organic/inorganic composite material substrate.

The buffer layer BFL may be disposed on the base layer BL. The buffer layer BFL may prevent impurities from diffusing into a transistor T provided on the base layer BL, and may increase the flatness of the base layer BL. The buffer layer BFL may be provided as a single layer, or may be provided as a multilayer of at least two or more layers. The buffer layer BFL may be an inorganic insulating layer including an inorganic material. For example, the buffer layer BFL may include silicon nitride, silicon oxide, silicon oxynitride, or the like. When the buffer layer BFL is provided in multiple layers, each layer may include the same material or may include different materials. The buffer layer BFL may be omitted in some cases.

The pixel circuit layer PCL may include at least one insulating layer and a circuit element. The insulating layer may include at least one inorganic layer and at least one organic layer. The circuit element may include a signal line, a driving circuit of a pixel, and the like.

A semiconductor pattern ODP of the transistor T may be disposed on the buffer layer BFL. The semiconductor pattern ODP may be selected from amorphous silicon, polysilicon, or metal oxide semiconductor. However, embodiments of the present disclosure are not limited thereto.

A first insulating layer INS1 may be disposed on the semiconductor pattern ODP. The first insulating layer INS1 may be an inorganic insulating layer including an inorganic material. For example, the first insulating layer INS1 may include silicon nitride, silicon oxide, silicon oxynitride, or the like. However, embodiments of the present disclosure are not limited thereto.

A control electrode GE of the transistor T may be disposed on the first insulating layer INS1. The control electrode GE may be manufactured by the same photolithography process as the scan lines (GL of FIG. 2).

A second insulating layer INS2 covering the control electrode GE may be disposed on the first insulating layer INS1. The second insulating layer INS2 may be an inorganic insulating layer including an inorganic material. For example, the second insulating layer INS2 may include silicon nitride, silicon oxide, silicon oxynitride, or the like. However, embodiments of the present disclosure are not limited thereto.

A first transistor electrode DE (e.g., a drain electrode) and a second transistor electrode SE (e.g., a source electrode) of the transistor T may be disposed on the second insulating layer INS2.

The first transistor electrode DE and the second transistor electrode SE may be connected to the semiconductor pattern ODP through a first through hole CH1 and a second through hole CH2 passing through the first insulating layer INS1 and the second insulating layer INS2. However, embodiments of the present disclosure are not limited thereto. For example, in an embodiment of the present disclosure, the transistor T may be modified to have a bottom gate structure.

A third insulating layer INS3 covering the first transistor electrode DE and the second transistor electrode SE may be disposed on the second insulating layer INS2. The third insulating layer INS3 may provide a flat surface. The third insulating layer INS3 may include an organic film such as acryl resin, epoxy resin, phenolic resin, polyamide resin, polyimide resin, and the like. However, embodiments of the present disclosure are not limited thereto.

A light emitting element layer LDL may be disposed on the third insulating layer INS3. The light emitting element layer LDL may include a pixel defining layer PDL and a light emitting element OLED.

The pixel defining layer PDL may include an organic material. A first electrode AE may be disposed on the third insulating layer INS3. The first electrode AE may be connected to the second transistor electrode SE through a third through hole CH3 passing through the third insulating layer INS3. The pixel defining layer PDL may include an opening OP, and the opening OP may define the emission areas PXA-R, PXA-G, and PXA-B. The opening OP of the pixel defining layer PDL may expose at least a portion of the first electrode AE. For example, in an embodiment, the pixel defining layer PDL may cover lateral edges of the first electrode AE and the opening OP may expose a central portion of the first electrode AE. However, embodiments of the present disclosure are not limited thereto. For example, in an embodiment the pixel defining layer PDL may be omitted.

The pixel (PX of FIG. 2) may be disposed in the display area DP-DA. The display area DP-DA may include an emission area PXA and a non-emission area NPXA adjacent to the emission area PXA. The non-emission area NPXA may surround the emission area PXA (e.g., in the first direction DR1 and/or the second direction DR2). The emission area PXA may be defined to correspond to a partial area of the first electrode AE exposed by the opening OP. The non-emission area NPXA may be defined to correspond to the pixel defining layer PDL.

The light emitting element OLED may include a first electrode AE connected to the second transistor electrode SE, an emission layer EML disposed on the first electrode AE, and a second electrode CE disposed on the emission layer EML. For example, the light emitting element OLED may be an organic LED.

One of the first electrode AE and the second electrode CE may be an anode electrode, and the other may be a cathode electrode. For example, the first electrode AE may be an anode electrode, and the second electrode CE may be a cathode electrode.

At least one of the first electrode AE and the second electrode CE may be a transmissive electrode. For example, in an embodiment in which the light emitting element OLED is a top emission type organic light emitting element, the first electrode AE may be a reflective electrode and the second electrode CE may be a transmissive electrode. However, embodiments of the present disclosure are not limited thereto. For example, in an embodiment in which the light emitting element OLED is a bottom emission type organic light emitting element, the first electrode AE may be a transmissive electrode and the second electrode CE may be a reflective electrode. In an embodiment in which the light emitting element OLED is a double-sided emission type organic light emitting element, both the first electrode AE and the second electrode CE may be transmissive electrodes. An embodiment in which the light emitting element OLED is a top emission type organic light emitting element and the first electrode AE is an anode will be described as an example for convenience of explanation.

In each pixel area, the first electrode AE may be disposed on the third insulating layer INS3. The first electrode AE may include a reflective film capable of reflecting light, and a transparent conductive film disposed above or below the reflective film. At least one of the transparent conductive film and the reflective film may be connected to the second transistor electrode SE.

The reflective film may include a material capable of reflecting light. For example, in an embodiment, the reflective film may include at least one compound selected from aluminum (Al), silver (Ag), chromium (Cr), molybdenum (Mo), platinum (Pt), nickel (Ni), and any alloy thereof. However, embodiments of the present disclosure are not limited thereto.

The transparent conductive film may include a transparent conductive oxide. For example, in an embodiment, the transparent conductive film may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The emission layer EML may be disposed on the surface of the first electrode AE exposed by the opening OP. The emission layer EML may have a multilayer thin film structure including at least a light generation layer (LGL). For example, in an embodiment, the emission layer EML may include a hole injection layer (HIL) for injecting holes, a hole transport layer (HTL) that has excellent hole transport properties and suppresses the movement of electrons that are combined in the light generation layer to increase the opportunity of hole and electron recombination, a light generation layer for emitting light by the recombination of the injected electrons and holes, a hole blocking layer (HBL) for suppressing the movement of holes that are not combined to the light generation layer, an electron transport layer (ETL) for smoothly transporting electrons to the light generation layer, and an electron injection layer (EIL) for injecting electrons. However, embodiments of the present disclosure are not limited thereto.

The color of light generated in the light generation layer may be one of red, green, blue, and white. However, embodiments of the present disclosure are not limited thereto. For example, the color of light generated in the light generation layer of the emission layer EML may be one of magenta, cyan, and yellow.

In an embodiment, the hole injection layer, the hole transport layer, the hole blocking layer, the electron transport layer, and the electron injection layer may be a common layer connected in pixel areas adjacent to each other.

The second electrode CE may be disposed on the emission layer EML. The second electrode CE may be a transflective film. For example, the second electrode CE may be a thin metal layer having a thickness sufficient to transmit light. The second electrode CE may transmit a portion of the light generated by the light generation layer and reflect the remaining portion of the light generated by the light generation layer.

In an embodiment, the second electrode CE may include a material having a lower work function than that of the transparent conductive layer. For example, the second electrode CE may include at least one compound selected from molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and any alloy thereof. However, embodiments of the present disclosure are not limited thereto.

A portion of light emitted from the emission layer EML may not pass through the second electrode CE, and light reflected from the second electrode CE may be reflected back by the reflective film. For example, light emitted from the emission layer EML may resonate between the reflective film and the second electrode CE. Light extraction efficiency of the light emitting element OLED may be increased by resonance of light.

The distance between the reflective film and the second electrode CE may be different according to the color of light generated in the light generation layer. For example, the distance between the reflective film and the second electrode CE may be adjusted to match the resonance distance according to the color of the light generated in the light generation layer.

The thin film encapsulation layer TFE may be disposed on the second electrode CE. In an embodiment, the thin film encapsulation layer TFE may be commonly disposed on the pixels PX. The thin film encapsulation layer TFE may directly cover the second electrode CE. In an embodiment, a capping layer covering the second electrode CE may be further disposed between the thin film encapsulation layer TFE and the second electrode CE. In this embodiment, the thin film encapsulation layer TFE may directly cover the capping layer.

In an embodiment, the thin film encapsulation layer TFE may include a first inorganic encapsulation film IOL1, an organic encapsulation film OL, and a second inorganic encapsulation film IOL2, which are sequentially stacked on the second electrode CE. The first and second inorganic encapsulation films IOL1, IOL2 may include an inorganic insulating material such as polysiloxane, silicon nitride, silicon oxide, or silicon oxynitride. The organic encapsulation film OL may include an organic insulating material such as a polyacrylic compound, a polyimide compound, a fluorine-based carbon compound such as Teflon, or a benzocyclobutene compound. However, embodiments of the present disclosure are not limited thereto. Additionally, the numbers of the organic encapsulation films and inorganic encapsulation films of the thin film encapsulation layer TFE may vary.

A thickness T1 of the thin film encapsulation film TFE (e.g., the encapsulation organic film OL) may be adjusted so that noise generated by the components of the light emitting element layer LDL (e.g., the display panel) does not affect the input sensing unit ISU. However, as the display device DD becomes thinner, the thickness T1 of the thin film encapsulation layer TFE decreases (for example, the thickness T1 is about 10 µm or less), and noise generated by the components of the light emitting element layer LDL may affect the input sensing unit ISU.

The input sensing unit ISU may be disposed on the thin film encapsulation layer TFE. The input sensing unit ISU may include a first conductive layer IS-CL1, a fourth insulating layer IS-IL1, a second conductive layer IS-CL2, and a fifth insulating layer IS-IL2. Each of the first conductive layer IS-CL1 and the second conductive layer IS-CL2 may have a single-layer structure or a multi-layer structure.

In an embodiment, the single-layered conductive layer may include a metal layer or a transparent conductive layer. The metal layer may include molybdenum, silver, titanium, copper, aluminum, and any alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as PEDOT, metal nanowires, graphene, and the like. However, embodiments of the present disclosure are not limited thereto.

The multi-layered conductive layer may include multi-layered metal layers. The multi-layered metal layers may have, for example, a three-layer structure of titanium/aluminum/titanium. The multi-layered conductive layer may include at least one metal layer and at least one transparent conductive layer.

Each of the first conductive layer IS-CL1 and the second conductive layer IS-CL2 may include a plurality of patterns. Hereinafter, the first conductive layer IS-CL1 may include first conductive patterns, and the second conductive layer IS-CL2 may include second conductive patterns. Each of the first conductive patterns and the second conductive patterns may include the sensing electrodes and signal lines described with reference to FIG. 3.

Each of the fourth insulating layer IS-IL1 and the fifth insulating layer IS-IL2 may have a single-layer or multi-layer structure. Each of the fourth insulating layer IS-IL1 and the fifth insulating layer IS-IL2 may include an inorganic material, an organic material, or a composite material.

At least one of the fourth insulating layer IS-IL1 and the fifth insulating layer IS-IL2 may include an inorganic film. In an embodiment, the inorganic film may include at least one compound selected from aluminum oxide, titanium oxide, silicon oxide, silicon oxynitride, zirconium oxide, and hafnium oxide.

At least one of the fourth insulating layer IS-IL1 and the fifth insulating layer IS-IL2 may include an organic film. The organic film may include at least one compound selected from acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin. However, embodiments of the present disclosure are not limited thereto.

Referring to FIGS. 3 to 5, the first sensor units SP1 of the first sensing electrodes IE1-1 to IE1-5 may include a mesh-shaped metal layer of two layers including a first mesh pattern SP1-1 and a second mesh pattern SP1-2. For example, the second mesh pattern SP1-2 may be disposed on the first mesh pattern SP1-1, and a fourth insulating layer IS-IL1 may be disposed between the second mesh pattern SP1-2 and the first mesh pattern SP1-1. A connection contact hole CNT-D is formed in the fourth insulating layer IS-IL1 and a contact portion SP1-0 is formed in the connection contact hole CNT-D, so that the first mesh pattern SP1-1 and the second mesh pattern SP1-2 are electrically connected to each other. The contact portion SP1-0 may include a conductive material. For example, the contact portion SP1-D may include the same material as the first mesh pattern SP1-1 or the second mesh pattern SP1-2 for process convenience. However, embodiments of the present disclosure are not limited thereto. For example in an embodiment, the contact portion SP1-0 may include a material having higher electrical conductivity than the first mesh pattern SP1-1 or the second mesh pattern SP1-2.

A fifth insulating layer IS-IL2 may be disposed on the second mesh pattern SP1-2. The fifth insulating layer IS-IL2 may completely cover the second mesh pattern SP1-2 and function as a planarization layer.

In an embodiment, the second sensor units SP2 of the second sensing electrodes IE2-1 to IE2-4 may also include a mesh pattern of two layers, similarly to the first sensor units SP1 of the first sensing electrodes IE1-1 to IE1-4. The mesh pattern of the two layers is disposed with the fourth insulating layer IS-IL1 therebetween, and may be electrically connected by a contact portion through the connection contact hole CNT-D formed in the fourth insulating layer IS-IL1.

However, embodiments of the present disclosure are not limited thereto. For example, in an embodiment the sensing electrode may include a mesh pattern of one layer.

Figure 6A:
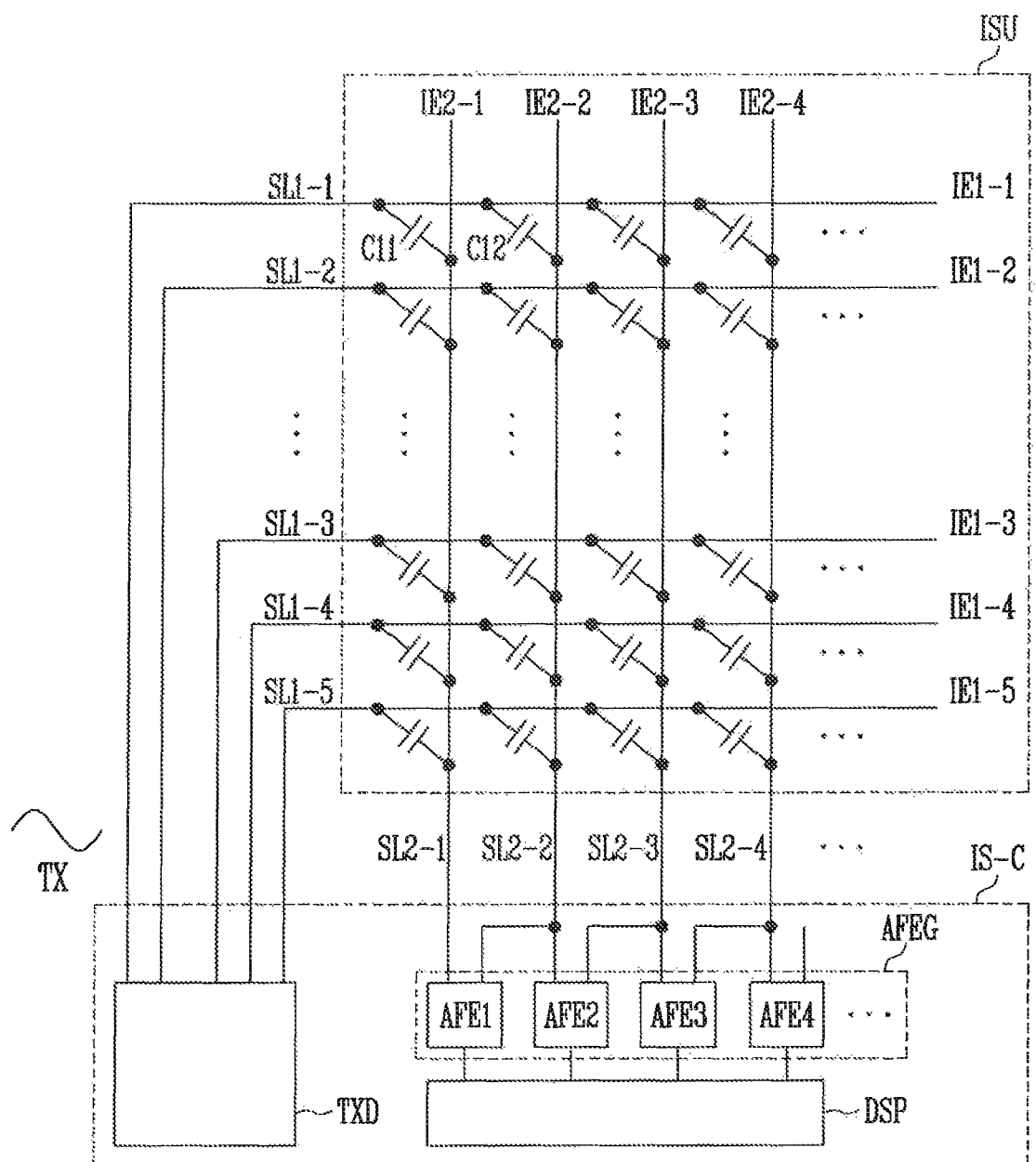
FIGS. 6A and 6B are block diagrams illustrating an input sensing unit and an input sensing circuit included in the display device of FIG. 1 according to an embodiment of the present disclosure.
Figure 6B:
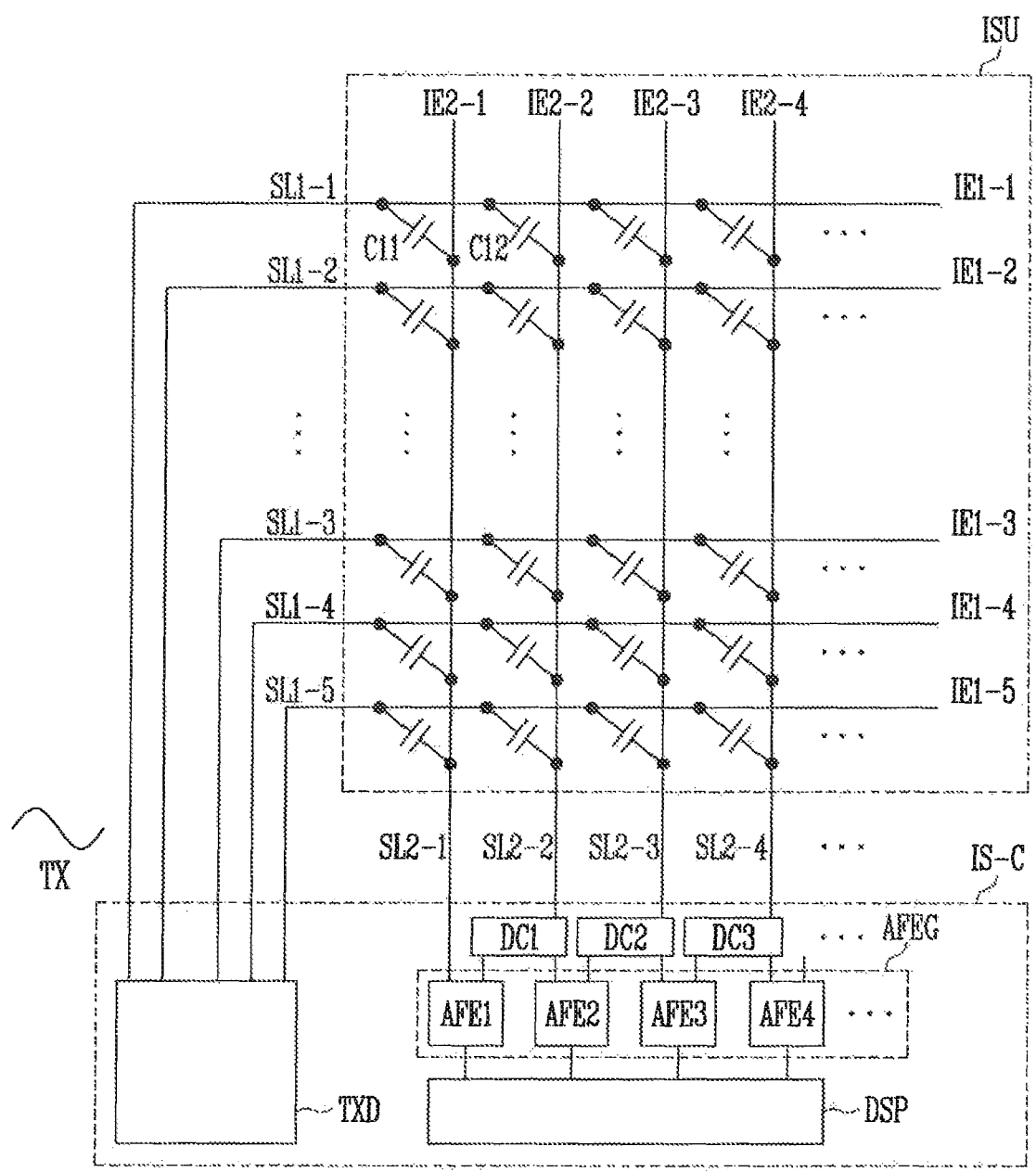

FIGS. 6A and 6B are block diagrams illustrating an example of the input sensing unit and the input sensing circuit included in the display device of FIG. 1. The input sensing unit and the input sensing circuit may constitute one input sensing device.

Referring to FIGS. 3, 6A, and 6B, the first sensing electrodes IE1-1 to IE1-5, the second sensing electrodes IE2-1 to IE2-4, the first signal lines SL1-1 to SL1-5, and the second signal lines SL2-1 to SL2-4 have been described with reference to FIG. 3, and thus redundant descriptions thereof may not be repeated for convenience of explanation.

The input sensing circuit IS-C may include a driving signal generator TXD, an analog front-end group AFEG, and a signal processor DSP. In an embodiment, the analog front-end group AFEG may include first to fourth analog front-ends AFE1 to AFE4. However, embodiments of the present disclosure are not limited thereto and the number of the analog front-ends may vary.

The driving signal generator TXD may generate a driving signal TX (or a touch driving signal) and provide the driving signal TX to the first sensing electrodes IE1-1 to IE1-5. The driving signal generator TXD may be implemented as an oscillator. The driving signal TX may include an AC voltage of a sine wave or a square wave.

In some embodiments, the driving signal TX may include a sinusoidal wave such as a sine wave or a cosine wave. The level change of the sinusoidal wave according to time appears in the form of a sinusoidal curve or a cosine curve, and appears more gently than the level change of a square wave. In an embodiment in which the driving signal TX has a square wave, the level change is relatively fast. Therefore, it may be easy to increase the frequency of the driving signal TX. However, since sensing signals according to the driving signal TX have a different waveform from the driving signal TX due to resistance-capacitance (RC) delay, it may not be easy to remove noise from the sensing signal. For example, by comparing the sensing signal with the corresponding driving signal, a portion in which the level change of the sensing signal is different from the level change of the driving signal is extracted and removed as noise. In an embodiment in which the driving signal is a square wave, the level of the sensed signal may be gently changed or distorted with a tangent slope of less than or equal to a specific value due to RC delay (e.g., charging/discharging of capacitance) (e.g., the waveform of the sensing signal is different from the waveform of the driving signal). Even due to noise, the level change of the sensing signal may appear differently from the level change of the driving signal. It may not be easy to distinguish whether the level change of the sensing signal is due to only the RC delay or due to RC and noise. On the other hand, when the driving signal TX includes a sinusoidal wave, sensing signals according to the driving signals have a sinusoidal wave identical to or similar to the driving signals even if RC delay occurs. Therefore, it is possible to easily remove noise from the sensing signals. Even when RC delay occurs, the level change of the driving signal of the sinusoidal wave is gentle. Therefore, only the phase of the sensing signal is different from the phase of the driving signal, and the waveform of the sensing signal may be substantially the same as the waveform of the driving signal. Therefore, a portion in which the level change of the sensing signal appears differently from the level change of the driving signal may be determined to be due to noise without considering RC delay. Therefore, noise may be easily removed.

In an embodiment, the driving signal TX provided to the first sensing electrodes IE1-1 to IE1-5 may have the same waveform and phase, and may be simultaneously provided to the first sensing electrodes IE1-1 to IE1-5. For example, the driving signal TX (e.g., the parallel driving signal) may be provided to the first sensing electrodes IE1-1 to IE1-5 in a parallel driving manner. However, embodiments of the present disclosure are not limited thereto. For example, in an embodiment the driving signal TX may be sequentially provided to the first sensing electrodes IE1-1 to IE1-5.

In some embodiments, at least some driving signals provided to the first sensing electrodes IE1-1 to IE1-5 may have different waveforms (e.g., different frequencies or periods). The driving signals may be simultaneously or sequentially provided to the first sensing electrodes IE1-1 to IE1-5.

For example, since the "first" first sensing electrode IE1-1 (e.g., the first driving electrode) may be spaced further apart from the input sensing circuit IS-C than the "fifth" first sensing electrode IE1-5 (e.g., the fifth driving electrode), the RC delay of the first driving signal (and the corresponding first sensing signal) provided to the "first" first sensing electrode IE1-1 is greater than the RC delay of the second driving signal (and the corresponding second sensing signal) provided to the "fifth" first sensing electrode IE1-5. In an embodiment in which the high-frequency first driving signal is applied to the "first" first sensing electrode IE1-1, the sensing signal may not follow the driving signal due to a relatively large RC delay, and the sensitivity of the sensing signal may be reduced. Therefore, the first driving signal provided to the "first" first sensing electrode IE1-1 may have a relatively low frequency. On the other hand, the second driving signal provided to the "fifth" first sensing electrode IE1-5 may also have a low frequency. In this embodiment, since the sensing time may be increased, it may not be suitable for driving the input sensing unit ISU to have a large area. In an embodiment, the second driving signal provided to the "fifth" first sensing electrode IE1-5 may have a relatively high frequency to shorten the sensing time.

In an embodiment, the driving signal generator TXD may generate the driving signal TX synchronized with the vertical synchronization signal (e.g., the vertical synchronization signal provided from the application processor as described with reference to FIG. 2). For example, the driving signal generator TXD may generate the driving signal TX by avoiding the pulse of the vertical synchronization signal, may not provide the driving signal TX to the first sensing electrodes IE1-1 to IE1-5 in a period in which the vertical synchronization signal has a pulse (or cut off the supply of the driving signal TX), and may provide the driving signal TX of a constant voltage (e.g., a reference voltage). The reference voltage may have 0, a positive voltage level, or a negative voltage level, and the voltage level of the reference voltage is not particularly limited. The driving signal TX changes in a period between the pulses of the vertical synchronization signal and may have, for example, an AC voltage. On the other hand, the driving signal TX may be asynchronous with the horizontal synchronization signal.

For reference, since the period of the horizontal synchronization signal (e.g., the horizontal synchronization signal provided from the application processor, as described with reference to FIG. 2) is relatively short, noise (e.g., relatively high-frequency noise) caused by the horizontal synchronization signal may be effectively filtered through the analog front-ends AFE1 to AFE4. However, since the period of the vertical synchronization signal is relatively long, noise caused by the vertical synchronization signal (e.g., relatively low-frequency noise) may not be filtered through the analog front-ends AFE1 to AFE4. Therefore, the driving signal generator TXD may increase sensing sensitivity by generating the driving signal TX synchronized with the vertical synchronization signal, such as by the driving signal TX avoiding the pulse of the vertical synchronization signal.

Sensing capacitors may be formed between the first sensing electrodes IE1- to IE1-5 and the second sensing electrodes IE2-1 to IE2-4. For example, a (1-1)-th sensing capacitor C11 may be formed between the "first" first sensing electrode IE1-1 (e.g., the first driving electrode) and the "first" second sensing electrode IE2-1 (e.g., the first sensing electrode). When the driving signal TX is applied to the "first" first sensing electrode IE1-1, the sensing signal corresponding to the capacitance of the (1-1)-th sensing capacitor C11 may be output through the "first" second sensing electrode IE2-1.

In an embodiment, each of the analog front-ends AFE1 to AFE4 is connected to two adjacent second sensing electrodes (e.g., the second signal lines) among the second sensing electrodes IE2-1 to IE2-4, and may output a sensing value (e.g., a differential output value) corresponding to the capacitance difference of the sensing capacitors. For example, the first analog front-end AFE1 may be connected to the "first" second sensing electrode IE2-1 (e.g., the first sensing electrode) and the "second" second sensing electrode IE2-2 (e.g., the second sensing electrode), and may output a first sensing value corresponding to the difference between the capacitance of the sensing capacitor formed in the "first" second sensing electrode IE2-1 (e.g., the capacitance of the (1-1)-th sensing capacitor C11) and the capacitance of the sensing capacitor formed in the "second" second sensing electrode IE2-2 (e.g., the capacitance of the (1-2)-th sensing capacitor C12). Similarly, the second analog front-end AFE2 may be connected to the "second" second sensing electrode IE2-2 (e.g., the second sensing electrode) and the "third" third sensing electrode IE2-3 (e.g., the third sensing electrode), and may output a second sensing value corresponding to the difference between the capacitance of the sensing capacitor formed in the "second" second sensing electrode IE2-2 and the capacitance of the sensing capacitor formed in the "third" third sensing electrode IE2-3. Hereinafter, the capacitances of the sensing capacitors formed between the first sensing electrodes IE1-1 to IE1-5 and the second sensing electrodes IE2-1 to IE2-4 may be referred to as sensing capacitances of the second sensing electrodes IE2-1 to IE2-4 based on the second sensing electrodes IE2-1 to IE2-4.

When a touch event occurs in a specific region of the input sensing unit ISU, the capacitance between the first sensing electrode and the second sensing electrode located in the corresponding region may change. For example, when a touch event occurs in a region where the "first" first sensing electrode IE1-1 and the "first" second sensing electrode IE2-4 intersect with each other, the capacitance of the (1-1)-th sensing capacitor C11 between the "first" first sensing electrode IE1-1 and the "first" second sensing electrode IE2-1 may change. On the other hand, the capacitance of the (1-2)-th sensing capacitor C12 between the "first" first sensing electrode IE1-1 and the "second" second sensing electrode IE2-2 may not change. Therefore, the first sensing value output through the first analog front-end AFE1 may change, and the position where the touch occurs may be detected based on the changed first sensing value.

In an embodiment, each of the analog front-ends AFE1 to AFE4 may be configured to include an amplifier, a filter, an analog-to-digital converter, and the like. A detailed configuration of each of the analog front-ends AFE1 to AFE4 will be described with reference to FIGS. 8A to 9E.

In an embodiment, each of the analog front-ends AFE1 to AFE4 may be implemented as a fully differential analog front-end. For example, in an embodiment in which the first analog front-end AFE1 includes a charge amplifier, a chopping circuit, filters, and an analog-to-digital converter, which are sequentially connected, the first analog front-end AFE1 may use the charge amplifier to differentially amplify a first reception signal corresponding to the sensing capacitance of the "first" second sensing electrode IE2-1 (e.g., the first sensing electrode) and a second reception signal corresponding to the sensing capacitance of the "second" second sensing electrode IE2-2 (e.g., the second sensing electrode) and output two differential signals. The first analog front-end AFE1 may use the chopping circuit and the filters to demodulate and filter the two differential signals and provide the filtered two differential signals to the analog-to-digital converter. In this embodiment, the analog-to-digital converter may output the first sensing value based on the difference between the two filtered differential signals. For example, the fully differential analog front-end may be an analog front-end that converts, maintains, and outputs the reception signals in an analog form provided from the sensing electrodes into a plurality of differential signals up to the front-end of the analog-to-digital converter (e.g., until the analog signal is converted into the digital signal). For reference, the charge amplifier and the filters are configured to include an amplifier. In a low voltage system, the voltage range of the charge amplifier and the filters is limited. A typical analog front-end may not fully utilize the dynamic range of the analog-to-digital converter. Therefore, since the fully differential analog front-end provides two differential signals to the analog-to-digital converter, it is possible to double the dynamic range of the analog-to-digital converter or the application range of the dynamic range and to increase the sensing sensitivity.

As such, the input sensing circuit IS-C may differentially amplify adjacent sensing signals and remove noise (e.g., noise caused by the horizontal synchronization signal) by using the fully differential analog front-end. Therefore, a decrease in bandwidth of the driving signal and a decrease in sensing sensitivity may be prevented.

However, embodiments of the present disclosure are not limited thereto, and at least some or all of the analog front-ends AFE1 to AFE4 may be implemented as a single-ended output differential analog front-end. The charge amplifier included in the single-ended output differential analog front-end has two input terminals and one output terminal, and may amplify a value corresponding to a difference between two reception signals (e.g., the first reception signal and the second reception signal) and output one single-ended signal. In addition, since the charge amplifier outputs one signal, the chopping circuit and the filters included in the single-ended output differential analog front-end may demodulate and filter the single-ended signal, and provide the filtered signal to the analog-to-digital converter. In this embodiment, the analog-to-digital converter may output the sensing value (e.g., the first sensing value) based on the filtered signal.

The sensing values output from the analog front-ends AFE1 to AFE4 may be provided to the signal processor DSP, and the signal processor DSP may determine whether the touch occurs, based on the sensing values, or may calculate a position where the touch occurs. The signal processor DSP may be implemented in hardware including logic elements, or may be implemented in software in an integrated circuit (e.g., FPGA). An operation in which the signal processor DSP determines whether the touch occurs and calculates the position where the touch occurs will be described with reference to FIG. 10.

In an embodiment, the input sensing circuit IS-C may further include distribution circuits DC1, DC2, and DC3.

As illustrated in FIG. 6B, the distribution circuits DC1, DC2, and DC3 are disposed between at least some of the second sensing electrodes IE2-1 to IE2-4 and the analog front-ends AFE1 to AFE4, and may generate a plurality of signals having the same magnitude (e.g., the same voltage level, the same amount of current, etc.) based on each of the sensing signals provided from at least some of the second sensing electrodes IE2-1 to IE2-4, and may distribute the generated signals to the analog front-ends AFE1 to AFE4. For example, the distribution circuits DC1, DC2, and DC3 may include an amplifier, a buffer, and the like, and may amplify or mirror the sensing signals and output the amplified or mirrored sensing signals.

For example, the first distribution circuit DC1 may receive the second sensing signal provided from the "second" second sensing electrode IE2-2, and may provide the same signals as the second sensing signal or the signals having a mutually same magnitude as the second sensing signal to the first analog front-end AFE1 and the second analog front-end AFE2. For reference, in an embodiment in which the second sensing signal does not pass through the first distribution circuit DC1, the second sensing signal is simultaneously supplied to the first analog front end AFE1 and the second analog front end AFE2. Due to the relative increase in the load with respect to the second sensing signal, the magnitude (e.g., the maximum magnitude, for example, the voltage level, the amount of current, etc.) of the second sensing signal is different from the first sensing signal (e.g., the "first" first sensing electrode IE2-1). Therefore, the input sensing unit ISU may use the first distribution circuit DC1 to provide the same signals as the second sensing signal or the signals having a mutually same magnitude as the second sensing signal to the first analog front-end AFE1 and the second analog front-end AFE2.

Similarly, the second distribution circuit DC2 may receive the third sensing signal provided from the "third" third sensing electrode IE2-3, and may provide the same signals as the third sensing signal or the signals having a mutually same magnitude as the third sensing signal to the second analog front-end AFE2 and the third analog front-end AFE3. The third distribution circuit DC3 may receive the fourth sensing signal provided from the "fourth" second sensing electrode IE2-4, and may provide the same signals as the fourth sensing signal or the signals having a mutually same magnitude as the fourth sensing signal to the third analog front-end AFE3 and the fourth analog front-end AFE4.

Figure 7B:
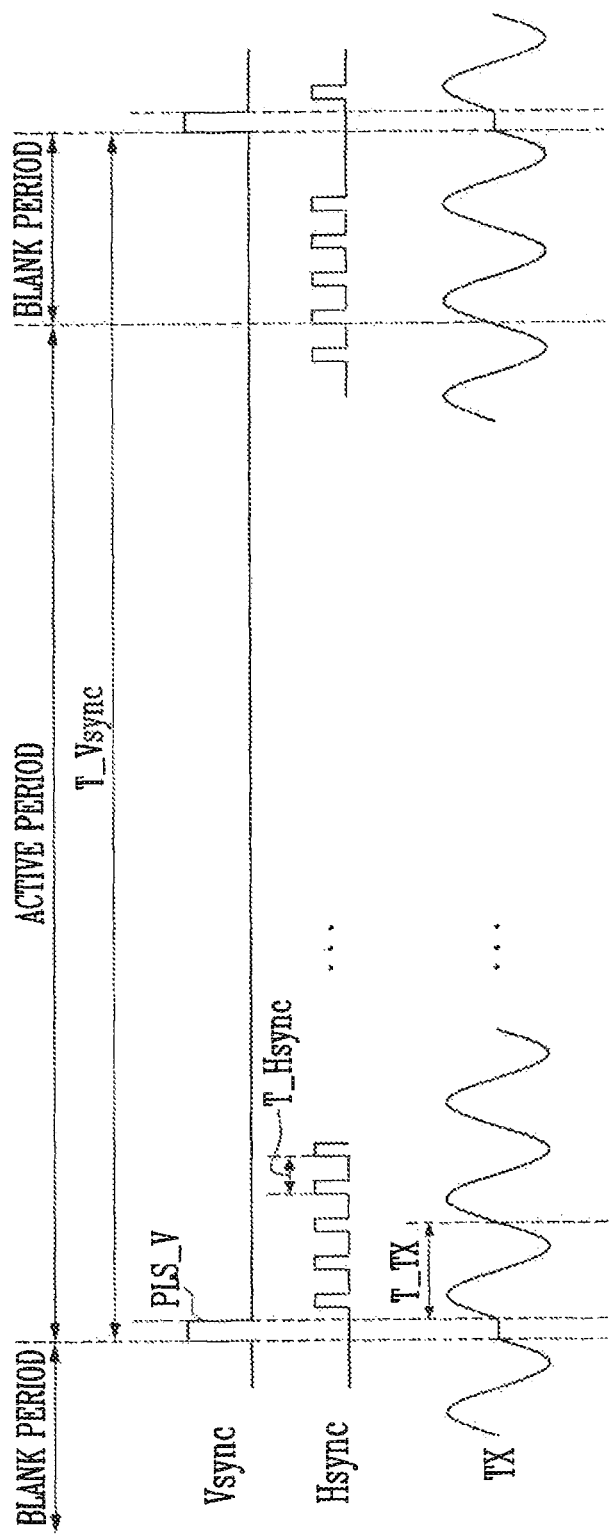

FIGS. 7A, 7B, and 7C are waveform diagrams for explaining the operation of the driving signal generator included in the input sensing circuit of FIG. 6A.

Referring to FIGS. 1, 2, 6A, 6B, 7A, 7B, and 7C, the vertical synchronization signal Vsync is provided from the outside (e.g., a host system such as an application processor) to the input sensing circuit (see IS-C of FIG. 2) and the timing control circuit TC, and defines the start of one frame. One frame may include an active period (e.g., a display period) and a blank period. In the active period, data signals may be provided to the display panel (see DP of FIG. 2), the data signals may be sequentially recorded to the pixels (see PX of FIG. 2), and the pixels PX may emit light or display an image in response to the data signals. The blank period is a period from the end of the active period in one frame to the start of the next frame (e.g., the next active period). In the blank period, data signals may not be provided to the display panel DP.

The horizontal synchronization signal Hsync may be provided to the timing control circuit TC from the outside (e.g., a host system such as an application processor), and may not be provided to the input sensing circuit IS-C. The horizontal synchronization signal Hsync may define a period in which each of the images of the horizontal line included in the image of one frame is output.

For example, in an embodiment in which the display panel DP is driven with a refresh rate of 60 Hz (e.g., the display panel DP displays 60 frame images per second), the period T_Vsync of the vertical synchronization signal Vsync may be 16.67 ms (e.g., 1/60 seconds). For example, when the display panel DP includes 2,280 lines (or 3,040 lines), the period T_Hsync of the horizontal synchronization signal Hsync may be 7.3 μs (or 5.5 μs).

For example, in an embodiment in which the display panel DP is driven with a refresh rate of 120 Hz, the period T_Vsync of the vertical synchronization signal Vsync may be 8.33 ms. The period T_Hsync of the horizontal synchronization signal Hsync may be 3.7 μs (or 2.7 μs).

In an embodiment, the driving signal TX may have a sine wave (e.g., a sine waveform) or a square wave (e.g., a square waveform). As illustrated in FIG. 7A, the driving signal TX may have a sine wave. However, embodiments of the present disclosure are not limited thereto.

In a period in which a pulse PLS_V of the vertical synchronization signal Vsync is generated, the driving signal TX may have a reference value (e.g., a DC voltage). As described with reference to FIG. 6A, in the period in which the pulse PLS_V of the vertical synchronization signal Vsync is generated, the driving signal generator TXD may not output the driving signal TX or may output the driving signal TX having a specific value (e.g., 0 V).

Immediately before the rising edge of the vertical sync signal Vsync occurs (e.g., before the pulse PLS_V is generated), the driving signal TX may have a reference value, and after a time point at which the falling edge of the vertical synchronization signal Vsync occurs (e.g., after a time point at which the pulse PLS_V ends), the driving signal TX may change to a sine wave.

The driving signal TX may be asynchronous with the horizontal synchronization signal Hsync. For example, the driving signal TX may be freely set without considering the horizontal synchronization signal Hsync (e.g., a period in which the pulse of the horizontal synchronization signal Hsync is generated). For example, in the period in which the pulse of the horizontal synchronization signal Hsync is generated, the driving signal TX changes or has an AC value (e.g., an AC voltage). Even in the period in which the pulse of the horizontal synchronization signal Hsync is not generated, the driving signal TX may change. The driving signal TX changes regardless of the horizontal synchronization signal Hsync. For example, the period T_TX of the driving signal TX is 5 μs, 4 μs, and 2.9 μs (e.g., the driving signal TX has a frequency of 200 KHz, 250 KHz, and 350 kHz), and may be different from 3.7 μs (or 2.7 μs), which is the period T_Hsync of the horizontal synchronization signal Hsync, or a multiple thereof. The frequency of the driving signal TX may be less than the frequency of the horizontal synchronization signal Hsync. However, embodiments of the present disclosure not limited thereto.

The driving signal TX may change or have a sine wave even in the blank period, and may also have a sine wave in a period in which the pulse of the horizontal synchronization signal Hsync is not generated in the blank period.

On the other hand, FIG. 7A illustrates that the driving signal TX has a reference value before a predetermined time from a time point at which the rising edge of the vertical synchronization signal Vsync occurs, and the driving signal TX changes to a sine wave after a predetermined time from a time point at which the falling edge of the vertical synchronization signal Vsync occurs. However, embodiments of the present disclosure are not limited thereto and the timing of the driving signal TX with respect to the vertical synchronization signal Vsync may vary.

For example, as illustrated in FIG. 7B, the period in which the driving signal TX has the reference value may coincide with the period in which the pulse PLS_V of the vertical synchronization signal Vsync is generated, the time point at which the driving signal TX starts to have a reference value may coincide with the rising edge of the vertical sync signal Vsync, and the time point at which the driving signal TX starts to have an AC value (e.g., a start point of a sine wave) may coincide with the falling edge of the vertical synchronization signal Vsync.

In addition, although FIG. 7A illustrates that the driving signal TX has a sine wave, embodiments of the present disclosure are not limited thereto and the driving signal may have various different waveforms.

For example, as illustrated in FIG. 7C, the driving signal TX_1 may have a square wave. The period T_TX_1 of the driving signal TX_1 is the same as the period T_TX of the driving signal TX of FIG. 7A, and the pulse of the driving signal TX_1 may not be generated in the period in which the vertical synchronization signal Vsync is generated. On the other hand, the pulse of the driving signal TX_1 may be generated even in the period in which the pulse of the vertical synchronization signal Vsync is generated.

As described with reference to FIGS. 7A to 7C, the driving signal TX (and the driving signal TX_1) may be synchronized with the vertical synchronization signal Vsync, may have an AC form by avoiding the pulse PLS_V of the vertical synchronization signal Vsync, and may have a reference value in the period in which the pulse PLS_V of the vertical synchronization signal Vsync is generated. In addition, the driving signal TX (and the driving signal TX_1) may be asynchronous with the horizontal synchronization signal Hsync. Therefore, the period T_TX (or the period T_TX_1) of the driving signal TX may be set more freely regardless of the horizontal synchronization signal Hsync. For example, when the period T_TX of the driving signal TX is set to be relatively large, the touch sensing time may be more sufficiently secured in response to the period T_TX of the driving signal TX, and sensing sensitivity may be increased.

Figure 8A:
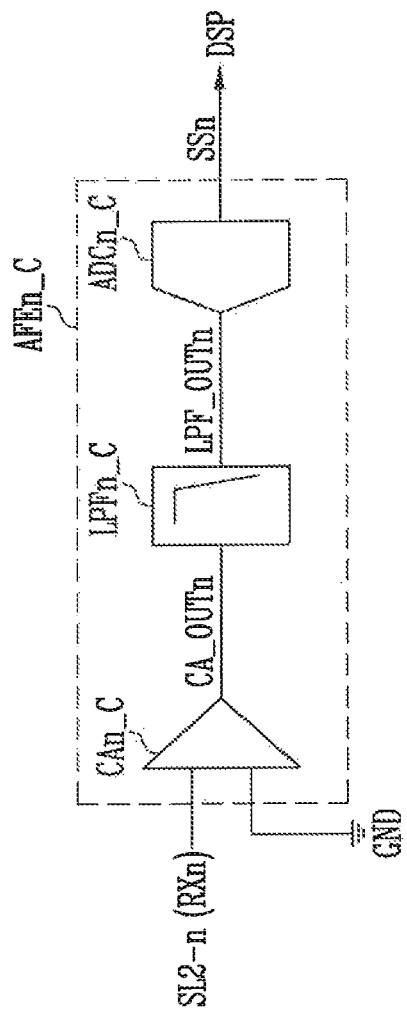
FIG. 8A is a block diagram illustrating a comparative example of an analog front-end included in the input sensing circuit of FIG. 6A.
Figure 8B:
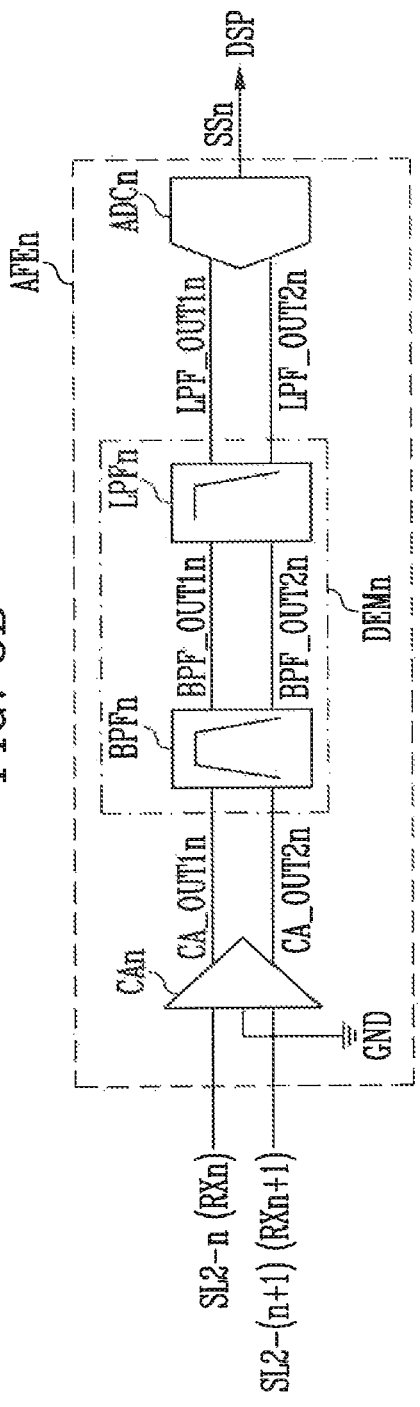
FIGS. 8B to 8D are block diagrams illustrating an analog front-end included in the input sensing circuit of FIG. 6A according to embodiments of the present disclosure.
Figure 8C:
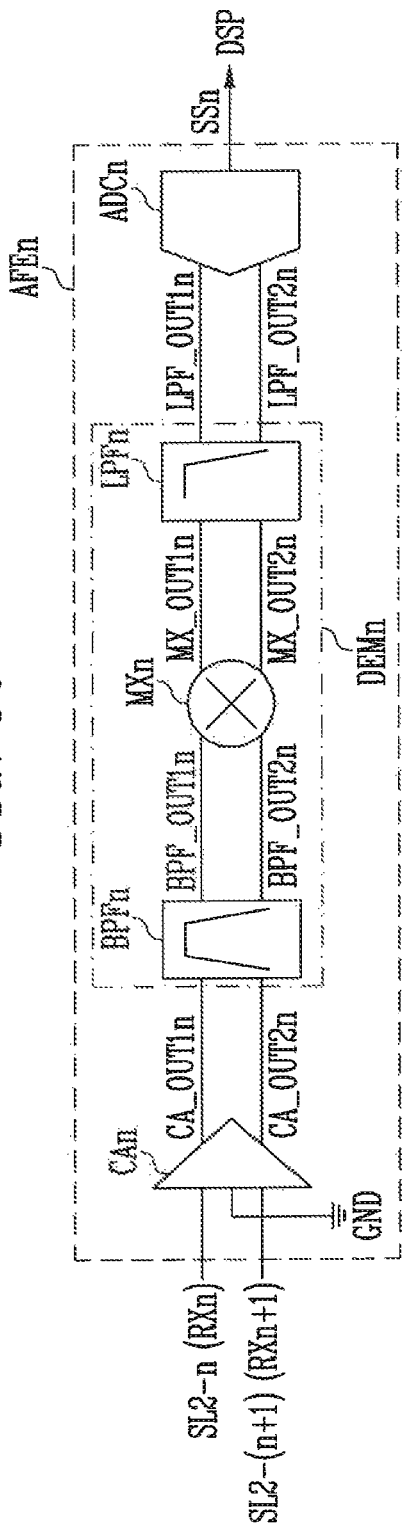
Figure 8D:
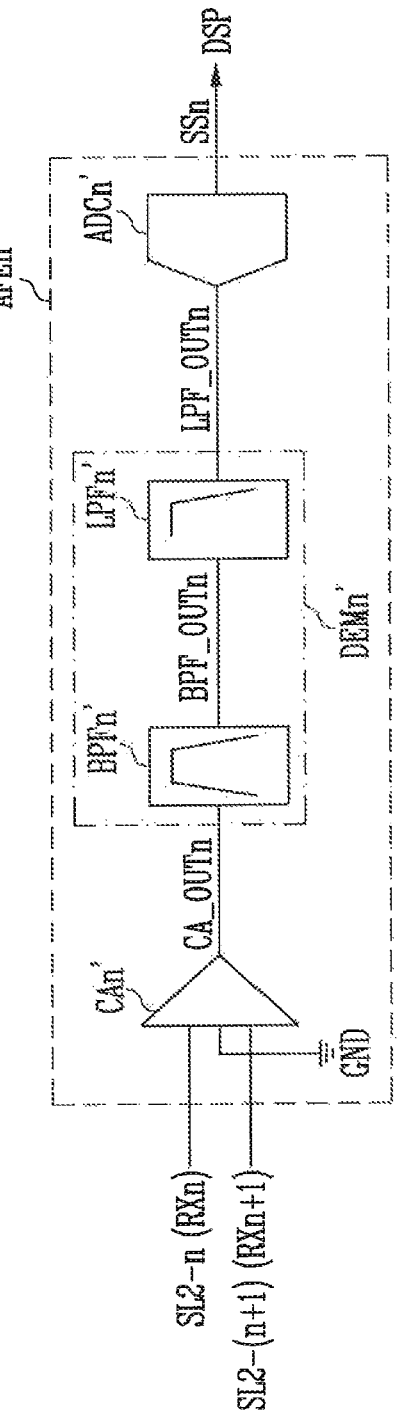

FIG. 8A is a block diagram illustrating a comparative example of the analog front-end included in the input sensing circuit of FIG. 6A. FIGS. 8B to 8D are block diagrams illustrating an example of the analog front-end included in the input sensing circuit of FIG. 6A. The analog front-ends AFE1 to AFE4 illustrated in FIG. 6A are the same or similar to each other. Therefore, in FIGS. 8A to 8D, the analog front-end AFEn (where n is a positive integer) including the analog front-ends AFE1 to AFE4 will be described.

Referring to FIGS. 6A and 8A, the analog front-end AFEn_C according to the comparative embodiment may include a charge amplifier CAn_C, a low pass filter LPFn_C, and an analog-to-digital converter ADCn_C.

The charge amplifier CAn_C may receive an n-th sensing signal RXn and a reference voltage GND (e.g., a reference signal, such as a ground voltage) provided through an n-th second signal line SL2-n (e.g., an n-th sensing line), amplify the n-th sensing signal RXn based on the reference voltage GND, and output the amplified signal CA_OUTn. In an embodiment, n may be a natural number greater than or equal to 1. For example, the charge amplifier CAn_C may receive and amplify only one sensing signal from one second signal line, instead of receiving two sensing signals from two second signal lines. In the comparative embodiment shown in FIG. 8A, when the n-th sensing signal RXn includes noise (e.g., signal attenuation, delay, etc. due to parasitic capacitance), the noise may also be amplified.

The low pass filter LPFn_C may filter noise distributed in the high frequency band of the amplified signal CA_OUTn and output the output signal LPF_OUTn (e.g., the filtered signal). However, noise in the low frequency band may not be filtered.

The analog-to-digital converter ADCn_C may receive the output signal LPF_OUTn, convert the analog output signal LPF_OUTn into a digital sensing value SSn, and provide the sensing value SSn to the signal processor DSP. The sensing value SSn may correspond to the sensing capacitance of the n-th second sensing electrode connected to the n-th second signal line SL2-n (e.g., the n-th sensing line).

On the other hand, in embodiments in which the display device (see DD of FIG. 1) (and the input sensing unit ISU) becomes thinner and larger, in addition to the parasitic capacitance for the second sensing electrode, such as the sensing capacitor formed between the first sensing electrode and the second sensing electrode, the capacitance of the parasitic capacitor formed by overlapping the second sensing electrode with other elements may increase, and a ratio of the sensing capacitance (e.g., the amount of change in the sensing capacitance) of the second sensing electrode to the parasitic capacitance may decrease. For example, a signal-to-noise ratio (SNR) may decrease, and sensing sensitivity may decrease.

Therefore, since the analog front-ends AFEn and AFEn' according to an embodiment of the present disclosure, which will be described below with reference to FIGS. 8B to 8D, are implemented as a differential circuit, it is possible to remove noise included in the sensing signal more effectively, increase the dynamic range (e.g., the dynamic range utilization range) of the analog-to-digital converter, and increase the sensing sensitivity.

Referring to FIGS. 8B and 8C, the analog front-end AFEn may include a charge amplifier CAn, a band pass filter BPFn, a low pass filter LPFn, and an analog-to-digital converter ADCn. In addition, the analog front-end AFEn may further include a mixer MXn.

The charge amplifier CAn may receive an n-th sensing signal RXn provided through an n-th second signal line SL2-n (e.g., an n-th sensing line) connected to a first input terminal and an (n+1)-th sensing signal RXn+1 provided through an (n+1)-th second signal line SL2-(n+1) (e.g., an (n+1)-th sensing line) connected to a second input terminal, differentially amplify the n-th sensing signal RXn and the (n+1)-th sensing signal RXn+1, and output a complementary first differential signal CA_OUT1n (e.g., a first amplified signal) and a second differential signal CA_OUT2n (e.g., a second amplified signal) through the first and second output terminals.

In an embodiment, the charge amplifier CAn may be implemented as a fully differential amplifier. The fully differential amplifier may be defined as a differential amplifier that outputs two differential signals (e.g., complementary signals) by differentiating two input signals. The charge amplifier CAn implemented as the fully differential amplifier may maximize the magnitude of the sensing signals in relation to the analog-to-digital converter ADCn (e.g., the differential analog-to-digital converter that outputs a digital value by differentiating two analog signals).

The reference voltage GND may be provided to the charge amplifier CAn, and the reference voltage GND may be used as the driving voltage of the charge amplifier CAn. A detailed configuration of the charge amplifier CAn will be described with reference to FIGS. 9A to 9C.

The band pass filter BPFn may select only signals of a specific frequency band of each of the first differential signal CA_OUT1n and the second differential signal CA_OUT2n received from the first and second input terminals, and may output the first filtered signal BPF_OUT1n and the second filtered signal BPF_OUT2n through the first and second output terminals. The operation of the band pass filter BPFn will be described with reference to FIG. 9E together with the operations of the low pass filter LPFn and the mixer MXn.

The band pass filter BPFn may selectively amplify the first differential signal CA_OUT1n and output the first filtered signal BPF_OUT1n, and may selectively amplify the second differential signal CA_OUT2n and output the second filtered signal BPF_OUT2n. For example, the band pass filter BPFn may selectively amplify the first differential signal CA_OUT1n applied to the negative input terminal of the fully differential amplifier and output the first filtered signal BPF_OUT1n through the positive output terminal of the fully differential amplifier output, and may selectively amplify the second differential signal CA_OUT2n applied to the second input terminal of the fully differential amplifier and output the second filtered signal BPF_OUT2n through the negative output terminal of the fully differential amplifier.

In an embodiment, the second filtered signal BPF_OUT2n may have a waveform in which the first filtered signal BPF_OUT1n is inverted.

The mixer MXn may change the frequencies of the first filtered signal BPF_OUT1n and the second filtered signal BPF_OUT2n and output a first demodulated signal MX_OUT1n and a second demodulated signal MX_OUT2n. For example, the mixer MXn may demodulate the first filtered signal BPF_OUT1n and output the first demodulated signal MX_OUT1n, and may demodulate the second filtered signal BPF_OUT2n and output the second demodulated signal MX_OUT2n.

For example, the mixer MXn may be implemented as a chopping circuit (e.g., a chopper) including two input terminals and two output terminals. The mixer MXn may generate the first demodulated signal MX_OUT1n and the second demodulated signal MX_OUT2n by alternately connecting the two output terminals to the first filtered signal BPF_OUT1n and the second filtered signal BPF_OUT2n provided to the two input terminals. For example, the mixer MXn may extract the touch signal (see TS of FIG. 9E) from the first filtered signal BPF_OUT1n and the second filtered signal BPF_OUT2n. However, embodiments of the present disclosure are not limited thereto. For example, in an embodiment, the mixer MXn may be omitted.

The low pass filter LPFn may filter noise distributed in the high-frequency band of each of the first filtered signal BPF_OUT1n and the second filtered signal BPF_OUT2n received from the first and second input terminals, and output a first output signal LPF_OUT1n (e.g., a third filtered signal) and a second output signal LPF_OUT2n (e.g., a fourth filtered signal) through the first and second output terminals. On the other hand, in an embodiment in which the analog front-end AFEn includes the mixer MXn, the low pass filter LPFn may filter noise distributed in the high-frequency band of each of the first demodulated signal MX_OUT1n and the second demodulated signal MX_OUT2n, and output the first output signal LPF_OUT1n (e.g., the third filtered signal) and the second output signal LPF_OUT2n (e.g., the fourth filtered signal).

For example, the low pass filter LPFn may be implemented by including a differential amplifier (e.g., a fully differential amplifier), a resistor, and a capacitor, and may only amplify a signal of a relatively low frequency band. The low pass filter LPFn may filter the noise of the first demodulated signal MX_OUT1n and output the first output signal LPF_OUT1n, and may filter the noise of the second demodulated signal MX_OUT2n and output the second output signal LPF_OUT2n. For example, the low pass filter LPFn may filter the noise of the first demodulated signal MX_OUT1n applied to the negative input terminal of the fully differential amplifier and output the first output signal LPF_OUT1n through the positive output terminal of the fully differential amplifier output, and may filter the noise of the second demodulated signal MX_OUT2n applied to the positive terminal of the fully differential amplifier and output the second output signal LPF_OUT2n through the positive output terminal of the fully differential amplifier. In an embodiment, the second output signal LPF_OUT2n may have a polarity different from that of the first output signal LPF_OUT1n.

As such, the band pass filter BPFn, the mixer MXn, and the low pass filter LPFn may implement a demodulation circuit DEMn that performs the function of the demodulator, and may restore or extract only the signals corresponding to the driving signal TX (e.g., the first output signal LPF_OUT1n and the second output signal LPF_OUT2n) from the n-th sensing signal RXn and the (n+1)-th sensing signal RXn+1.

The analog-to-digital converter ADCn may receive the first output signal LPF_OUT1n and the second output signal LPF_OUT2n through the first and second input terminals, and may provide, to the signal processor DSP, the sensing value SSn (e.g., the differential output value) corresponding to the difference (e.g., LFP_OUT1n to LPF_OUT2n) between the first output signal LPF_OUT1n and the second output signal LPF_OUT2n. For example, the analog-to-digital converter ADCn may convert the analog first output signal LPF_OUT1n into the digital first output value, convert the analog second output signal LPF_OUT2n into the digital second output value, differentiate the first output value and the second output value, and output the sensing value SSn as a digital signal.

As described with reference to FIGS. 8B and 8C, the analog front-end AFEn may use the charge amplifier CAn, the band pass filter BPFn, the mixer MXn, and the low pass filter LPFn to remove noise (e.g., noise caused by the horizontal synchronization signal Hsync described with reference to FIG. 7A) from two input signals (e.g., the n-th sensing signal RXn and the (n+1)-th sensing signal RXn+1).

In addition, in an embodiment the analog front-end AFEn may be implemented as the fully differential circuit (e.g., the fully differential analog front-end) that maintains and outputs two differential signals, from the charge amplifier CAn to the front-end of the analog-to-digital converter ADCn (e.g., the low pass filter LPFn). Since the analog front-end AFEn provides two differential signals to the analog-to-digital converter ADCn, it is possible to double the dynamic range of the analog-to-digital converter or the application range of the dynamic range and to increase the sensing sensitivity.

However, embodiments of the present disclosure are not limited thereto, and the analog front-end AFEn may be implemented as a single-ended output differential analog front-end.

For example, referring to FIG. 8D, the analog front-end AFEn may include a charge amplifier CAn', a band pass filter BPFn', a low pass filter LPFn', and an analog-to-digital converter ADCn'.

The charge amplifier CAn' may receive an n-th sensing signal RXn provided through an n-th second signal line SL2-n (e.g., an n-th sensing line) and an (n+1)-th sensing signal RXn+1 provided through an (n+1)-th second signal line SL2-(n+1) (e.g., an (n+1)-th sensing line), differentially amplify the n-th sensing signal RXn and the (n+1)-th sensing signal RXn+1, and output a single-ended (e.g., one) differential signal CA_OUT1n (e.g., an amplified signal).

In embodiments, the charge amplifier CAn' may be implemented as a differential input to single-ended output amplifier. The differential amplifier may be defined as a differential amplifier that differentially amplifies two input signals and outputs one signal. The charge amplifier CAn' implemented as the single-ended output differential amplifier reduces power consumption in relation to the analog-to-digital converter ADCn' (e.g., the single-acting analog-to-digital converter that converts one analog signal into a digital value and outputs the digital value).

The reference voltage GND may be provided to the charge amplifier CAn', and the reference voltage GND may be used as the driving voltage of the charge amplifier CAn'. A detailed configuration of the charge amplifier CAn' will be described with reference to FIG. 9D.

On the other hand, since the charge amplifier CAn' outputs one differential signal CA_OUTn, the band pass filter BPFn' and the low pass filter LPFn' included in the demodulation circuit DEMn' may receive and filter the single-ended signal and output the single-ended signal. For example, the band pass filter BPFn' may select only a signal of a specific frequency band of the differential signal CA_OUTn and output the filtered signal BPF_OUTn, and the low pass filter LPFn' may filter the noise distributed in the high-frequency band of the filtered signal BPF_OUTn and output the output signal LPF_OUTn.

In addition, the analog-to-digital converter ADCn' may receive the output signal LPF_OUTn and provide the corresponding sensing value SSn (e.g., the differential output value) to the signal processor DSP. For example, the analog-to-digital converter ADCn' may convert the analog output signal LPF_OUTn into the digital output value and output the sensing value SSn.

As described with reference to FIG. 8D, the analog front-end AFEn' removes noise from two input signals (e.g., the n-th sensing signal RXn and the (n+1)-th sensing signal RXn+1) and is implemented as a single-ended output analog front-end. Therefore, the circuit configuration of the analog front-end AFEn' may be reduced and power consumption may be reduced.

Figure 9A:
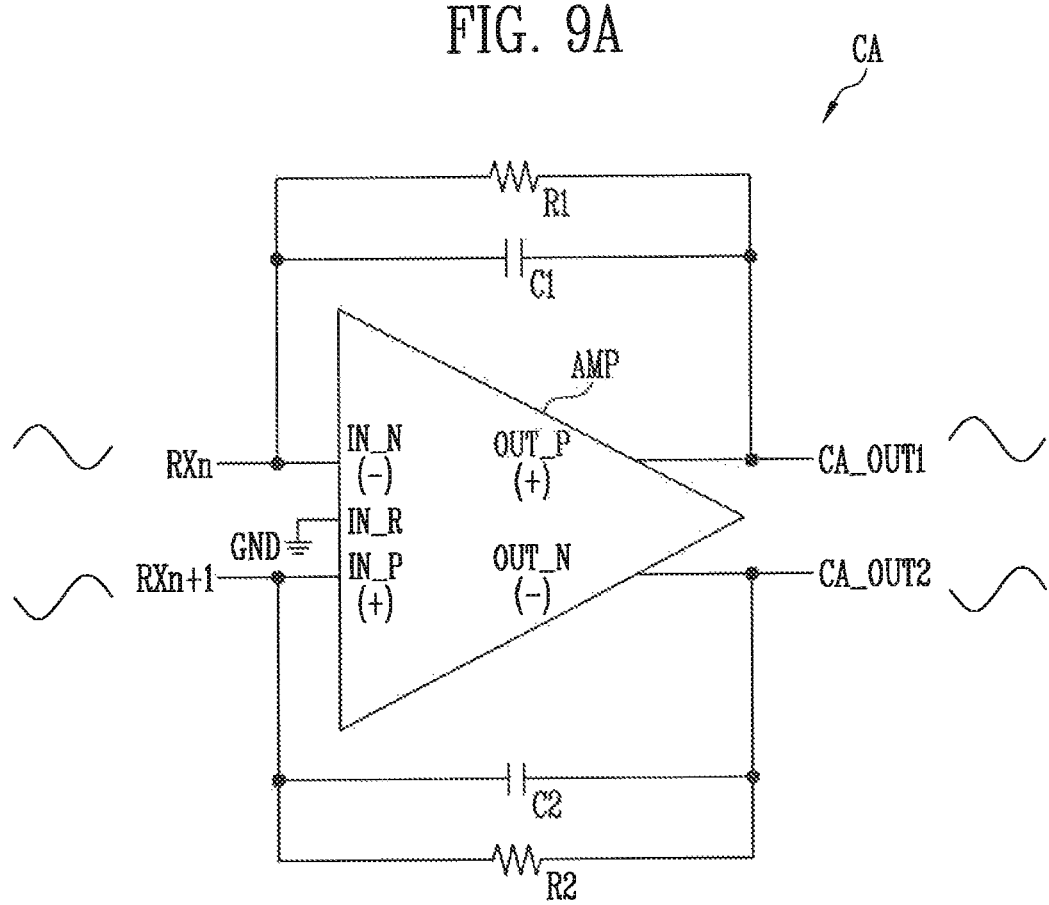
FIGS. 9A to 9C are circuit diagrams illustrating a charge amplifier included in the analog front-end of FIGS. 8B and 8C according to embodiments of the present disclosure.
Figure 9B:
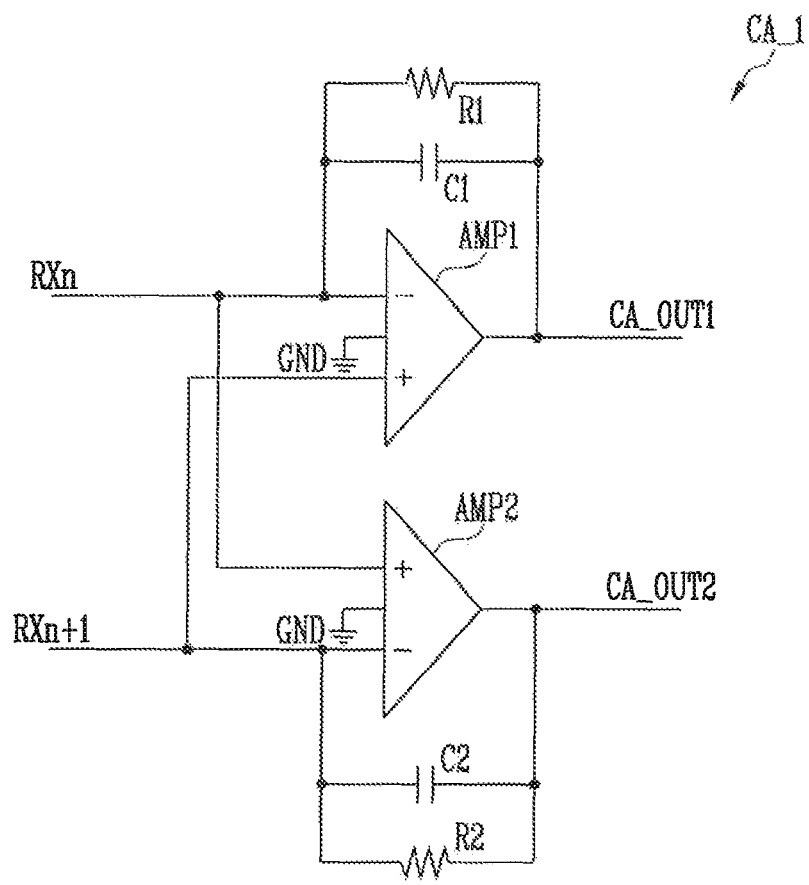
Figure 9C:
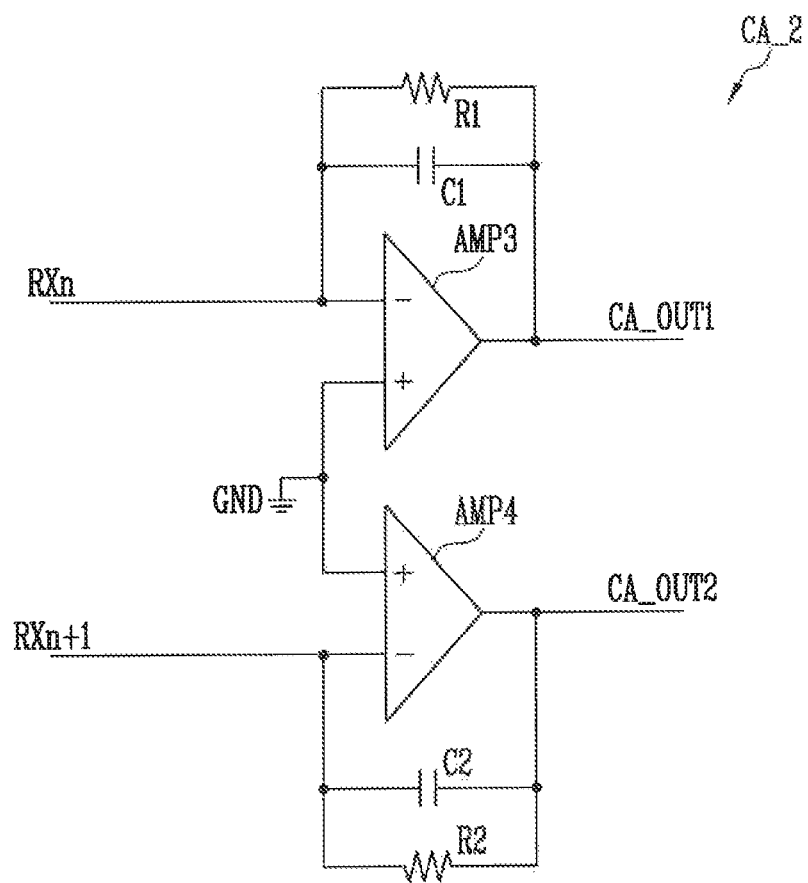
Figure 9D:
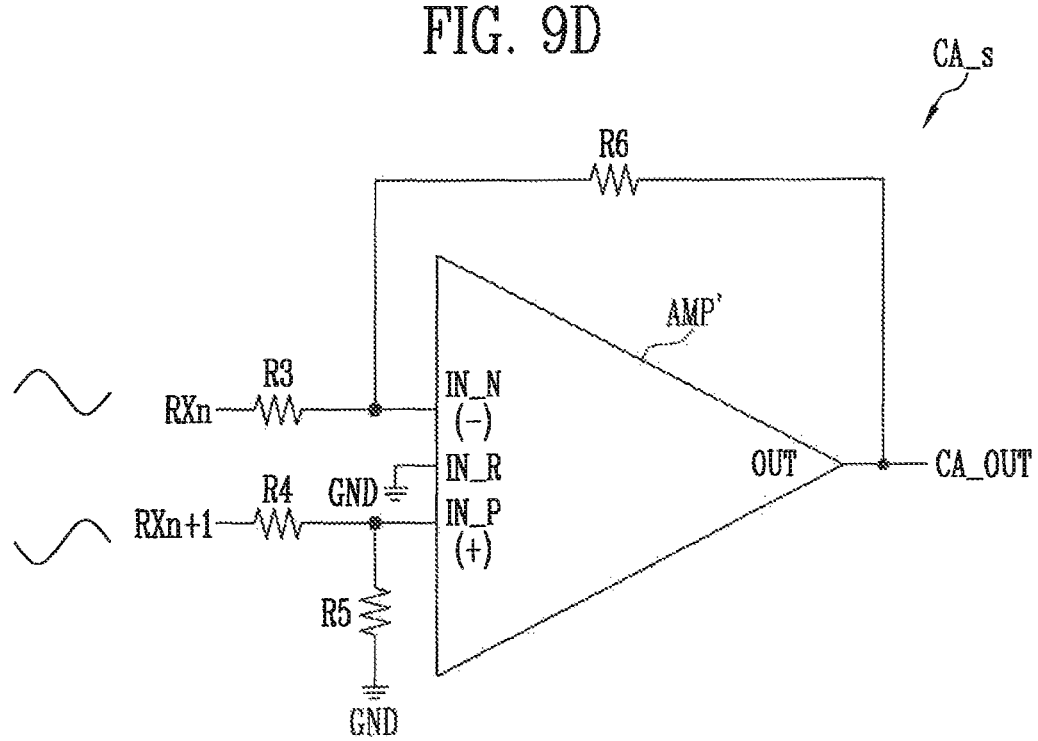
FIG. 9D is a circuit diagram illustrating a charge amplifier included in the analog front-end of FIG. 8D according to embodiments of the present disclosure.

FIGS. 9A to 9C are circuit diagrams illustrating an example of the charge amplifier included in the analog front-end of FIGS. 8B and 8C. FIG. 9D is a circuit diagram illustrating an example of the charge amplifier included in the analog front-end of FIG. 8D.

First, referring to FIGS. 8B, 8C, and 9A, the charge amplifier CA may include an amplifier AMP, a first capacitor C1, a first resistor R1, a second capacitor C2, and a second resistor R2.

The amplifier AMP may include a second input terminal IN_P (e.g., a positive input terminal ("+")), a first input terminal IN_N (e.g., a negative input terminal ("−")), a first output terminal OUT_P (e.g., a positive output terminal "+"), and a second output terminal OUT_N (e.g., a negative output terminal "−"). In an embodiment, the amplifier AMP may further include a third input terminal IN_R (e.g., a reference input terminal), and a reference voltage GND may be applied to the third input terminal IN_R.

The first input terminal IN_N of the amplifier AMP may be connected to an n-th second signal line SL2-n, and an n-th sensing signal RXn may be applied to the first input terminal IN_N of the amplifier AMP. The second input terminal IN_P of the amplifier AMP may be connected to an (n+1)-th second signal line SL2-(n+1), and an (n+1)-th sensing signal RXn+1 may be applied to the second input terminal IN_P of the amplifier AMP.

The first capacitor C1 and the first resistor R1 may be connected in parallel between the first input terminal IN_N and the first output terminal OUT_P of the amplifier AMP. Therefore, a first differential signal CA_OUT1 corresponding to the difference between the n-th sensing signal RXn and the (n+1)-th sensing signal RXn+1 may be output through the first output terminal OUT_P of the amplifier AMP.

Similarly, the second capacitor C2 and the second resistor R2 may be connected in parallel between the first input terminal IN_N and the first output terminal OUT_P of the amplifier AMP. The second resistor R2 (and the first resistor R1) may have a fixed resistance value or may be configured as a variable resistor or a switch. Therefore, a second differential signal CA_OUT2 corresponding to the difference between the (n+1)-th sensing signal RXn+1 and the n-th sensing signal RXn may be output through the second output terminal OUT_N of the amplifier AMP. In an embodiment, the second differential signal CA_OUT2 may have a waveform in which the first differential signal CA_OUT1 is inverted.

The charge amplifier CA may remove the AC offset and common noise by outputting the first differential signal CA_OUT1 and the second differential signal CA_OUT2 in a differential manner.

In an embodiment, the amplifier AMP may include sub-amplifiers.

As illustrated in FIG. 9B, the charge amplifier CA1 may include a first sub-amplifier AMP1 (e.g., a first amplifier) and a second sub-amplifier AMP2 (e.g., a second amplifier). The first sub-amplifier AMP1 may include input/output terminals corresponding to the second input terminal IN_P, the first input terminal INN, and the first output terminal OUT_P of the amplifier AMP. In an embodiment, the n-th sensing signal RXn may be applied to the negative input terminal "−" of the first sub-amplifier AMP1, and the (n+1)-th sensing signal RXn+1 may be applied to the positive input terminal "+" of the first sub-amplifier AMP1. According to the connection configuration of the first resistor R1, the first capacitor C1, and the first sub-amplifier AMP1, the first sub-amplifier AMP1 may amplify and output charges of the n-th sensing signal RXn based on the (n+1)-th sensing signal RXn+1. Similarly, the second sub-amplifier AMP2 may include input/output terminals corresponding to the second input terminal IN_P, the first input terminal IN_N, and the second output terminal OUT_N of the amplifier AMP. In an embodiment, the n-th sensing signal RXn may be applied to the positive input terminal "+" of the second sub-amplifier AMP2, and the (n+1)-th sensing signal RXn+1 may be applied to the negative input terminal "−" of the second sub-amplifier AMP2. According to the connection configuration of the second resistor R2, the second capacitor C2, and the second sub-amplifier AMP2, the second sub-amplifier AMP2 may amplify and output charges of the (n+1)-th sensing signal RXn+1 based on the n-th sensing signal RXn.

The reference voltage GND may be provided to the first sub-amplifier AMP1 and the second sub-amplifier AMP2 as the driving voltage. However, embodiments of the present disclosure are not limited thereto.

As illustrated in FIG. 9C, the charge amplifier CA_2 may include a third sub-amplifier AMP3 and a fourth sub-amplifier AMP4. The n-th sensing signal RXn may be applied to the negative input terminal "−" of the third sub-amplifier AMP3, and the reference voltage GND may be applied to the positive input terminal "+" of the third sub-amplifier AMP3. According to the connection configuration of the first resistor R1, the first capacitor C1, and the third sub-amplifier AMP3, the third sub-amplifier AMP3 may amplify and output charges of the n-th sensing signal RXn based on the reference voltage GND. Similarly, the reference voltage GND may be applied to the positive input terminal "+" of the fourth sub-amplifier AMP4, and the (n+1)-th sensing signal RXn+1 may be applied to the negative input terminal "−" of the fourth sub-amplifier AMP4. According to the connection configuration of the second resistor R2, the second capacitor C2, and the fourth sub-amplifier AMP4, the fourth sub-amplifier AMP4 may amplify and output charges of the (n+1)-th sensing signal RXn+1 based on the reference voltage GND.

As described above, the charge amplifiers CA and CA_1 may be implemented as fully differential amplifiers to output the first differential signal CA_OUT1 and the second differential signal CA_OUT2 from which the AC offset and common noise are removed. In contrast, the charge amplifier CA_2 may amplify the n-th sensing signal RXn and the (n+1)-th sensing signal RXn+1 based on the reference voltage GND, and output the first differential signal CA_OUT1 and the second differential signal CA_OUT2.

On the other hand, as described with reference to FIG. 8D, the charge amplifier CAn' may be implemented as a single-ended output differential amplifier. For example, referring to FIGS. 8D and 9D, the charge amplifier CA_s may include an amplifier AMP' and third to sixth resistors R3, R4, R5, and R6.

The amplifier AMP' may include a second input terminal IN_P (e.g., a positive input terminal ("+")), a first input terminal IN_N (e.g., a negative input terminal ("−")), and an output terminal OUT. The amplifier AMP' may further include a third input terminal IN_R (e.g., a reference input terminal), and the reference voltage GND may be applied to the third input terminal IN_R.

In an embodiment, the first input terminal IN_N of the amplifier AMP' may be connected to an n-th second signal line SL2-$n$, and an n-th sensing signal RXn may be applied to the first input terminal IN_N of the amplifier AMP'. In an embodiment, the second input terminal IN_P of the amplifier AMP' may be connected to an (n+1)-th second signal line SL2-$(n+1)$ through the fourth resistor R4, and an (n+1)-th sensing signal RXn+1 may be applied to the second input terminal IN_P of the amplifier AMP'. In addition, the reference voltage GND may be applied to the second input terminal IN_P of the amplifier AMP' through the fifth resistor R5.

The sixth resistor R6 may be connected between the first input terminal IN_N and the output terminal OUT_P of the amplifier AMP'. Therefore, the differential signal CA_OUT corresponding to the difference between the n-th sensing signal RXn and the (n+1)-th sensing signal RXn+1 may be output through the first output terminal OUT_P of the amplifier AMP'.

In an embodiment, the amplifier AMP' may further include a capacitor connected in parallel with the sixth resistor R6 between the first input terminal IN_N and the output terminal OUT of the amplifier AMP'.

As such, the charge amplifier CA_s is implemented as a single-ended output differential amplifier and outputs the differential signal CA_OUT from which the common noise is removed. In addition, the charge amplifier CA_s is configured with a relatively simplified circuit to minimize power consumption.

Figure 9E:
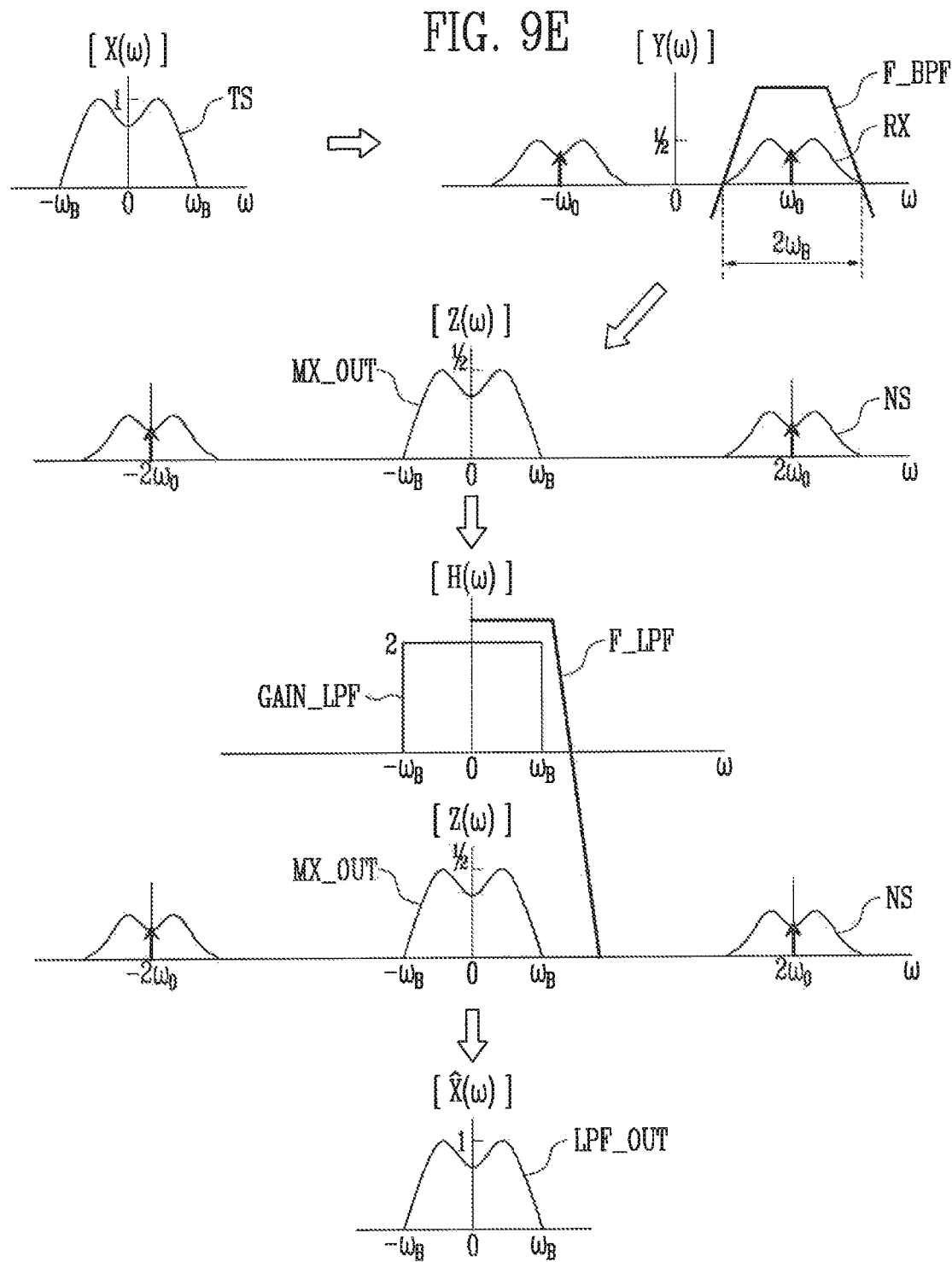
FIG. 9E is a diagram illustrating an example of signals for explaining the operation of the analog front-end of FIGS. 8B to 8D according to an embodiment of the present disclosure.

FIG. 9E is a diagram illustrating an example of signals for explaining the operation of the analog front-end of FIGS. 8B to 8D.

Referring to FIGS. 6A, 6B, 8B, 8C, 8D, and 9E, the touch signal TS may have a frequency within a reference bandwidth (e.g., −$\omega$B to $\omega$B) according to a driving frequency (e.g., a sensing period) of the input sensing circuit IS-C. The sensing signal RX provided to the analog front-ends AFEn and AFEn' from each of the second sensing electrodes IE2-1 to IE2-4 may be modulated by the driving signal TX, and may have a frequency within the reference bandwidth 2$\omega$0 with respect to the frequency $\omega$0 of the driving signal TX. The sensing signal RX includes a negative frequency component (e.g., −$\omega$0). However, the negative frequency component has the same magnitude as the positive frequency component and has a phase difference of 180 degrees. The negative frequency component is not considered because the negative frequency component is physically meaningless. The band pass filters BPFn and BPFn' have a first transfer function F_BPF corresponding to the frequency band of the sensing signal RX (e.g., a predetermined frequency band), and may amplify only a signal within the corresponding frequency band. For example, the band pass filters BPFn and BPFn' may be implemented by including a differential amplifier (e.g., a fully differential amplifier), a capacitor, and a resistor, and may amplify only signals corresponding to the frequency band of the drive signal (see TX of FIG. 7A) (e.g., 200 KHz to 350 KHz).

The mixer MXn may convert a signal in a relatively high frequency band (e.g., a signal in a frequency band corresponding to the band pass filters BPFn and BPFn') into a demodulation signal MX_OUT in a low frequency band (e.g., a signal in the frequency band corresponding to the touch signal TS). In addition, the mixer MXn may convert noise in a relatively low frequency band into high-frequency noise NS in a high frequency band. For reference, low-frequency noise (e.g., noise called "1/f noise") may be generated in semiconductor devices (e.g., transistors) constituting the analog front-ends AFEn and AFEn', and the mixer MXn may shift the low-frequency noise to the high-frequency band through a chopping operation.

The low pass filters LPFn and LPFn' have a second transfer function F_LPF corresponding to the frequency band of the touch signal TS. For example, a gain GAIN_LPF of the second transfer function F_LPF may be about 2 in a frequency band of OB or less. In this embodiment, the low pass filters LPFn and LPFn' may amplify only the demodulation signal MX_OUT in the low frequency band and output the output signal LPF_OUT.

Figure 10:
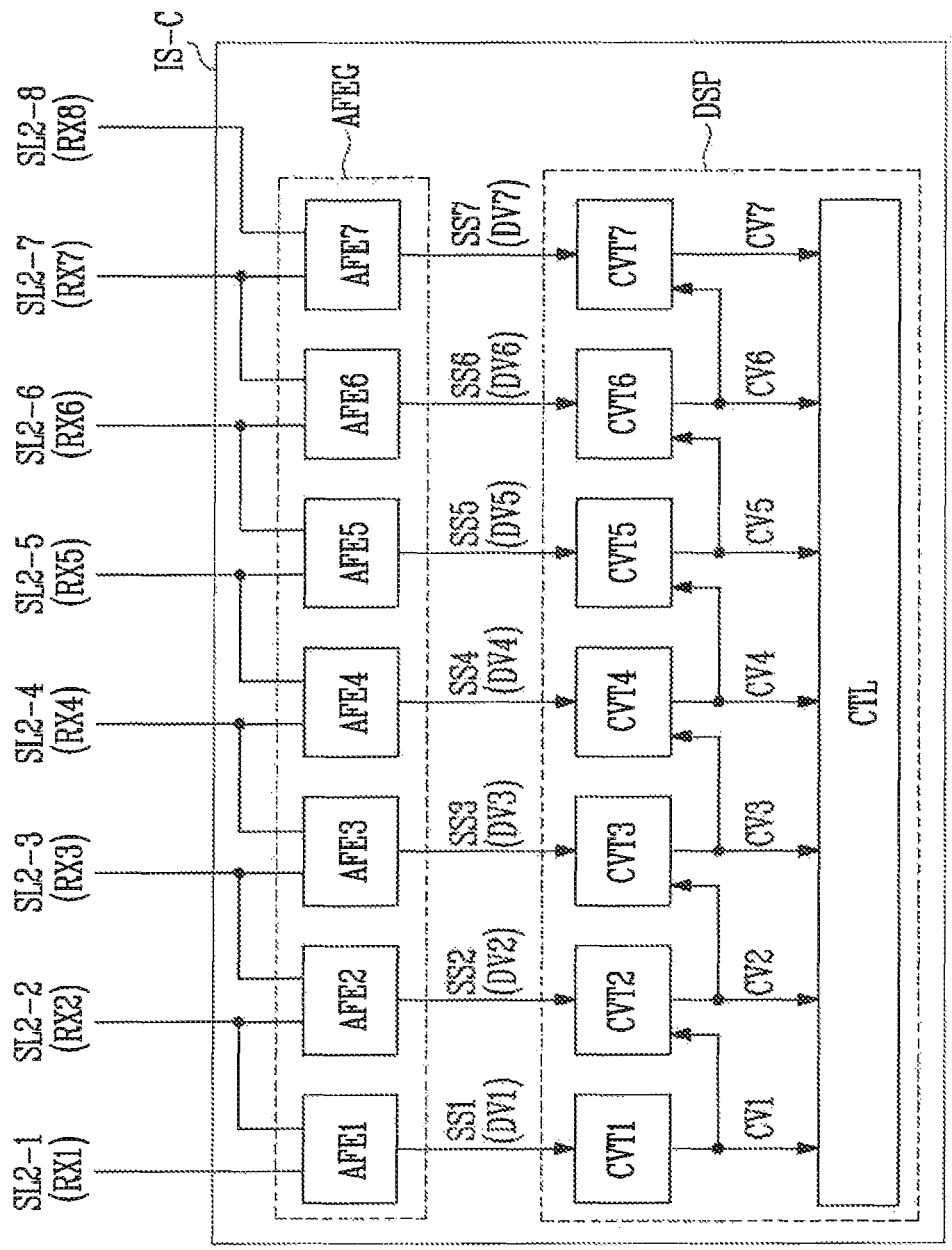
FIG. 10 is a block diagram illustrating the input sensing circuit of FIG. 6A according to an embodiment of the present disclosure.

FIG. 10 is a block diagram illustrating an example of the input sensing circuit of FIG. 6A. On the other hand, FIG. 10 illustrates that the number of second signal lines SL2-4 to SL2-8 is eight, and the number of analog front-ends AFE1 to AFE7 that receive the sensing signals RX1 to RX8 from the second signal lines SL2-1 to SL2-8 is seven. However, this is only illustrated as an example for convenience of description. The number of second signal lines SL2-1 to SL2-8 (e.g., the second signal lines included in the input sensing unit ISU of FIG. 6A) and the number of analog front-ends AFE1 to AFE7 are not limited thereto.

Referring to FIGS. 6A, 6B, 8B, 8C, 8D, and 10, the input sensing circuit IS-C may receive sensing signal (e.g., the sensing signals RX1 to RX8) corresponding to an external input (e.g., a user's touch input), and may calculate or recognize the position of the external input based on the sensing signal.

In an embodiment, the input sensing circuit IS-C may include an analog front-end group AFEG and a signal processor DSP described with reference to FIGS. 6A and 6B.

In an embodiment, the analog front-end group AFEG may include analog front-ends AFE1 to AFE7. As described with reference to FIGS. 6A and 6B, the analog front-ends AFE1 to AFE7 may be connected to two adjacent second signal lines (e.g., second sensing electrodes) among the second signal lines SL2-1 to SL2-8, and may receive two sensing signals provided through the two second signal lines.

For example, the first analog front-end AFE1 may be connected to the "first" second signal line SL2-1 and the "second" second signal line SL2-2 to receive the first sensing signal RX1 and the second sensing signal RX2, and the second analog front-end AFE2 may be connected to the "second" second signal line SL2-2 and the "third" second signal line SL2-3 to receive the second sensing signal RX2 and the third sensing signal RX3. Similarly, the third to seventh analog front-ends AFE3 to AFE7 may also be connected to two adjacent second signal lines to receive two sensing signals.

As illustrated in FIG. 10, since the analog front-ends AFE1 to AFE7 are connected to two second signal lines adjacent to each other, the number of analog front-ends AFE1 to AFE7 may be one less than the number of second signal lines SL2-1 to SL2-8. However, embodiments of the present disclosure are not limited thereto and the number of the analog front-ends may vary and may be one less than the number of second signal lines.

As described with reference to FIGS. 8B to 8D, the analog front-ends AFE1 to AFE7 may output sensing values (e.g., first to seventh sensing values SS1 to SS7) based on the sensing signals.

The analog front-ends AFE1 to AFE7 are implemented as differential analog front-ends (e.g., fully differential analog front-ends), the sensing values SS1 to SS7 output by the analog front-ends AFE1 to AFE7 may correspond to a difference value between two sensing signals received by the analog front-ends AFE1 to AFE7.

For example, the first to seventh sensing values SS1 to SS7 output by the first to seventh analog front-ends AFE1 to AFE7 may correspond to the first to seventh difference values DV1 to DV7, respectively. The first difference value DV1 may correspond to a difference (e.g., RX1-RX2) between the first and second sensing signals RX1 and RX2, the second difference value DV2 may correspond to a difference (e.g., RX2-RX3) between the second and third sensing signals RX2 and RX3, the third difference value DV3 may correspond to a difference (e.g., RX3-RX4) between the third and fourth sensing signals RX3 and RX4, the fourth difference value DV4 may correspond to a difference (e.g., RX4-RX5) between the fourth and fifth sensing signals RX4 and RX5, the fifth difference value DV5 may correspond to a difference (e.g., RX5-RX6) between the fifth and sixth sensing signals RX5 and RX6, the sixth difference value DV6 may correspond to a difference (e.g., RX6-RX7) between the sixth and seventh sensing signals RX6 and RX7, and the seventh difference value DV7 may correspond to a difference (e.g., RX7-RX8) between the seventh and eighth sensing signals RX7 and RX8.

The sensing values SS1 to SS7 output by the analog front-ends AFE1 to AFE7 may be provided to the signal processor DSP.

The signal processor DSP may determine whether an external input (e.g., a user's touch input) has been touched, based on the sensing values SS1 to SS7, and may calculate a position where the touch occurs.

According to embodiments, the signal processor DSP may determine whether the touch occurs and calculate the touch position by comparing the magnitudes of the sensing values SS1 to SS7 and comparing the amount of change in the sensing capacitance of the second sensing electrodes.

As described above, the sensing values SS1 to SS7 correspond to difference values (RX1-RX2, RX2-RX3, RX3-RX4, RX4-RX5, RX5-RX6, RX6-RX7, and RX7-RX8, respectively) between two sensing signals provided from two adjacent second signal lines (e.g., the second sensing electrodes). However, the accuracy in calculating the touch position may decrease when the signal processor DSP simply compares the magnitudes of the sensing values SS1 to SS7. For example, when the touch input is applied to the input sensing unit ISU, the change in the sensing capacitance may occur not only in the second signal line corresponding to the position to which the touch input is applied, but also in adjacent second signal lines among the second signal lines SL2-1 to SL2-8. For example, when the touch input is generated in response to the third second signal line SL2-3, the change in the sensing capacitance of the "second" second signal line SL2-2 and/or the sensing capacitance of the "fourth" second signal line SL2-4 may occur together according to the position of the touch input. Therefore, the difference value between the sensing signals between the second signal line corresponding to the position to which the touch input is applied and the second signal line adjacent thereto, may be relatively small.

Therefore, the signal processor DSP according to embodiments of the present disclosure may convert the sensing values SS1 to SS7 and calculate the touch position by comparing the magnitudes of the converted values.

In an embodiment, the signal processor DSP may set one of the second signal lines SS2-1 to SS2-8 (e.g., the "first" second signal line SL2-1) as the reference signal line, and may convert the sensing values SS1 to SS7 to compare the difference between the sensing signals RX1 to RX8 between the second signal lines SS2-1 to SS2-8 and the reference signal line.

In an embodiment, the signal processor DSP may include converters CVT1 to CVT7 and a position calculation circuit CTL.

The converters CVT1 to CVT7 may receive the sensing values SS1 to SS7 and convert the sensing values SS1 to SS7 into conversion values CV1 to CV7 based on the difference values DV1 to DV7.

For example, when the signal processor DSP sets the "first" second signal line SL2-1 among the second signal lines SL2-1 to SL2-8 as the reference signal line, the first converter CVT1 may convert a first sensing value SS1 corresponding to the difference value (e.g., a first difference value DV1) (e.g., RX1-RX2) between the first and second sensing signals RX1 and RX2 into a first conversion value CV1 to be compared. The first conversion value CV1 may correspond to the first difference value DV1. For example, the first conversion value CV1 may correspond to the difference (e.g., RX1-RX2) of the sensing signals between the "first" second signal line SL2-1 and the "second" second signal line SL2-2. However, embodiments of the present disclosure are not limited thereto. Since the first conversion value CV1 corresponds to the first difference value DV1, the first converter CVT1 may bypass and output the first sensing value SS1 without conversion.

The first converter CVT1 may provide the first conversion value CV1 to the second converter CVT2.

The second converter CVT2 may convert the second sensing value SS2 into the second conversion value CV2 by using the first conversion value CV1. For example, the second converter CVT2 may convert the second sensing value SS2 into the second conversion value CV2 by adding the difference value (e.g., the second difference value DV2) (e.g., RX2-RX3) between the second and third sensing signals RX2 and RX3 to the first conversion value CV1 (e.g., RX1-RX2). For example, the second conversion value CV2 may correspond to the difference (e.g., RX1-RX3) of the sensing signals between the "first" second signal line SL2-1 and the "third" second signal line SL2-3.

The second converter CVT2 may provide the second conversion value CV2 to the third converter CVT3.

Similarly, the third converter CVT3 may convert the third sensing value SS3 into the third conversion value CV3 by using the second conversion value CV2. For example, the third converter CVT3 may convert the third sensing value SS3 into the third conversion value CV3 by adding the difference value (e.g., the third difference value DV3) (e.g., RX3-RX4) between the third and fourth sensing signals RX3 and RX4 to the second conversion value CV2 (e.g. RX1-RX3). For example, the third conversion value CV3 may correspond to the difference (e.g., RX1-RX4) of the sensing signals between the "first" second signal line SL2-1 and the "fourth" second signal line SL2-4.

In addition, similar to the operations of the second converter CVT2 and the third converter CVT3, the fourth to seventh converters CVT4 to CVT7 may convert the fourth to seventh sensing values SS4 to SS7 into fourth to seventh conversion values CV4 to CV7. The fourth conversion value CV4 may correspond to the difference (e.g., RX1-RX5) of the sensing signals between the "first" second signal line SL2-1 and the "fifth" second signal line SL2-5, the fifth conversion value CV5 may correspond to the difference (e.g., RX1-RX6) of the sensing signals between the "first" second signal line SL2-1 and the "sixth" second signal line SL2-6, the sixth conversion value CV6 may correspond to the difference (e.g., RX1-RX7) of the sensing signals between the "first" second signal line SL2-1 and the "seventh" second signal line SL2-6, and the seventh conversion value CV7 may correspond to the difference (e.g., RX1-RX8) of the sensing signals between the "first" second signal line SL2-1 and the "eighth" second signal line SL2-8.

The converters CVT1 to CVT7 may provide the conversion values CV1 to CV7 to the position calculation circuit CTL.

In an embodiment, the position calculation circuit CTL may calculate the touch position by comparing the magnitudes of the conversion values CV1 to CV7. Since the value of the sensing capacitance increases in response to the position where the touch input occurs, the position calculation circuit CTL may determine the second signal line (e.g., the second sensing electrode) corresponding to the largest value among the conversion values CV1 to CV7 as the second signal line (e.g., the second sensing electrode) having the largest change in capacitance sensing electrode, and may calculate this as the touch position. Since each of the conversion values CV1 to CV7 corresponds to a value obtained by subtracting the sensing value of the corresponding second signal line from the sensing value of the same reference signal line, the position calculation circuit CTL may compare the amount of change in sensing capacitances of the second sensing electrodes by comparing the magnitudes of the conversion values CV1 to CV7.

For example, when the third conversion value CV3 is the largest among the conversion values CV1 to CV7, since the third conversion value CV3 corresponds to the difference (e.g., RX1-RX4) of the sensing signals between the "first" second signal line SL2-1 and the "fourth" second signal line SL2-4, the position calculation circuit CTL may determine that the touch input is applied to the "fourth" second signal line SL2-4 (e.g., the "fourth" second sensing electrode (see IE2-4 of FIG. 6A)).

As described with reference to FIGS. 6A, 6B, 8B, 8C, 8D, and 10, the input sensing circuit IS-C may convert the sensing values SS1 to SS7 based on the reference signal line, and may compare the conversion values CV1 to CV7 to calculate or recognize the position of the external input (e.g., the user's touch input), thereby increasing the accuracy of calculating the external input position.

Figure 11:
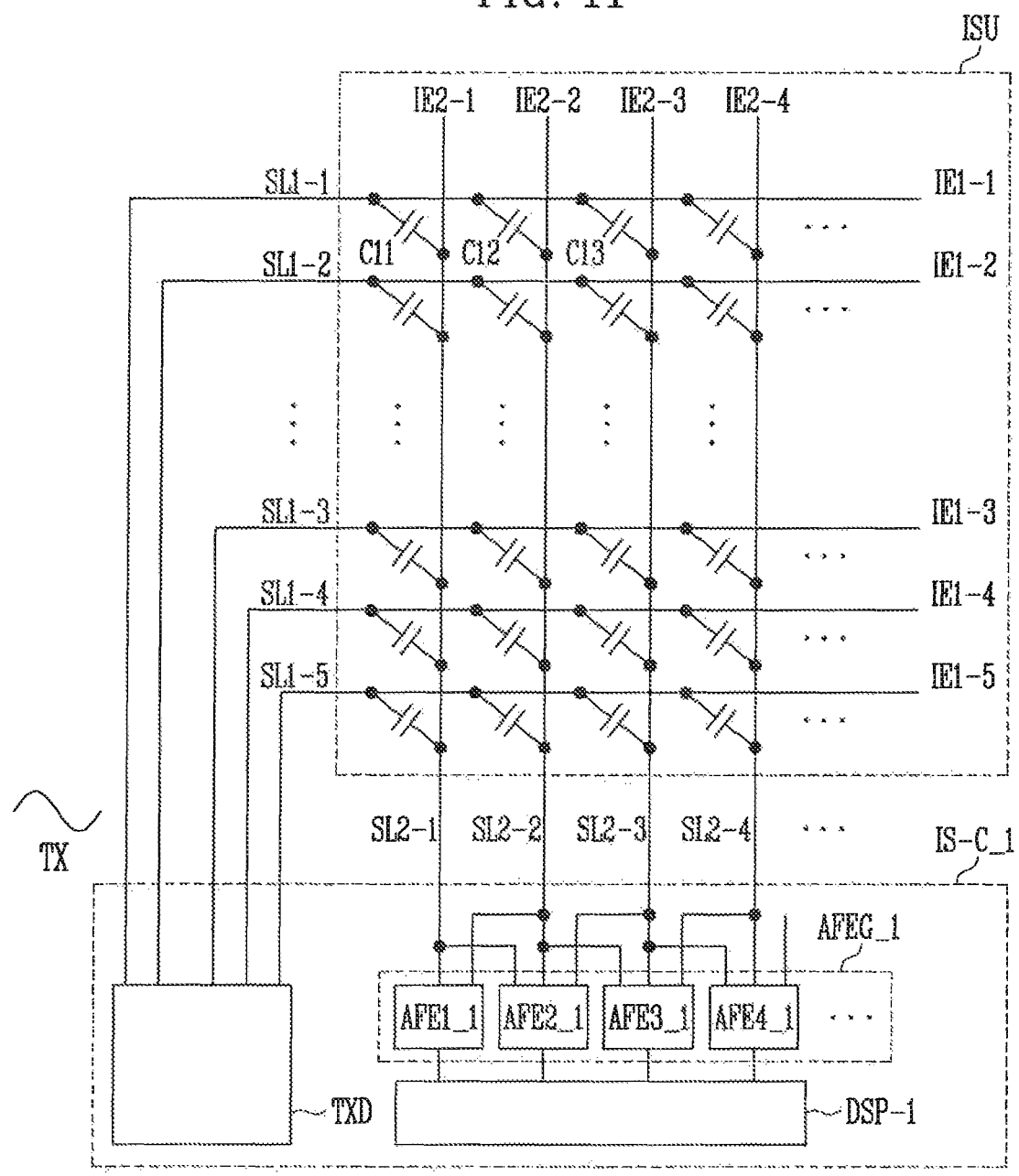
FIG. 11 is a block diagram illustrating an input sensing unit and an input sensing circuit included in the display device of FIG. 1 according to an embodiment of the present disclosure.

FIG. 11 is a block diagram illustrating an example of the input sensing unit and the input sensing circuit included in the display device of FIG. 1.

Referring to FIGS. 6A, 6B, and 11, the input sensing circuit IS-C_1 of FIG. 11 differs from the input sensing circuit IS-C of FIGS. 6A and 6B in that an analog front-end group AFEG_1 includes analog front-ends AFE1_1, AFE2_1, AFE3_1, and AFE4_1. Since the input sensing circuit IS-C_1 of FIG. 11 is similar to the input sensing circuit IS-C of FIGS. 6A and 6B, except for the analog front-ends AFE1_1, AFE2_1, AFE3_1, and AFE4_1, redundant descriptions thereof may not be repeated for convenience of explanation.

The first analog front-end AFE1_1 among the analog front-ends AFE1_1, AFE2_1, AFE3_I, and AFE4_1 may be connected to two adjacent second sensing electrodes (e.g., second signal lines) among the second sensing electrodes IE2-1 to IE2-4. For example, the first analog front-end AFE1_1 may be connected to the "first" second sensing electrode IE2-1 (e.g., the first sensing electrode) and the "second" second sensing electrode IE2-2 (e.g., the second sensing electrode) among the second sensing electrodes IE2-1 to IE2-4. Similar to the first analog front-end AFE1_0.1, the last analog front-end among the analog front-ends AFE1_1, AFE2-2, AFE3_1, and AFE4_1 may also be connected to two adjacent second sensing electrodes (e.g., the second signal lines) among the second sensing electrodes IE2-1 to IE2-4. For example, the last analog front-end may be connected to the last two second sensing electrodes among the second sensing electrodes IE2-1 to IE2-4.

In addition, each of the analog front-ends AFE2_1, AFE3_1, and AFE4_1 except for the first analog front-end AFE1_1 and the last analog front-end among the analog front-ends AFE1_1, AFE2_1, AFE3_1, and AFE4_1 may be connected to the corresponding second sensing electrodes (e.g., the second signal line) and two adjacent second sensing electrodes (e.g., the second signal lines) among the second sensing electrodes IE2-1 to IE2-4. For example, each of the analog front-ends AFE2_1, AFE3_1, and AFE4_1 may be connected to three adjacent second sensing electrodes (e.g., the second signal lines). For example, the second analog front-end AFE2_1 may be connected to the "first" second sensing electrode IE2-1 (e.g., the first sensing electrode), the "second" second sensing electrode IE2-2 (e.g., the second sensing electrode), and the "third" second sensing electrode IE2-3 (e.g., the third sensing electrode). In an embodiment, the third analog front-end AFE3_1 may be connected to the "second" second sensing electrode IE2-2 (e.g., the second sensing electrode), the "third" second sensing electrode IE2-3 (e.g., the third sensing electrode), and the "fourth" second sensing electrode IE2-4 (e.g., the fourth sensing electrode).

In an embodiment, the analog front-end group AFEG_1 (e.g., each of the analog front-ends included in the analog front-end group AFEG_1) may be implemented by including a two-stage differential amplifier. For example, the analog front-end group AFEG_1 (e.g., each of the analog front-ends included in the analog front-end group AFEG_1) may include a first charge amplifier and a second charge amplifier sequentially connected to the first charge amplifier.

The first charge amplifier may be connected to two adjacent second sensing electrodes among the second sensing electrodes IE2-1 to IE2-4, and may differentially amplify two sensing signals provided through the second sensing electrodes and output a single-ended (e.g., one) differential signal (e.g., amplified signal). For example, in an embodiment, the first charge amplifier may be implemented as the single-ended output differential amplifier described with reference to FIG. 9D.

In addition, the second charge amplifier may be connected to two first charge amplifiers adjacent to each other, and may differentially amplify two differential signals provided through the first charge amplifiers and output two complementary differential signals. For example, in an embodiment, the second charge amplifier may be implemented as the fully differential amplifier described with reference to FIGS. 9A to 9C.

In an embodiment, the first analog front-end AFE1_1 may include only the first charge amplifier, may be connected to the "first" second sensing electrode IE2-1 (e.g., the "first" second signal line SL2-1) and the "second" second sensing electrode IE2-2) (e.g., the "second" second signal line SL2-2) among the second sensing electrodes IE2-1 to IE2-4, and may output the sensing value (e.g., the differential output value) corresponding to the capacitance difference of the sensing capacitors. For example, the first analog front-end AFE1_1 may be implemented as the single-ended output analog front-end described with reference to FIGS. 6A, 6B, and 8D. Similarly, the last analog front-end among the analog front-ends AFE1_1, AFE2_1, AFE3_1, and AFE4_1 may also be implemented as the single-ended output analog front-end described with reference to FIGS. 6A, 6B, and 8D.

In an embodiment, each of the analog front-ends AFE2_1, AFE3_1, and AFE4_1 except for the first analog front-end AFE1_1 and the last analog front-end among the analog front-ends AFE1_1, AFE2_1, AFE3_1, and AFE4_1 may include a first charge amplifier and a second charge amplifier, may be connected to the corresponding second sensing electrode (e.g., the second signal line) and two adjacent second sensing electrodes (e.g., the second signal lines) among the second sensing electrodes IE2-1 to IE2-4, and may output the sensing value corresponding to a value obtained by subtracting a sum of the sensing capacitances of two adjacent second sensing electrodes from a value obtained by amplifying, such as amplifying twice, the sensing capacitance of the corresponding second sensing electrode. However, embodiments of the present disclosure are not limited thereto and the amplification amount may vary. For example, the second analog front-end AFE2_1 may output the second sensing value corresponding to a value obtained by subtracting a sum of the sensing capacitances of the sensing capacitors (e.g., a sum of the capacitance of the (1-1)-th sensing capacitor C11 and the capacitance of the (1-3)-th sensing capacitor C13) formed in the "first" and "third" second sensing electrodes IE1-2 and IE2-3) from a value obtained by amplifying (e.g., amplifying twice) the sensing capacitance of the sensing capacitor (e.g., the capacitance of the (1-2)-th sensing capacitor C12) formed in the corresponding "second" second sensing electrode IE2-2.

Each of the analog front-ends AFE1_1 to AFE4_1 may be configured to include an amplifier (e.g., a first charge amplifier and/or a second charge amplifier), a filter, an analog-to-digital converter, and the like, and a detailed configuration of each of the analog front-ends AFE1_1 to AFE4_1 will be described with reference to FIGS. 12A and 12B.

The sensing values output from the analog front-ends AFE1_1 to AFE4_1 may be provided to the signal processor DSP_1, and the signal processor DSP_1 may determine whether the touch occurs, based on the sensing values, and may calculate a position where the touch occurs.

In response to a touch event occurring in a specific region of the input sensing unit ISU, the capacitance between the first sensing electrode and the second sensing electrode located in the corresponding region may change. For example, when a touch event occurs in a region where the "first" first sensing electrode IE1-1 and the "second" second sensing electrode IE2-2 intersect with each other, the capacitance of the (1-2)-th sensing capacitor C12 between the "first" first sensing electrode IE1-1 and the "second" second sensing electrode IE2-2 may change. On the other hand, the capacitance of the (1-1)-th sensing capacitor C11 between the "first" first sensing electrode IE1-1 and the "first" second sensing electrode IE2-1 and/or the capacitance of the (1-3)-th sensing capacitor C13 between the "first" first sensing electrode IE1-1 and the "third" second sensing electrode IE3-1 may not change or only change a relatively small amount. Therefore, the amount of change in the second sensing value output through the second analog front-end AFE2_1 may be relatively larger than the amount of change in other sensing values, and the position where the touch occurs may be detected based on the second sensing value having a relatively large change amount.

Since the analog front-end (e.g., the second analog front-end AFE2_1) outputs the sensing value (e.g., the second sensing value) by amplifying the sensing capacitance of the sensing capacitor (e.g., the capacitance of the (1-2)-th sensing capacitor C12) formed in the corresponding second sensing electrode (e.g., the "second" second sensing electrode IE2-2), the signal processor DSP_1 may detect the position where the touch occurs by comparing the amount of change in the sensing capacitance through magnitude comparison of the sensing values without separately converting the sensing values provided from the analog front-end group AFEG_1. Since the signal processor DSP_1 does not perform a separate conversion operation, the signal processing load of the signal processor DSP_1 may be reduced.

On the other hand, the distribution circuits DC1, DC2, and DC3 described with reference to FIG. 6B may be applied to the input sensing circuit IS-C_1 of FIG. 11.

Figure 12A:
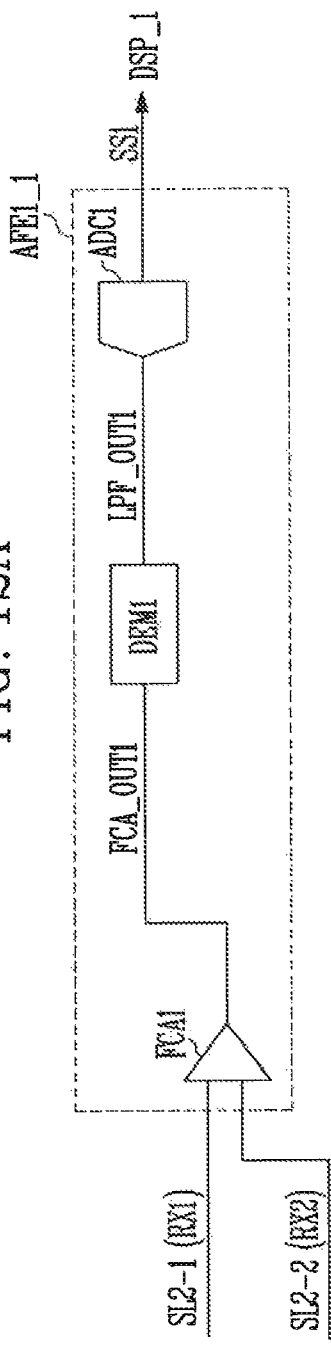
FIGS. 12A and 12B are block diagrams illustrating an analog front-end included in the input sensing circuit of FIG. 11 according to embodiments of the present disclosure.
Figure 12B:
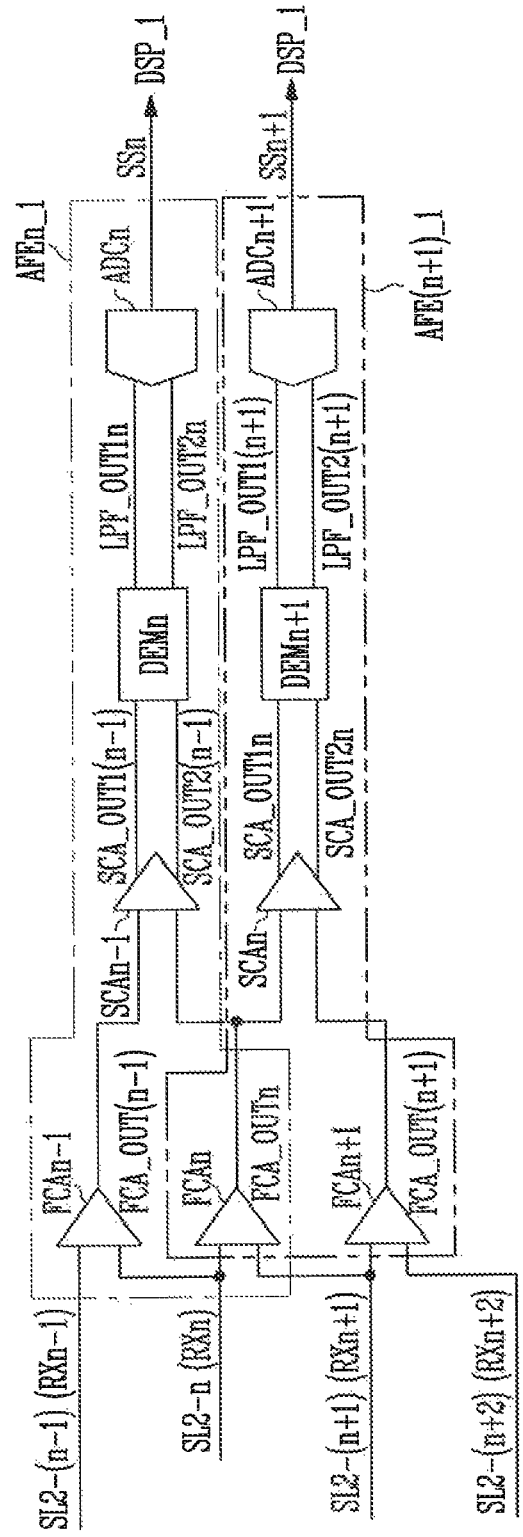

FIGS. 12A and 12B are block diagrams illustrating an example of the analog front-end included in the input sensing circuit of FIG. 11. FIG. 12A illustrates the first analog front-end AFE1_1 among the analog front-ends AFE1_1 to AFE4_1 described with reference to FIG. 11. As described with reference to FIG. 11, the last analog front-end of the analog front-ends AFE1_1 to AFE4_1 may be configured identical or substantially similar to the first analog front-end AFE1_1 of FIG. 12A. In addition, the analog front-ends AFE2_1, AFE3_1, and AFE4_1 except for the first analog front-end AFE1_1 and the last analog front-end among the analog front-ends AFE1_1 to AFE4_1 are identical or substantially similar to each other. Therefore, in FIG. 12B, the n-th and (n+1)-th analog front-ends AFEn_1 and AFE(n+1)_1 (where n is a positive integer) including the analog front-ends AFE2_1, AFE3_1, and AFE4_1 will be mainly described.

As described with reference to FIG. 11, the first charge amplifiers FCA1, FCAn−1, FCAn, and FCAn+1 illustrated in FIGS. 12A and 12B are identical or substantially similar to the charge amplifier CAn' described with reference to FIGS. 8D and 9D, the second charge amplifiers SCAn−1 and SCAn illustrated in FIGS. 12A and 12B are identical or substantially similar to the charge amplifier CAn described with reference to FIGS. 8B, 8C, and 9A to 9C, the demodulation circuit DEM1 and the analog-to-digital converter ADC1 illustrated in FIG. 12A are identical or substantially similar to the demodulation circuit DEMn' and the analog-to-digital converter ADCn' described with reference to FIG. 8D, and the demodulation circuits DEMn and DEMn+1 illustrated in FIG. 12B are identical or substantially similar to the demodulation circuit DEMn described with reference to FIGS. 8B and 8C. Therefore, redundant descriptions thereof may not be repeated for convenience of explanation.

First, referring to FIG. 12A, the first analog front-end AFE1_1 may include a first charge amplifier FCA1, a demodulation circuit DEM1, and an analog-to-digital converter ADC1. As described with reference to FIG. 11, the first analog front-end AFE1_1 may be implemented identical or substantially similar to the analog front-end AFEn' described with reference to FIG. 8D.

The first charge amplifier FCA1 may receive the first sensing signal RX1 provided through the "first" second signal line SL2-1 (e.g., the first sensing line) and the second sensing signal RX2 provided through the "second" second signal line SL2-2 (e.g., the second sensing line), may differentially amplify the first sensing signal RX1 and the second sensing signal RX2, and may output the single-ended (e.g., one) first sub-differential signal FCA_OUT1.

The first demodulation circuit DEM1 may receive and filter the first differential signal FCA_OUT1 provided from the first charge amplifier FCA1, and may output the first output signal LPF_OUT1. Since the first analog front-end AFE1_1 does not include the second charge amplifier, the input terminal of the first demodulation circuit DEM1 may be directly connected to the output terminal of the first charge amplifier FCA1 differently from the demodulation circuits DEMn and DEMn+1 to be described with reference to FIG. 12B.

In addition, the first analog-to-digital converter ADC1 may receive the first output signal LPF_OUT1 and provide the corresponding first sensing value SS1 (e.g., the first differential output value) to the signal processor DSP_1.

Referring to FIG. 12B, the n-th analog front-end AFEn_1 and the (n+1)-th analog front-end AFE(n+1)_1 may be implemented by including a two-stage differential amplifier.

For example, the n-th analog front-end AFEn_1 may include the (n−1)-th and n-th first charge amplifiers FCAn−1 and FCAn (e.g., the (1-1)-th charge amplifier and the (1-2)-th charge amplifier) and the (n−1)-th second charge amplifier SCAn−1 (e.g., the (2-1)-th charge amplifier) sequentially connected thereto, and the (n+1)-th analog front-end AFEn+1_1 may include the n-th and (n+1)-th first charge amplifiers FCAn and FCAn+1 (e.g., the (1-2)-th charge amplifier and the (1-3)-th charge amplifier) and the n-th second charge amplifier SCAn (e.g., the (2-2)-th charge amplifier) sequentially connected thereto For example, each of the analog front-ends AFEn_1 and AFE(n+1)_1 may include two first charge amplifiers and the second charge amplifier sequentially connected thereto, and two analog front-ends AFEn_1 and AFE(n+1)_1 adjacent to each other may share one first charge amplifier, such as the n-th first charge amplifier FCAn (e.g., the (1-2)-th charge amplifier).

The (n−1)-th first charge amplifier FCAn−1 may receive the (n−1)-th sensing signal RXn−1 provided through the (n−1)-th second signal line SL2-(n−1) (e.g., the (n−1)-th signal line), such as through the (1-1)-th input terminal of the first charge amplifier FCAn−1, and the n-th sensing signal RXn provided through the n-th second signal line SL2-n (e.g., the n-th signal line), such as through the (1-2)-th input terminal of the first charge amplifier FCAn−1, may differentially amplify the (n−1)-th sensing signal RXn−1 and the n-th sensing signal RXn, and output the single-ended (n−1)-th sub-differential signal FCA_OUT(n−1) (e.g., the (1-1)-th differential signal).

The n-th first charge amplifier FCAn may receive the n-th sensing signal RXn provided through the n-th second signal line SL2-n (e.g., the n-th signal line), such as through the (1-3)-th input terminal of the n-th first charge amplifier FCAn, and the (n+1)-th sensing signal RXn+1 provided through the (n+1)-th second signal line SL2-(n+1) (e.g., the (n+1)-th signal line), such as through the (1-4)-th input terminal of the n-th first charge amplifier FCAn, may differentially amplify the n-th sensing signal RXn and the (n+1)-th sensing signal RXn+1, and output the single-ended n-th sub-differential signal FCA_OUTn (e.g., the (1-2)-th differential signal). Similarly, the (n+1)-th first charge amplifier FCAn+1 may output the (n+1)-th sub-differential signal FCA_OUT(n+1) (e.g., the (1-3)-th differential signal).

As illustrated in FIG. 12B, the first charge amplifiers FCAn−1, FCAn, FCAn+1, and FCAn+2 may be connected to the input terminals receiving the same sensing signal. For example, the second input terminal of the (n−1)-th first charge amplifier FCAn−1 and the first input terminal of the n-th first charge amplifier FCAn may be connected to each other, the second input terminal of the n-th first charge amplifier FCAn and the first input terminal of the (n+1)-th first charge amplifier (FCAn+1) may be connected to each other, and the second input terminal of the (n+1)-th first charge amplifier FCAn+1 and the first input terminal of the (n+2)-th first charge amplifier FCAn+2 may be connected to each other.

In addition, the (n−1)-th second charge amplifier SCAn−1 may differentially amplify the (n−1)-th sub-differential signal FCA_OUT(n−1) and the n-th sub-differential signal FCA_OUTn provided from the (n−1)-th and n-th first charge amplifiers FCAn−1 and FCAn (e.g., provided to the (2-1)-th and (2-2)-th input terminals of the second charge amplifier SCAn−1), and may output complementary (n−1)-th differential signals SCA_OUT1(n−1) and SCA_OUT2(n−1) (e.g., the (2-1)-th and (2-2)-th differential signals). Similarly, the n-th second charge amplifier SCAn may differentially amplify the n-th sub-differential signal FCA_OUTn and the (n+1)-th sub-differential signal FCA_OUT(n+1) provided from the n-th and (n+1)-th first charge amplifiers FCAn and FCAn+1, and may output complementary n-th differential signals SCA_OUT1n and SCA_OUT2n (e.g., the (2-3)-th and (2-4)-th differential signals).

In addition, the n-th demodulation circuit DEMn may receive and filter the (n−1)-th differential signals SCA_OUT1(n−1) and SCA_OUT2(n−1) provided from the (n−1)-th second charge amplifier SCAn−1, and output the n-th output signals LPF_OUT1n and LPF_OUT2n, and the (n+1)-th demodulation circuit DEMn+1 may receive and filter the n-th differential signals SCA_OUT1n and SCA_OUT2n provided from the n-th second charge amplifier SCAn, and output the (n+1)-th output signals LPF_OUT1(n+1) and LPF_OUT2(n+1)(e.g., the (3-1)-th and (3-2)-th differential signals, which may be collectively referred to as the "demodulated differential signals").

In addition, the n-th analog-to-digital converter ADCn may receive the n-th output signals LPF_OUT1n and LPF_OUT2n and provide (e.g., output) the n-th sensing value SSn (e.g., the n-th differential output value) corresponding to the difference (e.g., LFP_OUT1n to LPF_OUT2n) between the n-th output signals LPF_OUT1n and LPF_OUT2n to the signal processor DSP_1. Similarly, the (n+1)-th analog-to-digital converter ADCn+1 may receive the (n+1)-th output signals LPF_OUT1(n+1) and LPF_OUT2(n+1) and provide (e.g., output) the (n+1)-th sensing value SSn+1 (e.g., the (n+1)-th differential output value) corresponding to the difference (e.g., LFP_OUT1(n+1) to LPF_OUT2(n+1)) between the (n+1)-th output signals LPF_OUT1(n+1) and LPF_OUT2(n+1) to the signal processor DSP_1.

Figure 13:
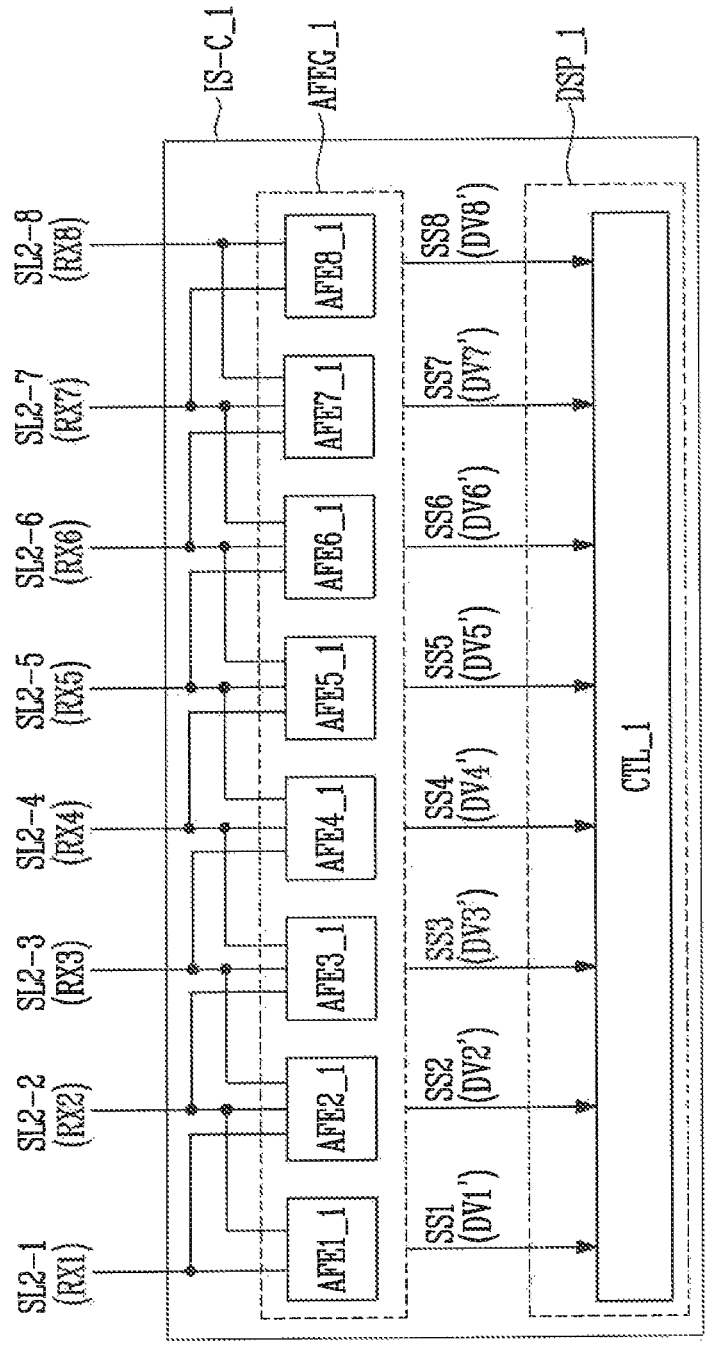
FIG. 13 is a block diagram illustrating the input sensing circuit of FIG. 11 according to an embodiment of the present disclosure.

FIG. 13 is a block diagram illustrating an example of the input sensing circuit of FIG. 11. On the other hand, FIG. 13 illustrates that the number of second signal lines SL2-1 to SL2-8 is eight and the number of analog front-ends AFE1_1 to AFE8_1 is eight. However, this is only illustrated as an example for convenience of description. The number of second signal lines SL2-1 to SL2-8 (e.g., the second signal lines included in the input sensing unit ISU of FIG. 11) and the number of analog front-ends AFE1_1 to AFE8_1 are not limited thereto.

Referring to FIGS. 11, 12A, 12B, and 13, the input sensing circuit IS-C_1 may receive sensing signals (e.g., the sensing signals RX1 to RX8) corresponding to an external input (e.g., a user's touch input) and may calculate and recognize the position of the external input based on the sensing signal.

To this end, the input sensing circuit IS-C_1 may include an analog front-end group AFEG_1 and a signal processor DSP_1 described with reference to FIG. 11.

The analog front-end group AFEG_1 may include analog front-ends AFE1_1 to AFE8_1. As described with reference to FIGS. 11, 12A, and 12B, the first and last analog front-ends (e.g., the first analog front-end AFE1_1 and the eighth analog front-end AFE8_1) among the analog front-ends AFE1_1 to AFE8_1 may be connected to two second signal lines (e.g., the second sensing electrodes) adjacent to each other and receive two sensing signals, and the remaining analog front-ends (e.g., the second to seventh analog front-ends AFE2_1 to AFE7_1) may be connected to three second signal lines (e.g., the second sensing electrodes) adjacent to each other and receive three second sensing signals.

In addition, as described with reference to FIGS. 12A and 12B, the analog front-ends AFE1_1 to AFE8_1 may output sensing values (e.g., first to seventh sensing values SS1 to SS8) based on the sensing signals.

Since the first and eighth analog front-ends AFE1_1 and AFE8_1 are implemented as a single-ended output differential analog front-end, the sensing values SS1 and SS8 output by the first and eighth analog front-ends AFE1_1 and AFE8_1 may correspond to the difference value between two sensing signals received by the first and eighth analog front-ends AFE1_1 and AFE8_1.

For example, the first to eighth sensing values SS1 to SS8 output by the first to eighth analog front-ends AFE1_1 to AFE8_1 may correspond to a first difference value DV1' to an eighth difference value DV8'. The first difference value DV1' may correspond to the difference (e.g., RX1-RX2) between the first and second sensing signals RX1 and RX2, and the eighth difference value DV8' may correspond to the difference (e.g., RX7-RX8) between the seventh and eighth sensing signals RX7 and RX8.

In addition, as described with reference to FIGS. 11 and 12B, since the second to seventh analog front-ends AFE2_1 to AFE7_1 are implemented by including a two-stage differential amplifier, each of the sensing values SS2 to SS7 output by the second to seventh analog front-ends AFE2_1 to AFE7_1 may correspond to a value obtained by subtracting two adjacent sensing signals from a value obtained by amplifying (e.g., amplifying twice) the corresponding sensing signal.

For example, the second to seventh sensing values SS2 to SS7 output by the second to seventh analog front-ends AFE2_1 to AFE7_1 may correspond to second to seventh difference values DV2' to DV7', respectively. In an embodiment, the second difference value DV2' may correspond to a value (e.g., 2RX2-(RX1+RX3)) obtained by subtracting the sum of the first and third sensing signals RX1 and RX3 from a value obtained by amplifying (e.g., amplifying twice) the second sensing signal RX2, the third difference value DV3' may correspond to a value (e.g., 2RX3-(RX2+RX4) obtained by subtracting the sum of the second and fourth sensing signals RX2 and RX4 from a value obtained by amplifying (e.g., amplifying twice) the third sensing signal RX3, the fourth difference value DV4' may correspond to a value (e.g., 2RX4-(RX3+RX5) obtained by subtracting the sum of the third and fifth sensing signals RX3 and RX5 from a value obtained by amplifying (e.g., amplifying twice) the fourth sensing signal RX4, the fifth difference value DV5' may correspond to a value (e.g., 2RX5-(RX4+RX6)) obtained by subtracting the sum of the fourth and sixth sensing signals RX4 and RX6 from a value obtained by amplifying (e.g., amplifying twice) the fifth sensing signal RX5, the sixth difference value DV6' may correspond to a value (e.g., 2RX6-(RX5+RX7)) obtained by subtracting the sum of the fifth and seventh sensing signals RX5 and RX7 from a value obtained by amplifying (e.g., amplifying twice) the sixth sensing signal RX6, and the seventh difference value DV7' may correspond to a value (e.g., 2RX7-(RX6+RX8) obtained by subtracting the sum of the sixth and eighth sensing signals RX6 and RX8 from a value obtained by amplifying (e.g., amplifying twice) the seventh sensing signal RX7.

The sensing values SS1 to SS8 output by the analog front-ends AFE1_1 to AFE8_1 may be provided to the signal processor DSP_1.

The signal processor DSP_1 may determine whether an external input (e.g., a user's touch input) has been touched, based on the sensing values SS1 to SS8, and may calculate a position where the touch occurs.

In an embodiment, the signal processor DSP_1 (e.g., the position calculation circuit CTL 1 included in the signal processor DSP_1) may determine whether the touch occurs and calculate the touch location by comparing the magnitudes of the sensing values SS1 to SS8. Since the second to seventh sensing values SS2 to SS7 are values generated by amplifying the sensing signal of the corresponding second signal line, the signal processor DSP_1 may relatively precisely detect the position where the touch occurs by comparing the amount of change in the sensing capacitance through the comparison of the magnitudes of the sensing signals without separately converting the second to seventh sensing values SS2 to SS7 provided from the analog front-end group AFEG_1.

As such, the signal processor DSP_1 does not include a separate converter (e.g., the converters CVT1 to CVT7 described with reference to FIG. 10), a separate conversion operation is not performed on the sensing values SS1 to SS8, thereby reducing the signal processing load of the signal processor DSP_1.

On the other hand, like the signal processor DSP described with reference to FIG. 10, the signal processor DSP_1 may convert the sensing values SS1 to SS8 and detect the position where the touch occurs by comparing the converted values. In this embodiment, it is possible to more precisely detect the position where the touch occurs.

For example, in an embodiment in which the signal processor DSP_1 sets the "first" second signal line SL2-1 among the second signal lines SL2-1 to SL2-8 as the reference signal line, the signal processor DSP_1 (e.g., the converters included in the signal processor DSP_1) may convert the second sensing value SS2 by adding a value (e.g., 2RX1-2RX2) corresponding to twice the first sensing value SS1 (e.g., the first difference value DV1') to the second sensing value SS2 (e.g., the second difference value DV2'). The converted value of the second sensing value SS2 may correspond to the second conversion value CV2 (e.g., RX1-RX3) described with reference to FIG. 10. Similarly, the signal processor DSP_1 (e.g., the converters included in the signal processor DSP_1) may convert the third to eighth sensing values RX3 to RX8, and detect the position where the touch occurs by comparing the converted values.

In addition, compared with the signal processor DSP included in the input sensing circuit IS-C of FIG. 10, the signal processor DSP_1 included in the input sensing circuit IS-C_1 of FIG. 13 may compare the same number of sensing values SS1 to SS8 as the number of the second signal lines SL2-1 to SL2-8, thereby more precisely calculating the touch position with respect to the input sensing unit (see ISU of FIG. 11) having the same area.

Figure 14:
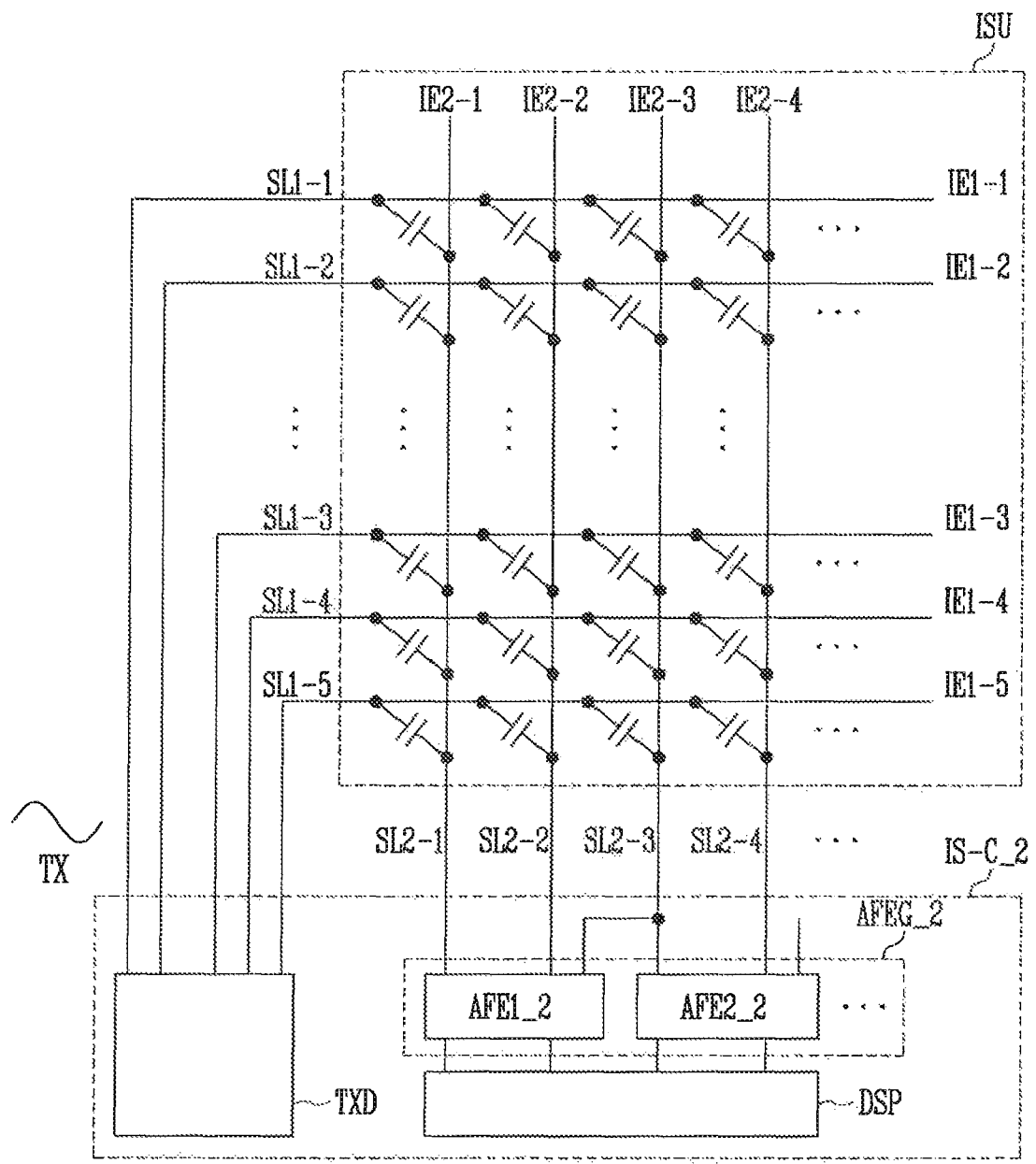
FIG. 14 is a block diagrams illustrating an input sensing unit and an input sensing circuit included in the display device of FIG. 1 according to an embodiment of the present disclosure.

FIG. 14 is a block diagrams illustrating an example of the input sensing unit and the input sensing circuit included in the display device of FIG. 1.

Referring to FIGS. 6A, 6B, and 14, the input sensing circuit IS-C_2 of FIG. 14 differs from the input sensing circuit IS-C of FIGS. 6A and 6B in that the input sensing circuit IS-C_2 includes analog front-ends AFE1_2, and AFE2_2. Since the input sensing circuit IS-C_2 is similar to the input sensing circuit IS-C of FIGS. 6A and 6B, except for the analog front-ends AFE1_2 and AFE2_2, redundant descriptions thereof may not be repeated for convenience of explanation.

Each of the analog front-ends AFE1_2 and AFE2_2 may be connected to three adjacent second sensing electrodes (e.g., the second signal lines) among the second sensing electrodes IE2-1 to IE2-4, and may select two sensing electrodes among the three second sensing electrodes and output the sensing values.

For example, the first analog front-end AFE1_2 may be connected to the "first" second sensing electrode IE2-1 (e.g., the first sensing electrode), the "second" second sensing electrode IE2-2 (e.g., the second sensing electrode), and the "third" second sensing electrode IE2-3 (e.g., the third sensing electrode), and may select the "first" second sensing electrode IE2-1 and the "second" second sensing electrode IE2-2 and output the first sensing value in a first mode, or may select the "second" second sensing electrode IE2-2 and the "third" third sensing electrode IE2-3 and output the second sensing value in a second mode. Similarly, the second analog front-end AFE2_2 may be connected to the "third" second sensing electrode IE2-3 (e.g., the third sensing electrode), the "fourth" second sensing electrode IE2-4 (e.g., the fourth sensing electrode), and the "fifth" second sensing electrode (e.g., the fifth sensing electrode), and may select the "third" second sensing electrode IE2-3 and the "fourth" second sensing electrode IE2-4 and output the third sensing value in a first mode, or may select the "fourth" second sensing electrode IE2-4 and the "fifth" second sensing electrode and output the fourth sensing value in a second mode.

In an embodiment, the distribution circuits DC1, DC2, and DC3 described with reference to FIG. 6B may be applied to the input sensing circuit IS-C_2 of FIG. 14.

FIGS. 15A and 15B are block diagrams illustrating an example of the analog front-end included in the input sensing circuit of FIG. 14. Referring to FIGS. 8B, 15A, and 15B, since the analog front-ends AFEn_2 and AFEn+3 of FIGS. 15A and 15B are substantially identical or similar to the analog front-end AFEn of FIG. 8B, except that the analog front-ends AFEn_2 and AFEn_3 further include a multiplexer MUXn, redundant descriptions thereof may not be repeated for convenience of explanation.

Referring to FIGS. 14, 15A, and 15B, the analog front-ends AFEn_2 and AFEn_3 may include a multiplexer MUXn, a charge amplifier CAn, a band pass filter BPFn, a low pass filter LPFn, and an analog-to-digital converter ADCn.

The multiplexer MUXn may receive the n-th sensing signal RXn provided through the n-th second signal line SL2-$n$ (e.g., the n-th sensing line), the (n+1)-th sensing signal RXn+1 provided through the (n+1)-th second signal line SL2-($n$+1) (e.g., the n+1-th sensing line), and the (n+2)-th sensing signal RXn+2 provided through the (n+2)-th second signal line SL2-($n$+2) (e.g., the (n+2)-th sensing line), and may select and output two sensing signals among the n-th sensing signal RXn, the (n+1)-th sensing signal RXn+1, and the (n+2)-th sensing signal RXn+2. Two sensing signals among the n-th sensing signal RXn, the (n+1)-th sensing signal RXn+1, and the (n+2)-th sensing signal RXn+2 are provided to the charge amplifier CAn as the first and second input signals CA_IN1n and CA_IN2n. In an embodiment, the multiplexer MUXn may be implemented as a multiplexer having an input/output ratio of 3:2. However, embodiments of the present disclosure are not limited thereto.

When the analog front-ends AFEn_2 and AFEn_3 include the multiplexer MUXn, the total number of analog front-ends AFE1_2 and AFE2_2 in the input sensing circuit IS-C_2 may be reduced, and integration of the input sensing circuit IS-C_2 may be further facilitated.

In an embodiment, the analog front-end AFEn_3 may further include negative capacitors C_N. The negative capacitors C_N (e.g., a negative capacitor circuit or a parasitic capacitance compensation circuit) may be respectively connected to input terminals of the multiplexer MUXn, or may be respectively formed on the second signal lines.

For example, the negative capacitor C_N may be connected to a first input terminal of the multiplexer MUXn or an n-th second signal line SL2-$n$ (e.g., an n-th sensing line). In addition, the other negative capacitors C_N may be respectively connected to the second input terminal of the multiplexer MUXn (e.g., the (n+1)-th second signal line SL2-($n$+1) and the (n+1)-th sensing line) and the third input terminal of the multiplexer MUXn (e.g., the (n+2)-th second signal line SL2-($n$+2) and the (n+2)-th sensing line).

For reference, as described with reference to FIG. 5, as the thickness T1 of the thin film encapsulation layer TFE (e.g., the encapsulation organic layer OL) decreases, the gap between the sensing electrodes in the input sensing unit and the second electrode CE (e.g., the common electrode) of the light emitting element OLED is reduced, and the parasitic capacitance formed therebetween may be increased. In addition, as the display device becomes larger, the overlapping area between the sensing electrodes in the input sensing unit and the second electrode CE of the light emitting element OLED increases, and the parasitic capacitance may be increased. The parasitic capacitance may cause the response delay of the driving signal and the sensing signal, and may reduce sensing sensitivity.

In an embodiment, the negative capacitor C_N is implemented as a negative capacitor field effect transistor (FET) or the like. The negative capacitor C_N may be discharged when the voltage of the corresponding line increases, and may be charged when the voltage of the corresponding line decreases. Therefore, the negative capacitor C_N may cancel the parasitic capacitance.

The analog front-end AFEn_3 may reduce the parasitic capacitance with respect to the sensing electrodes in the input sensing unit by using the negative capacitor C_N. Therefore, the sensing sensitivity may be further increased.

On the other hand, the analog front-end group AFEG_1 described with reference to FIGS. 11, 12A, and 12B may further include the multiplexer MUXn and the negative capacitor C_N described with reference to FIGS. 14, 15A, and 15B.

The input sensing device according to embodiments of the present disclosure may include an analog front-end implemented by including a two-stage differential amplifier. Therefore, the signal processing load in detecting the touch position may be reduced, and the sensing sensitivity may be increased even in an environment in which the input sensing device deteriorates (e.g., high-speed driving, thinning, and an increase in size of the display device).

However, the effects of the present disclosure are not limited to the above-described effects, and may be variously expanded without departing from the spirit and scope of the present disclosure.

The scope of the present disclosure should not be limited to embodiments described in the detailed description of the specification.

What is claimed is:

1. An analog front-end for an input sensing device, the analog front-end comprising:
 a (1-1)-th charge amplifier including a (1-1)-th input terminal to receive a first sensing signal from a first sensing electrode of the input sensing device and a (1-2)-th input terminal to receive a second sensing signal from a second sensing electrode of the input sensing device, the (1-1)-th charge amplifier is configured to differentially amplify the first sensing signal and the second sensing signal to output a (1-1)-th differential signal;
 a (1-2)-th charge amplifier including a (1-3)-th input terminal to receive the second sensing signal from the second sensing electrode and a (1-4)-th input terminal to receive a third sensing signal from a third sensing electrode of the input sensing device, the (1-2)-th charge amplifier configured to differentially amplify the second sensing signal and the third sensing signal to output a (1-2)-th differential signal;
 a second charge amplifier including a (2-1)-th input terminal and a (2-2)-th input terminal, the second charge amplifier configured to differentially amplify the (1-1)-th differential signal provided to the (2-1)-th input terminal and the (1-2)-th differential signal provided to the (2-2)-th input terminal and output a (2-1)-th differential signal and a (2-2)-th differential signal;
 a demodulation circuit configured to filter the (2-1)-th differential signal and the (2-2)-th differential signal and output demodulated differential signals, and
 an analog-to-digital converter configured to output a sensing value based on the demodulated differential signals.

2. The analog front-end of claim 1, wherein the (1-2)-th input terminal is connected to the (1-3)-th input terminal.

3. The analog front-end of claim 1, wherein the analog front-end further includes a multiplexer, wherein the multiplexer is configured to:
 select the first sensing signal and the second sensing signal among the first to third sensing signals and provide the first sensing signal and the second sensing signal to the (1-1)-th charge amplifier; and
 select the second sensing signal and the third sensing signal among the first to third sensing signals and provide the second sensing signal and the third sensing signal to the (1-2)-th charge amplifier.

4. An input sensing device comprising:
 driving electrodes and sensing electrodes;
 analog front-ends configured to receive sensing signals from the sensing electrodes and to process the sensing signals and output differential output values; and
 a signal processor configured to detect an external input based on the differential output values,
 wherein the analog front-ends include an n-th analog front-end, n is a natural number greater than or equal to 2, the n-th analog front-end includes:
 an (n−1)-th first charge amplifier configured to differentially amplify an (n−1)-th sensing signal of the sensing signals and an n-th sensing signal of the sensing signals provided from an (n−1)-th sensing electrode and an n-th sensing electrode, respectively, among the sensing electrodes to output an (n−1)-th sub-differential signal;

an n-th first charge amplifier configured to differentially amplify the n-th sensing signal and an (n+1)-th sensing signal of the sensing signals provided from the n-th sensing electrode and an (n+1)-th sensing electrode, respectively, among the sensing electrodes to output an n-th sub-differential signal;

an (n−1)-th second charge amplifier configured to differentially amplify the (n−1)-th sub-differential signal and the n-th sub-differential signal and output (n−1)-th differential signals;

an n-th demodulation circuit configured to filter the (n−1)-th differential signals and output demodulated differential signals; and an n-th analog-to-digital converter configured to output an n-th sensed value based on the demodulated differential signals.

5. The input sensing device of claim 4, wherein:

the (n−1)-th first charge amplifier includes a (1-1)-th input terminal connected to the (n−1)-th sensing electrode and a (1-2)-th input terminal connected to the n-th sensing electrode; and the n-th first charge amplifier includes a (1-3)-th input terminal connected to the n-th sensing electrode and a (1-4)-th input terminal connected to the (n+1)-th sensing electrode.

6. The input sensing device of claim 4, wherein the n-th demodulation circuit includes:

a band pass filter configured to filter the (n−1)-th differential signals in a frequency band corresponding to a frequency band of the sensing signals and output a first filtered signal and a second filtered signal; and a low pass filter configured to filter high-frequency bands of the first filtered signal and the second filtered signal and output a third filtered signal and a fourth filtered signal.

7. The input sensing device of claim 4, wherein the n-th demodulation circuit includes:

a band pass filter configured to filter the (n−1)-th differential signals in a frequency band corresponding to a frequency band of the sensing signals and output a first filtered signal and a second filtered signal;

a mixer configured to change frequencies of the first filtered signal and the second filtered signal and output a first demodulation signal and a second demodulation signal; and a low pass filter configured to filter high-frequency bands of the first demodulation signal and the second demodulation signal and output a third filtered signal and a fourth filtered signal.

8. The input sensing device of claim 4, wherein the analog front-ends include a first analog front-end, the first analog front-end including:

a first first charge amplifier configured to differentially amplify a first sensing signal and a second sensing signal provided from a first sensing electrode and a second sensing electrode, respectively, among the sensing electrodes and output a first sub-differential signal;

a first demodulation circuit configured to filter the first sub-differential signal and output at least one demodulated signal; and a first analog-to-digital converter configured to output a first sensing value based on the at least one demodulated signal.

9. The input sensing device of claim 8, wherein the (n−1)-th second charge amplifier includes two input terminals and two output terminals.

10. The input sensing device of claim 8, wherein the first first charge amplifier includes two input terminals and one output terminal.

11. The input sensing device of claim 8, wherein an output terminal of the first first charge amplifier and an input terminal of the first demodulation circuit are directly connected to each other.

12. The input sensing device of claim 8, wherein the first analog-to-digital converter outputs the first sensing signal corresponding to a difference between the first sensing signal and the second sensing signal.

13. The input sensing device of claim 4, wherein the n-th analog-to-digital converter outputs the n-th sensing value corresponding to a value obtained by subtracting a sum of the (n−1)-th sensing signal and the (n+1)-th sensing signal from a value obtained by amplifying the n-th sensing signal.

14. The input sensing device of claim 4, wherein the signal processor includes a position calculation circuit configured to detect the external input by comparing magnitudes of the differential output values.

15. A display device comprising:

a display panel including pixels that emit light, driving electrodes and sensing electrodes disposed on a first surface of the display panel;

analog front-ends configured to receive sensing signals from the sensing electrodes, and to process the sensing signals and output differential output values; and a signal processor configured to detect an external input based on the differential output values, wherein the analog front-ends include an n-th analog front-end, n is a natural number greater than or equal to 2, the n-th analog front-end includes:

an (n−1)-th first charge amplifier configured to differentially amplify an (n−1)-th sensing signal of the sensing signals and an n-th sensing signal of the sensing signals provided from an (n−1)-th sensing electrode and an n-th sensing electrode, respectively, among the sensing electrodes and to output an (n−1)-th sub-differential signal;

an n-th first charge amplifier configured to differentially amplify the n-th sensing signal and an (n+1)-th sensing signal of the sensing signals provided from the n-th sensing electrode and an (n+1)-th sensing electrode, respectively, among the sensing electrodes to output an n-th sub-differential signal;

an (n−1)-th second charge amplifier configured to differentially amplify the (n−1)-th sub-differential signal and the n-th sub-differential signal and output (n−1)-th differential signals;

an n-th demodulation circuit configured to filter the (n−1)-th differential signals and output demodulated differential signals; and respectively; and an n-th analog-to-digital converter configured to output an n-th sensing value based on the demodulated differential signals.

16. The display device of claim 15, wherein the display panel further includes:

a base layer;

a light emitting element disposed on the base layer and included in each of the pixels; and a thin film encapsulation layer covering the light emitting element, wherein the driving electrodes or the sensing electrodes are directly disposed on the thin film encapsulation layer.

17. The display device of claim 15, wherein:
the (n−1)-th first charge amplifier includes a (1-1)-th input terminal connected to the (n−1)-th sensing electrode and a (1-2)-th input terminal connected to the n-th sensing electrode; and
the n-th first charge amplifier includes a (1-3)-th input terminal connected to the n-th sensing electrode and a (1-4)-th input terminal connected to the (n+1)-th sensing electrode.

18. The display device of claim 15, wherein the analog front-ends include a first analog front-end, the first analog front-end including:
a first first charge amplifier configured to differentially amplify a first sensing signal and a second sensing signal provided from a first sensing electrode and a second sensing electrode, respectively, among the sensing electrodes and output a first sub-differential signal;
a first demodulation circuit configured to filter the first sub-differential signal and output at least one demodulated signal; and
a first analog-to-digital converter configured to output a first sensing value based on the at least one demodulated signal.

19. The display device of claim 18, wherein the (n−1)-th second charge amplifier includes two input terminals and two output terminals.

20. The display device of claim 18, wherein each of the first charge amplifiers includes two input terminals and one output terminal.

* * * * *